(12) United States Patent  
Kronholm et al.

(10) Patent No.: US 8,945,807 B2  
(45) Date of Patent: *Feb. 3, 2015

(54) BLENDS OF FULLERENE DERIVATIVES, AND USES THEREOF IN ELECTRONIC DEVICES

(71) Applicant: Solenne BV, Groningen (NL)

(72) Inventors: David F. Kronholm, Groningen (NL); Jan C. Hummelen, Groningen (NL); Alexander B. Sieval, Groningen (NL); Patrick Van't Hof, Groningen (NL)

(73) Assignee: Solenne BV, Groningen (NL)

( * ) Notice: Subject to any disclaimer, the term of this patent is extended or adjusted under 35 U.S.C. 154(b) by 3 days.

This patent is subject to a terminal disclaimer.

(21) Appl. No.: 13/887,752

(22) Filed: May 6, 2013

(65) Prior Publication Data

US 2013/0306944 A1 Nov. 21, 2013

Related U.S. Application Data

(63) Continuation of application No. 13/218,757, filed on Aug. 26, 2011, now Pat. No. 8,435,713, which is a continuation of application No. 12/307,701, filed as application No. PCT/US2007/072965 on Jul. 6, 2007, now Pat. No. 8,076,050.

(60) Provisional application No. 60/818,888, filed on Jul. 6, 2006.

(51) Int. Cl.
*G03H 1/02* (2006.01)
*H01L 51/00* (2006.01)
(Continued)

(52) U.S. Cl.
CPC ............ *H01L 51/0047* (2013.01); *B82Y 10/00* (2013.01); *C01B 31/0213* (2013.01); *H01L 51/0558* (2013.01); *H01L 51/4253* (2013.01); *Y02E 10/549* (2013.01)
USPC ........................................................ 430/130

(58) Field of Classification Search
USPC .................. 257/40; 430/58.1, 130; 560/51
See application file for complete search history.

(56) References Cited

U.S. PATENT DOCUMENTS

| 5,611,824 A | 3/1997 | Stephens |
| 5,739,376 A | 4/1998 | Bingel |

(Continued)

FOREIGN PATENT DOCUMENTS

| EP | 1447860 A1 | 8/2004 |
| JP | 2002154992 | 5/2002 |

(Continued)

OTHER PUBLICATIONS

Diederich, Francois, et al. "The Higher Fullerenes: Isolation and Characterization of $C_{76}$, $C_{84}$, $C_{94}$, and $C_{70}O$, and Oxide of $D_{5h}$-$C_{70}$," Science: 252(5005): 548-551 (Apr. 26, 1991).

(Continued)

*Primary Examiner* — Thomas L Dickey
(74) *Attorney, Agent, or Firm* — Foley Hoag LLP

(57) ABSTRACT

Disclosed are compositions of mixed fullerene derivatives with utility in organic semiconductors, and methods of making and using such compositions. In certain embodiments, the present invention relates to compositions of mixed fullerene derivatives further comprising one or more additional fullerene-based components within specified ranges. In certain other embodiments, the invention relates to methods of producing mixed fullerene derivatives of a specific composition from mixed fullerene starting materials, or pure fullerene derivatives of a specific composition from mixed fullerene derivatives. In yet other embodiments, the invention relates to semiconductors and devices comprising a composition of the invention.

28 Claims, 2 Drawing Sheets

(51) Int. Cl.
  *B82Y 10/00*   (2011.01)
  *C01B 31/02*   (2006.01)
  *H01L 51/05*   (2006.01)
  *H01L 51/42*   (2006.01)

(56) References Cited

U.S. PATENT DOCUMENTS

| | | | |
|---|---|---|---|
| 5,759,725 | A | 6/1998 | Hirao et al. |
| 8,435,713 | B2 * | 5/2013 | Kronholm et al. ............ 430/130 |
| 2004/0159793 | A1 | 8/2004 | Brabec et al. |
| 2005/0031524 | A1 | 2/2005 | Komatsu |
| 2005/0232846 | A1 | 10/2005 | Noguchi et al. |
| 2006/0284230 | A1 | 12/2006 | Yang et al. |

FOREIGN PATENT DOCUMENTS

| | | |
|---|---|---|
| WO | WO-98/09913 A1 | 3/1998 |
| WO | WO-2005/058002 | 6/2005 |

OTHER PUBLICATIONS

Lenes, Martijn. "Fullerene Bisadducts for Enhanced Open-Circuit Voltages and Efficiencies in Polymer Solar Cells," Advanced Materials 20: 2116-2119 (Jun. 4, 2008).

International Seach Report for PCT/US07/72965 dated Jul. 2, 2008.

Supplementary European Search Report for EP 07799365 dated Jan. 16, 2013.

* cited by examiner

BLENDS OF FULLERENE DERIVATIVES, AND USES THEREOF IN ELECTRONIC DEVICES

RELATED APPLICATIONS

This application is a continuation of U.S. patent application Ser. No. 13/218,757, file Aug. 26, 2011, now U.S. Pat. No. 8,435,713, issued May 7, 2013, which is a continuation of U.S. patent application Ser. No. 12/307,701, filed Nov. 24, 2009, now U.S. Pat. No. 8,076,050, issued Dec. 13, 2011, which claims the benefit of priority to Patent Cooperation Treaty Application serial number PCT/US2007/072965, filed Jul. 6, 2007, which claims the benefit of priority to U.S. Provisional Patent Application Ser. No. 60/818,888 filed Jul. 6, 2006, the entireties of all of which are hereby incorporated by reference.

BACKGROUND OF THE INVENTION

Fullerene Derivatives

Significant progress has been made in the development of thin-film organic electronic devices, such as photovoltaic cells, transistors, photodetectors, sensors, and other devices for commercial application. Many of these devices utilize solution-processable semiconductors based on fullerene derivatives in pure form. The most commonly used fullerene derivative is Phenyl-$C_{61}$-Butyric-Acid-Methyl-Ester ([60]PCBM) (Scharber et al., Advanced Materials (18) 789-794), which is classified as a methanofullerene. Another methanofullerene derivative is Thiophenyl-$C_{61}$-Butyric-Acid-Methyl-Ester ([60]ThCBM). Methanofullerenes possess many benefits compared to the native (un-derivatized) fullerene in organic electronics applications. One benefit is their increased processability compared to native fullerenes, while maintaining much of the desirable electronic properties of the native fullerene. The increase in processability is due, in part, to an approximately ten-fold increase in solubility in aromatic solvents. Non-methanofullerene derivatives include 2-Aza-Propano-($C_{n+2}$N) fullerenes, also called Prato adducts ([60]Prato).

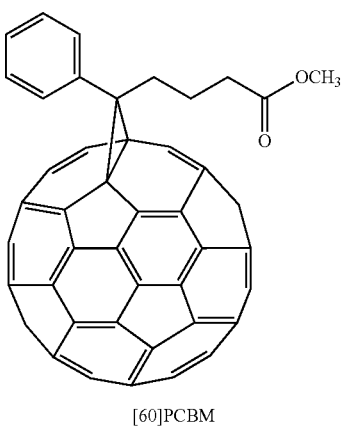

[60]PCBM

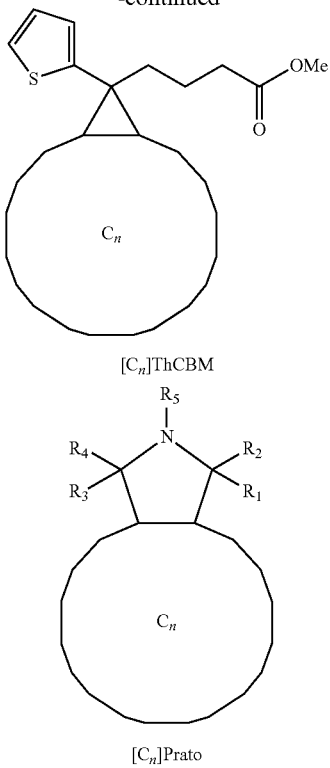

[$C_n$]ThCBM

[$C_n$]Prato

[60]PCBM is typically blended with various conducting polymers which act as the electron donor and the [60]PCBM as the electron acceptor. Solution processing is used to form thin films comprising the electron donor and electron acceptor. Although fullerene derivatives are typically blended with various conducting polymers, it is possible to construct devices using only fullerene derivatives. Fullerenes and fullerene derivatives also have been shown to exhibit ambipolar electronic behavior, transporting either holes or electrons, or both, in the same device. Typical applications of [60]PCBM use [60]PCBM having a purity of about 99% or higher. Impurities in such compositions often comprise low amounts of pure $C_{60}$ fullerene, certain PCBM analogues of $C_{60}$ fullerene, oxides of $C_{60}$ fullerene, oxides of PCBM, and trace amounts of other fullerenes. [60]PCBM is typically synthesized using $C_{60}$ fullerene as the synthetic precursor where the purity of the $C_{60}$ fullerene is typically about 99% or higher with respect to oxide impurities, $C_{60}$-dimer, and small amounts of other fullerenes.

[70]PCBM is an analogue of [60]PCBM that can be prepared by derivatization of $C_{70}$ fullerene using a process analogous to that used to prepare [60]PCBM from $C_{60}$ fullerene. [70]PCBM has been used as a semiconductor in organic electronics, particularly for polymer solar devices (Wienk et al., Angewadte Chemie, 2003, (115), 3493-3497) and transistors (Anthopoulos et al., Journal of Applied Physics, (98), 054503). Similar to [60]PCBM, [70]PCBM is typically used in purities of approximately 99%, though several isomers of [70]PCBM are present due to the asymmetry of the $C_{70}$ and resulting difference in reactivity of the carbons of the $C_{70}$ molecule. [70]PCBM is typically synthesized from $C_{70}$ fullerene material having a purity of about 99%, and the impurities in $C_{70}$ fullerene are often similar to the impurities found in $C_{60}$. In comparison to [60]PCBM, [70]PCBM is somewhat more soluble in organic solvents, possibly due to the presence of multiple isomers. A related analog, [84]PCBM, has also been synthesized and tested in organic photodiodes and transistors.

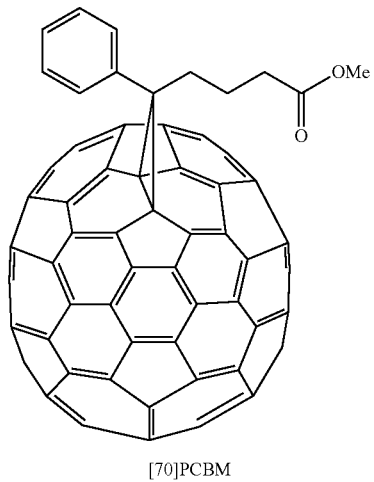 [SMILES: COC(=O)CCCC1(c2ccccc2)C23c4c5ccc6c7cc8c9c%10c(cc%11cc%12c%13c%14c(cc%15c%16ccc-5c2c%16c2c5c%16c%17c(c(c46)c7c9c%17c4c%10c%11c%13c4c%16c%14c%152)C513)C%12)C8]

[70]PCBM

Organic Electronic Devices

Organic electronic devices, such as bulk heterojunction photodiodes (Scharber et al., Advanced Materials (18) 789-794), are based on forming thin films (~150 nm) of an electronic polymer and PCBM in the so-called donor/acceptor configuration where the polymer and PCBM phase-separate to form sub-micron size-scale domains with varying degrees of amorphous and crystalline structure. In the process of forming the heterojunction thin film, the polymer and PCBM phase-separate and precipitate from solution upon drying and/or annealing of the film. Due to influences on electron transport the size domains of the PCBM and degree of crystallinity have a strong impact on the resulting electronic behavior and performance of the device. It has been shown through experimental and theoretical analyses that the electron mobility (and resulting current-carrying capacity, a strong determiner of the energy conversion efficiency) can be described with a Gaussian disorder model (Mihailetchi et al., Advanced Functional Materials, 2003, (13), 1.), which is known also to be the case for other materials, such as pure conducting polymers. In this model, the degree of disorder (or lack of crystallinity) has a strong influence on the electron mobility which has been seen with the drop in electron mobility of PCBM compared to single crystal $C_{60}$. Therefore, higher degrees of amorphous nature (i.e., lower crystallinity) lead to reductions in electron mobility and corresponding reductions in energy conversion efficiency for organic electronic devices. This effect can also be seen through the increase in energy conversion efficiency gained through annealing, which is known to give greater crystallinity (less disorder or less amorphous nature) to the film (Ma et al., Advanced Functional Materials, 2005 (15), 1617-1622).

Virtually all organic electronic devices utilize a single n-type semiconductor because certain impurities in the ppm level or even ppb level can drastically alter device performance. For example, impurities in the ppm level or even ppb level can drastically alter device performance for silicon-based electronics. The impact that impurities can have on device performance is linked in part to the disorder described in preceding paragraph. However, impurities can alter the electronics of the device for other reasons, including short-circuiting and electron trapping.

Various methanofullerene PCBM analogues have been made where solubility is increased by the addition of $C_4$, $C_8$, $C_{12}$, or $C_{1-6}$ alkane units to the ester of the PCBM (Zheng et al., Journal of Physical Chemistry B (108), 32, 2004). Despite almost identical reduction potentials and UV/VIS absorption properties of the fullerene derivatives tested, the energy conversion efficiency is quite different for these different fullerene derivatives when used to fabricate organic solar cells with the same polymer. This may be attributed to the different molecular interactions between the polymer and fullerene derivative, which affect the morphology of the composition. The result may also be attributed to decreases in electron mobility brought about by the slight increase in the different path-lengths to the $C_{60}$ fullerene core that functions as the electron acceptor. The decrease in energy conversion efficiency from 2.45 to 1.46 when PCB-$C_8H_{17}$ is used instead of PCB-$C_4H_9$ illustrates how the energy conversion efficiency is sensitive to changes in the structure of the fullerene derivative used as the n-type semiconductor. For the purposes of comparison, PCB-$C_{16}H_{33}$ gives an energy conversion efficiency of 0.11. This shows that such changes may occur solely in response to physical changes to the film brought about by changes in the n-type semiconductor, even when n-type semiconductor compounds are used that are identical in reduction potential and light absorption spectrum.

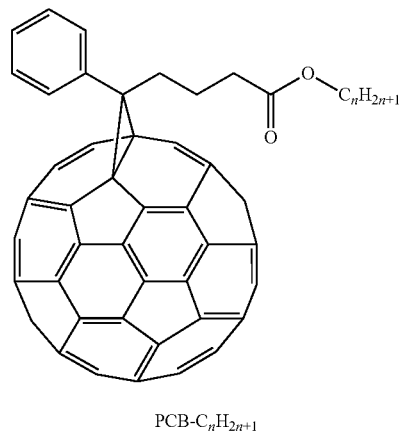

PCB-$C_nH_{2n+1}$

Thin-film organic electronics device performance depends on a large set of processing and materials parameters, with a high degree of complexity in the interaction of these parameters to make up the final device morphological and electronics properties. It is often not possible to predict the effect that a change in the molecular structure of an n-type semiconductor fullerene derivative will have on the final organics electronics device performance, even knowing the reduction potential, absorption properties, and other electronic properties. This is mainly due to the fact that the impact on the physical disorder of the resulting thin-film multi-phase system is difficult to predict a priori. Likewise, a change in type and level of impurities present in a given fullerene derivative n-type semiconductor may affect the morphology and electronics properties and resulting device performance of a thin-film device in an unpredictable manner.

However, in view of the foregoing obstacles, new materials are needed for thin-film organic electronic devices. The present invention fulfills this need and has other related advantages.

SUMMARY OF THE INVENTION

One aspect of the present invention relates to a composition comprising a mixture of a $C_{60}$ fullerene derivative and a $C_{70}$ fullerene derivative. In certain instances, the ratio of the weight percentage of the $C_{60}$ fullerene derivative to the $C_{70}$ fullerene derivative is about 2:1.

One aspect of the present invention relates to a composition comprising a mixture of a $C_{60}$ methanofullerene and a $C_{70}$ methanofullerene. In certain instances, the $C_{60}$ methanofullerene is a phenyl-butyric-acid-methyl-ester fullerene. In certain instances, the $C_{70}$ methanofullerene is a phenyl-butyric-acid-methyl-ester fullerene. In certain instances, the ratio of the weight percentage of the $C_{60}$ methanofullerene to $C_{70}$ methanofullerene is about 2:1. Another aspect of the present invention relates to a composition consisting essentially of a mixture of a $C_{60}$ methanofullerene and a $C_{70}$ methanofullerene. In certain instances, the $C_{60}$ methanofullerene is a phenyl-butyric-acid-methyl-ester fullerene. In certain instances, the $C_{70}$ methanofullerene is a phenyl-butyric-acid-methyl-ester fullerene.

Another aspect of the present invention relates to a composition comprising a mixture of a $C_{60}$ methanofullerene and a $C_{70}$ methanofullerene. In certain instances, the $C_{60}$ methanofullerene is a thiophenyl-butyric-acid-methyl-ester fullerene. In certain instances, the $C_{70}$ methanofullerene is a thiophenyl-butyric-acid-methyl-ester fullerene. In certain instances, the ratio of the weight percentage of the $C_{60}$ methanofullerene to $C_{70}$ methanofullerene is about 2:1. Another aspect of the present invention relates to a composition consisting essentially of a mixture of a $C_{60}$ methanofullerene and a $C_{70}$ methanofullerene. In certain instances, the $C_{60}$ methanofullerene is a thiophenyl-butyric-acid-methyl-ester fullerene. In certain instances, the $C_{70}$ methanofullerene is a thiophenyl-butyric-acid-methyl-ester fullerene.

Another aspect of the present invention relates to a composition comprising a mixture of a $C_{60}$ Prato adducts and $C_{70}$ Prato adducts. In certain instances, the ratio of the weight percentage of [60]Prato fullerene to [70]Prato fullerene is about 2:1. Another aspect of the present invention relates to a composition consisting essentially of a mixture of a [60]Prato fullerene and [70]Prato fullerene. In certain instances, the [60]Prato fullerene is a 2-aza-propano-($C_{62}$N) fullerene. In certain instances, the [70]Prato fullerene is a 2-aza-propano-($C_{62}$N) fullerene.

Other aspects of the present invention relate to a composition comprising a mixture of [60] or [70] Bingel, diazoline, azafulleroid, ketolactam, or Diels Alder fullerene derivatives.

Another aspect of the present invention relates to methods of making and purifying $C_{60}$ and $C_{70}$ fullerene derivatives. In certain instances, the $C_{60}$ or $C_{70}$ methanofullerene is a phenyl-butyric-acid-methyl-ester fullerene. In certain instances, the $C_{60}$ or $C_{70}$ methanofullerene is a thiophenyl-butyric-acid-methyl-ester fullerene. In certain instances, the $C_{60}$ or $C_{70}$ fullerene is a Prato adduct.

Another aspect of the present invention relates to devices produced from mixtures of $C_{60}$ and $C_{70}$ fullerene derivatives. In certain instances, the $C_{60}$ or $C_{70}$ methanofullerene is a phenyl-butyric-acid-methyl-ester fullerene. In certain instances, the $C_{60}$ or $C_{70}$ methanofullerene is a thiophenyl-butyric-acid-methyl-ester fullerene. In certain instances, the $C_{60}$ or $C_{70}$ fullerene is a Prato adduct.

Another aspect of the present invention relates to compositions comprising mixtures of different $C_{60}$ and $C_{70}$ fullerene derivatives, e.g., blends of phenyl-butyric-acid-methyl-ester fullerenes with thiophenyl-butyric-acid-methyl-ester fullerenes or Prato adducts.

Another aspect of the present invention relates to compositions comprising mixtures of $C_{60}$ and/or $C_{70}$ fullerene derivatives with non-derivatized $C_{60}$ or $C_{70}$, e.g., blends of $C_{60}$ fullerene derivatives and $C_{70}$ fullerene derivatives with $C_{60}$ and/or $C_{70}$.

Another aspect of the present invention relates to compositions comprising mixtures of mono-, bis-, and tris-adducts of $C_{60}$ and/or $C_{70}$ fullerene derivatives.

Another aspect of the present invention relates to methods of producing and purifying mixtures of C60 fullerene derivatives and C70 fullerene derivatives, where the composition of the C60 derivative is about 0.00001% to about 99.99999% and the composition of the C70 derivative is about 0.00001% to about 99.99999%.

Another aspect of the present invention relates to semiconductors comprised of mixtures of C60 fullerene derivatives and C70 fullerene derivatives.

Still another aspect of the present invention relates to devices comprised of mixtures of C60 fullerene derivatives and C70 fullerene derivatives.

DETAILED DESCRIPTION OF THE INVENTION

One aspect of the present invention provides compositions comprising blends of $C_{60}$ fullerene derivatives and $C_{70}$ fullerene derivatives. The compositions are useful in a variety of applications, such as photovoltaic cells, transistors, photodetectors, and sensors. In certain instances, the $C_{60}$ fullerene derivatives and the $C_{70}$ fullerene derivatives are methanofullerene derivatives, such as phenyl-butyric-acid-methyl-ester fullerenes or thiophenyl-butyric-acid-methyl-ester fullerenes. In other instances, $C_{60}$ fullerene derivatives and the $C_{70}$ fullerene derivatives are Prato adducts. In still other instances, the blends are comprised of different fullerene derivatives and/or a fullerene derivative and a non-derivatized fullerene. In certain instances, the blends of $C_{60}$ fullerene derivatives and $C_{70}$ fullerene derivatives comprise mixtures mono-, bis-, and tris-adducts of fullerene derivatives.

Surprisingly, it has been found that blends of [60]PCBM and [70]PCBM, [60]ThCBM and [70]ThCBM, [60]Prato and [70]Prato, [60]ThCBM bis-adducts and [70]ThCBM bis-adducts, [60]PCBM and $C_{60}$, and [60]PCBM, [70]PCBM and $C_{60}$ show suitability as the semiconductor component in devices where only pure grades of either [60]PCBM or [70]PCBM have been used in the past. The blends of $C_{60}$ and $C_{70}$ derivatives also show suitability over a wide range of compositions for use as the semiconductor component. The blends of $C_{60}$ and $C_{70}$ derivatives are particularly attractive because they are may be used with the same or similar processing conditions of devices optimized for either pure [60]PCBM or pure [70]PCBM. In fact, the results show that device performance, e.g., energy conversion efficiency for organic photovoltaic devices, shows very little sensitivity to the blend composition, notwithstanding the fact that no modification was made to the processing parameters, such as choice of solvent, evaporation time, processing temperature, etc. This result is surprising since such devices typically show a high degree of sensitivity to processing conditions due to the phase-separation process and crystallization behavior of the PCBM, which causes changes in morphology and level of disorder in the film affecting electron mobility. It is highly unusual that using two different fullerene derivatives with different physical properties (such as solubility and the resultantly different crystallization behavior) prepared according to the same processing conditions gives nearly identical performance of the final device. Furthermore, we are unaware of any reported use of two or more different n-type semiconductors concomitantly in the same device in the field of organic electronics.

Figure 1:
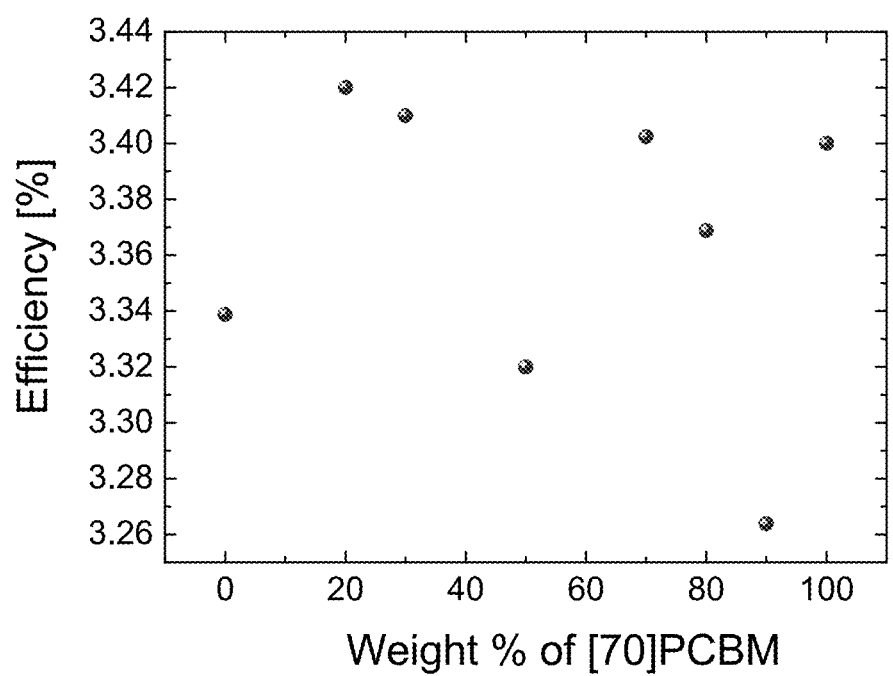
FIG. 1 depicts energy conversion efficiency versus blend composition of [70]PCBM and [60]PCBM in a P3HT/PCBM bulk heterojunction solar cell device. The weight % of [70] PCBM refers to the amount of [70]PCBM relative to [60] PCBM (e.g., 100% refers to pure [70]PCBM 99% and no [60]PCBM). Impurities in the [70]PCBM are those typical for pure grades of [70]PCBM (e.g., oxides and [70]PCBM analogues); the same is true for any impurities present in the [60]PCBM.
Figure 2:
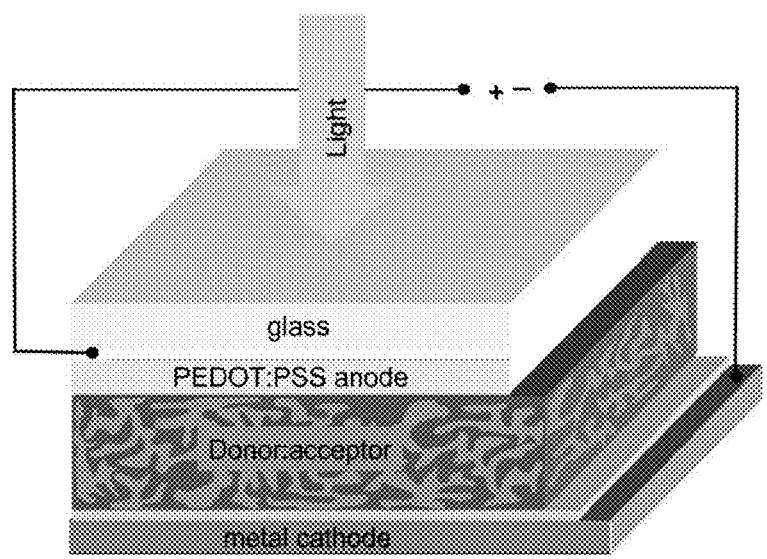
FIG. 2 Typical Bulk Heterojunction Photovoltaic Device Architecture. Bulk heterojunction refers to using a mixture of N-type and P-type semiconductor. Acceptor refers to the N-type semiconductor which can be a composition claimed in this patent application. Donor refers to the P-type semiconductor, most commonly conjugated polymers such as polythiophenes, for example poly-(3-hexylthiophene) ("P3HT"). The N-type and P-type are dissolved typically in an aromatic solvent such as chlorobenzene, which is then typically deposited using solution processing techniques, such as spin-coating or printing techniques, such as ink jet printing. The unnamed layers are a transparent conducting oxide (TCO, e.g. ITO; top) and an ultra-thin protective layer (e.g. LiF; bottom).

FIG. 1 shows the energy conversion efficiency of devices fabricated under identical processing conditions where the only difference was in the composition of the n-type semiconductor. The n-type semiconductor was made using a blend of [60]PCBM and [70]PCBM, each of which was 99% pure or higher with respect to compounds other than [60]PCBM and [70]PCBM. The weight percentage of [60]PCBM of the composition corresponding to a given weight % of [70]PCBM (as shown on the x-axis) was 99%-[weight % [70]PCBM]. Fullerenes higher in molecular weight than $C_{70}$ and fullerene derivatives higher in molecular weight than [70]PCBM were removed, since these compounds may act as electron traps and diminish performance. In this example, the removal of these compounds was performed after the PCBM synthesis, but it could also be advantageous to remove all fullerenes higher in molecular weight than $C_{70}$ from the fullerene mixture starting material before PCBM synthesis is carried out. The polymer used was poly-(3-hexylthiophene) ("P3HT"). The variation in the energy conversion efficiency across the various compositions in FIG. 1 was within the statistical variation of such devices, i.e., about 3% variation. Notably, such variations are typically seen even when using entirely identical processing conditions with the same batches of polymer and fullerene derivative. It can be appreciated that typical device non-uniformity is the substantial cause of the variation in energy conversion efficiency since the variation is scattered non-uniformly, as opposed to changing systematically with composition.

The results in FIG. 1 are especially surprising for the compositions where the weight % of [60]PCBM is equal to or higher than the weight % of [70]PCBM. The results are surprising because one might expect that the higher solubility of [70]PCBM, when combined with the lower concentrations relative to [60]PCBM, should lead to a significantly reduced driving force for the onset and rate of crystallization caused by the lower levels of supersaturation. In particular, one might expect [60]PCBM-rich domains and [70]PCBM-rich domains to give differences in the morphology and electronic behavior of the film because the rates of crystallization of the PCBM mixture components would be expected to be different from either pure [70]PCBM or [60]PCBM alone. In fact, it is generally recognized that significant optimization efforts are required to obtain the highest energy conversion efficiency of a given device system when different polymers, fullerene derivatives, or even the polymer molecular weight and regioregularity or purities of the fullerene derivative are used. Optimization efforts are often required because small changes in processing conditions and materials can cause significant changes in device performance. The changes in device performance can be attributed to film morphology changes. Notably, small differences in the average domain size of PCBM or polymer can cause significant changes in overall performance of the device. The effect of such differences is magnified by the fact that the overall film thickness is often only approximately 150 nm.

The result that blends of [60]PCBM and [70]PCBM show suitability as the semiconductor component in devices is also surprising in view the fact that the electronic properties of thin-films of polymer/[60]PCBM and polymer/[70]PCBM are significantly different. For example, it has also been shown that the open-circuit voltage and fill factor of pure [70]PCBM/MDMO-PPV devices is significantly lower than in [60]PCBM/MDMO-PPV devices (Wienk et al., Angewadte Chemie, 2003, (115), 3493-3497). Accordingly, the fact that blends of blends of [60]PCBM and [70]PCBM can be used without any noticeable effect on the electronic device performance, and most importantly under identical processing conditions, is surprising.

The use of a mixture of a $C_{60}$ fullerene derivative and a $C_{70}$ fullerene derivative in a semiconductor composition in electronics devices is advantageous because it is much less expensive to prepare a mixture of a $C_{60}$ fullerene derivative and a $C_{70}$ fullerene derivative compared to a pure $C_{60}$ or $C_{70}$ fullerene derivative. Preparation of a pure $C_{60}$ or $C_{70}$ fullerene derivative necessarily requires expensive purification processes at some stage in the synthesis in order to separate non-isomeric fullerenes. The purification is necessary because known processes for producing native fullerene feedstocks, such as arc vaporization, laser ablation, combustion, etc. produce mixtures of fullerenes. For example, $C_{60}$ is typically produced in the highest proportion, while $C_{70}$, $C_{84}$, and $C_{76}/C_{78}$, are produced in decreasing amounts. Typical product compositions of fullerenes produced by the arc vaporization process are approximately 65% C60, 30% C70, and 5% fullerenes higher in molecular weight than $C_{70}$. Combustion synthesis can produce nearly equal amounts of $C_{70}$ and $C_{60}$, and even more $C_{70}$ than $C_{60}$ in certain instances.

The fullerenes produced from a fullerene production process are purified into the individual fullerene species by purification processes, which typically require solvent processing, but in all cases lead to added expense because the purification step is in addition to the fullerene production step. Solvent processing often requires a large amount of solvent and a relatively long time for purification since the solubility of fullerenes is relatively low. Consequently, pure fullerenes are significantly more expensive than fullerene mixtures. For example, fullerene extract (where only the amorphous carbon and/or other non-fullerene material has been removed) costs at current market rates approximately $6/g at kilogram scale and 99% $C_{60}$ costs approximately $20/g. Therefore, the cost of the native fullerene starting material is a significant component of the final cost associated with production of PCBM fullerenes.

It is also noteworthy that the devices compared in FIG. 1 give a state-of-the-art energy conversion efficiency since the processing conditions were optimized for the pure [60]PCBM. The apparent lack of a dependency of energy conversion efficiency on the n-type semiconductor compositions tested occurs at already optimized processing conditions. This allows for the blend compositions potentially to be used to replace the typical pure PCBM semiconductors with minimal work required to re-optimize a given system. The fact that the C60/C70 fullerene blends of the invention should be compatible with devices currently using pure grades of PCBM is significant because essentially all known devices which use PCBM are based on pure grades of PCBM. The cost savings associated with preparing mixtures of

[60]PCBM and [70]PCBM also applies to other compositions, such as a 'higher fullerene" mixture comprising $C_{76}/C_{78}/C_{84}$, which is less expensive than $C_{84}$.

It is also envisioned that blends of [60]PCBM and [70] PCBM may offer enhanced energy conversion efficiency in certain systems as compared to the typically-used pure [70] PCBM. See Wienk et al., Angewandte Chemie, 2003, (115), 3493-3497). For example, a 90% [70]PCBM grade, where the remaining components were 9% [60]PCBM and 1% typical PCBM impurities, gave identical device performance in a poly(2-methoxy, 5-(2'-ethyl-hexyloxy)-p-phenylene vinylene) (MEH-PPV)/PCBM solar cell compared to [70] PCBM 99%. Notably, the pure [70]PCBM 99% device was significantly higher in energy conversion efficiency than the same device configuration with [60]PCBM. The 90% [70] PCBM also gave identical results to the PCBM 99% with no change in processing conditions.

Table 1 shows the energy conversion efficiency of a variety mixtures of $C_{60}$ and $C_{70}$ derivatives, with and without underivatized $C_{60}$, demonstrating the general applicability of this invention to mixtures of fullerene derivatives.

TABLE 1

Power Conversion Efficiency for P3HT/N-type (1:1) bulk heterojunction photovoltaic cells solution processed using chlorobenzene as solvent. Composition percentages of fullerene mixtures are determined by HPLC at a wavelength of 360 nm, on an analytical Cosmosil Buckyprep column (4.6 × 250 mm), with the assumption that all fullerenes and fullerene derivatives have equal molar extinction coefficients at 360 nm.

| N-type Compound | Power Conversion Efficiency (%) |
|---|---|
| [60]PCBM | 3.5 |
| [70]PCBM | 3.5 |
| [60]PCBM:[70]PCBM (3:1) | 3.9 |
| >[70]PCBM's (4% molar) | 0.1 |
| [60]ThCBM | 4.1 |
| [70]ThCBM | 4.3 |
| [60]ThCBM:[70]ThCBM (3:1) | 4.1 |
| >[70]ThCBM's (4% molar) | 0.2 |
| [60]Prato/[70]Prato (1.5:1) | 1.5 |
| [60]Prato/[70]Prato (4:1) | 0.6 |
| [60]ThCBM bis-adducts | 2.9 |
| [70]ThCBM bis-adducts | 2.5 |
| [60]ThCBM:[70]ThCBM (3:1) bis-adducts | 2.7 |
| [60]PCBM | 3.5 |
| [60]PCBM + C60 (2.5% molar) | 3.5 |
| [60]PCBM:[70]PCBM (3:1) | 3.0 |
| [60]PCBM:[70]PCBM (3:1) + $C_{60}$ (13% molar) | 2.6 |
| [60]PCBM:[70]PCBM (3:1) + $C_{60}$ (39% molar) | 2.2 |

In Table 1, ">70[PCBM's" describes PCBM derivatives greater than $C_{70}$. These molecules act as electron traps and degrade device performance. These results demonstrate that one can use mixtures of $C_{60}$ and $C_{70}$ derivatives, where the mono-derivatives can be any methanofullerene or Prato adduct, as an N-type in an organic photovoltaic device. Surprisingly, the data indicate that inclusion of $C_{60}$ up to 39% molar (and by extension pure C70) does not completely degrade device performance.

Uses

The mixed compositions of $C_{60}$ and $C_{70}$ derivatives described herein may be used as semiconductor compounds, either n-type or ambipolar (capable of both n-type and p-type semiconducting), either alone or in conjunction with one or more electronic polymers, such as conjugated polymers, or pure $C_{60}$ or $C_{70}$. The mixed compositions of $C_{60}$ and $C_{70}$ derivatives described here may be used in conjunction with conjugated polymers to form donor/acceptor systems, including thin-film devices where the conjugated polymer may be any polymer that gives suitable donor properties, such as, but not limited to: p-type oligomers and polymers of derivatized and underivatized thiophenes, phenylenes, fluorenes, acetylenes, isothionaphthenes, benzthiaziazoles, pyrroles and combinations thereof. In some embodiments, the polymer is selected from the group of (phenylene vinylene) oligomers and polymers, such as poly[(2-methoxy-5-(3',7',-dimethyloctyloxy)]-p-phenylene vinylene (MDMO-PPV) or selected from oligomer or polymer thiophenes, such as poly-(3-hexylthiophene) ("P3HT").

In instances relating to the use in thin-film devices, the mixed compositions of $C_{60}$ and $C_{70}$ derivatives described herein may be used as the n-type semiconductor either mixed with the p-type semiconductor (e.g., a conjugated polymer), or the p-type and n-type semiconductors may be in separate layers of the device. When the mixture of $C_{60}$ and $C_{70}$ derivatives described herein is mixed with a p-type conjugated polymer to form bulk heterojunction devices, blends, or copolymers, the weight to weight ratio of p-type material to fullerene can be in the range of 10:1 wt % to 1:10 wt %; 1:1 wt % to 1:5 wt %; or 1:2 wt % to 1:4 wt %.

Devices

Any suitable device architecture known in the art based on pure grades of fullerene derivatives may be used to construct the organic electronic devices described herein by simply replacing the pure grades of PCBM with the mixed compositions of $C_{60}$ and $C_{70}$ derivatives described herein. In some embodiments, PCBM, ThCBM, or Prato n-type semiconductors are used. In some cases, no particular optimization may be required due to substituting the pure grade of PCBM with the mixed compositions of $C_{60}$ and $C_{70}$ derivatives. However, certain cases may require routine optimization in order to obtain the best device performance.

Methanofullerenes

One example of a fullerene derivative of the invention is a methanofullerene having the general structure:

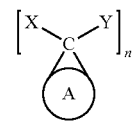

The —C(X)(Y)— group is bonded to the fullerene via a methano-bridge, as obtained through the well-known diazoalkane addition chemistry (W. Andreoni (ed.), *The chemical Physics of Fullerenes 10 (and 5) Years Later*, 257-265, Kluwer, 1996.) and X and Y are aryl, alkyl, or other chemical moieties which can be suitably bonded via the diazoalkane addition either by modification of the diazoalkane precursor or after the diazoalkane addition by modification of the fullerene derivative. Most common is the molecule where X is an unsubstituted aryl, and Y is Butyric-Acid-Methyl-Ester, which molecule is commonly termed PCBM. In the mono-adduct derivative n is 1; in the bis-adduct derivative, n is 2, and so on.

Blends of $C_{60}$ and $C_{70}$ methanofullerene derivatives can be prepared by derivatizing a mixture of unmodified $C_{60}$ and $C_{70}$ fullerenes. For example, a mixture of [60]PCBM/[70]PCBM can be prepared by subjecting a mixture of unmodified $C_{60}$ and $C_{70}$ fullerenes to the conditions described in Hummelen et al. *J. Org. Chem.* 1995, 60, 532 or US2005/0239717 for the preparation of [60]PCBM, [70]PCBM, and [84]PCBM. Both Hummelen et al. and US2005/0239717 are hereby incorporated by reference. The ratio of [60]PCBM to [70]PCBM in the final mixture can be varied by adjusting the ratio of $C_{60}$ fullerene to $C_{70}$ fullerene in the starting material used for the derivatization reaction. Alternatively, the ratio of [60]PCBM to [70]PCBM in the final mixture can be adjusted by subjecting the mixture of [60]PCBM and [70]PCBM to various analytical techniques known in the art.

A photodiode comprising the fullerene blends of the invention may be prepared following procedures known in the art for constructing a photodiode, wherein the fullerene blend of the invention is substituted for the pure fullerene derivative used in the known procedures. For example, a mixture of [60]PCBM and [70]PCBM may be used in place of the pure [70]PCBM described in WO04/073082 for the preparation of a solar cell. WO04/073082 is hereby incorporated by reference.

Prato Fullerene Derivatives

A Prato fullerene derivative is represented by:

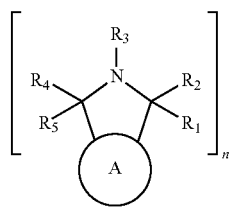

Prato Derivative wherein

A is a fullerene bonded to —C($R_4R_5$)—N($R_3$)—C($R_1R_2$)—;

$R_1$ is optionally substituted aryl or aralkyl;

$R_2$, $R_3$, $R_4$, and $R_5$ are independently optionally substituted alkyl, optionally substituted cycloalkyl, optionally substituted heteroalkyl, optionally substituted heterocycloalkyl, optionally substituted alkenyl, or optionally substituted aralkyl; and n is 1 to 40.

Other Fullerene Derivatives

The compositions, devices, and methods disclosed herein are applicable to any type of chemical derivative of fullerenes, such as those above, but not limited to the derivative types mentioned above.

Bingel Derivatives

The structure of a Bingel derivative is represented by:

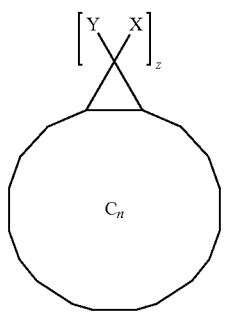

Bingel Derivative wherein z is 1 to 40;

X is an electron withdrawing group (EWG) such as ester, nitrile, nitro, cyano, ketone, dialkylphosphate, (substituted) pyridine, C-(triple bond)-C—R, (a.k.a. an acetylene) and R is Si—(R)3, or a trisubstituted silyl group (same or different); and Y is H, aryl, substituted aryl, alkyl, substituted alkyl.

Diazoline Derivatives

The structure of a Diazoline derivative is represented by:

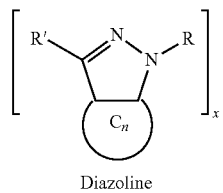

Diazoline wherein

R and R' are independently aryls; and x is 1 to 40.

Azafulleroid Derivatives

The structure of an Azafulleroid derivative is represented by:

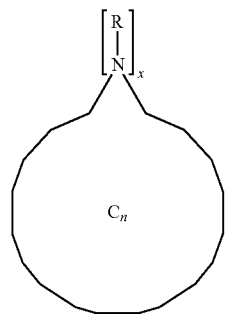

Azafulleroid wherein x is 1 to 40; and

R is alkyl, substituted alkyl, aryl, substituted aryl, $SO_2$—R', wherein R' is alkyl, aryl, substituted aryl.

Ketolactam Derivatives

The structure of a Ketolactam Adduct is represented by:

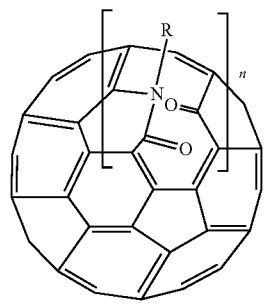

Ketolactam wherein

R is an alkyl or a substituted alkyl; and n is 1 to 40.

Diels Alder Derivatives
The structure of a Diels Alder derivative is represented by:

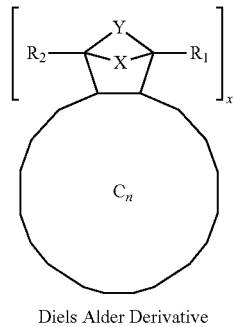

Diels Alder Derivative wherein
x is 1 to 40;
Cn is a fullerene;
$R_1$ is H, alkyl, alkyloxy, aryl, substituted alkyl, substituted aryl, heteroaryl, or substituted heteroaryl;
$R_2$ is H, alkyl, alkyloxy, aryl, substituted alkyl, substituted aryl, heteroaryl, or substituted heteroaryl;
X is O, alkyl, substituted alkyl, aryl, substituted aryl, heteroaryl, or substituted heteroaryl;
Y is aryl, substituted aryl, heteroaryl, substituted heteroaryl, vinylene, or substituted vinylene;
Or a compound with the general structure

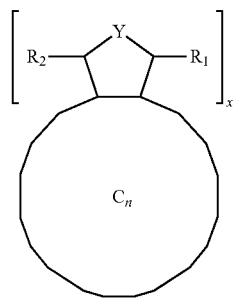

Diels Alder Derivative wherein
x is 1 to 40;
Cn is a fullerene;
$R_1$ is H, alkyl, alkyloxy, aryl, substituted alkyl, substituted aryl, heteroaryl, or substituted heteroaryl;
$R_2$ is H, alkyl, alkyloxy, aryl, substituted alkyl, substituted aryl, heteroaryl, or substituted heteroaryl;
Y is aryl, substituted aryl, heteroaryl, substituted heteroaryl, vinylene, or substituted vinylene.

Mixtures of $C_{60}$ and $C_{70}$ Fullerenes Derivatized with the Same Entity

The compositions described herein may comprise mixtures of $C_{60}$ and $C_{70}$ fullerenes each derivatized with PCBM, including: mixtures of about 95% [60]PCBM and about 5% [70]PCBM, mixtures of about 85% [60]PCBM and about 15% [70]PCBM, mixtures of about 75% [60]PCBM and about 25% [70]PCBM, mixtures of about 65% [60]PCBM and about 35% [70]PCBM, mixtures of about 55% [60]PCBM and about 45% [70]PCBM, mixtures of about 45% [60]PCBM and about 55% [70]PCBM, mixtures of about 35% [60]PCBM and about 65% [70]PCBM, mixtures of about 25% [60]PCBM and about 75% [70]PCBM, mixtures of about 15% [60]PCBM and about 85% [70]PCBM, and mixtures of about 5% [60]PCBM and about 95% [70]PCBM.

The compositions described herein may comprise mixtures of $C_{60}$ and $C_{70}$ fullerenes each derivatized with ThCBM, including: mixtures of about 95% [60]ThCBM and about 5% [70]ThCBM, mixtures of about 85% [60]ThCBM and about 15% [70]ThCBM, mixtures of about 75% [60]ThCBM and about 25% [70]ThCBM, mixtures of about 65% [60]ThCBM and about 35% [70]ThCBM, mixtures of about 55% [60]ThCBM and about 45% [70]ThCBM, mixtures of about 45% [60]ThCBM and about 55% [70]ThCBM, mixtures of about 35% [60]ThCBM and about 65% [70]ThCBM, mixtures of about 25% [60]ThCBM and about 75% [70]ThCBM, mixtures of about 15% [60]ThCBM and about 85% [70]ThCBM, and mixtures of about 5% [60]ThCBM and about 95% [70]ThCBM.

The compositions described herein may comprise mixtures of $C_{60}$ and $C_{70}$ fullerenes each derivatized with Prato adducts, including: mixtures of about 95% [60]Prato and about 5% [70]Prato, mixtures of about 85% [60]Prato and about 15% [70]Prato, mixtures of about 75% [60]Prato and about 25% [70]Prato, mixtures of about 65% [60]Prato and about 35% [70]Prato, mixtures of about 55% [60]Prato and about 45% [70]Prato, mixtures of about 45% [60]Prato and about 55% [70]Prato, mixtures of about 35% [60]Prato and about 65% [70]Prato, mixtures of about 25% [60]Prato and about 75% [70]Prato, mixtures of about 15% [60]Prato and about 85% [70]Prato, and mixtures of about 5% [60]Prato and about 95% [70]Prato.

Mixtures of $C_{60}$ and $C_{70}$ Fullerenes Derivatized with Different Entities The compositions described herein may comprise mixtures of $C_{60}$ fullerenes derivatized with PCBM and $C_{70}$ fullerenes derivatized with ThCBM, including: mixtures of about 95% [60]PCBM and about 5% [70]ThCBM, mixtures of about 85% [60]PCBM and about 15% [70]ThCBM, mixtures of about 75% [60]PCBM and about 25% [70]ThCBM, mixtures of about 65% [60]PCBM and about 35% [70]ThCBM, mixtures of about 55% [60]PCBM and about 45% [70]ThCBM, mixtures of about 45% [60]PCBM and about 55% [70]ThCBM, mixtures of about 35% [60]PCBM and about 65% [70]ThCBM, mixtures of about 25% [60]PCBM and about 75% [70]ThCBM, mixtures of about 15% [60]PCBM and about 85% [70]ThCBM, and mixtures of about 5% [60]PCBM and about 95% [70]ThCBM.

The compositions described herein may comprise mixtures of $C_{60}$ fullerenes derivatized with PCBM and $C_{70}$ fullerenes derivatized with Prato adducts, including: mixtures of about 95% [60]PCBM and about 5% [70]Prato, mixtures of about 85% [60]PCBM and about 15% [70]Prato, mixtures of about 75% [60]PCBM and about 25% [70]Prato, mixtures of about 65% [60]PCBM and about 35% [70]Prato, mixtures of about 55% [60]PCBM and about 45% [70]Prato, mixtures of about 45% [60]PCBM and about 55% [70]Prato, mixtures of about 35% [60]PCBM and about 65% [70]Prato, mixtures of about 25% [60]PCBM and about 75% [70]Prato, mixtures of about 15% [60]PCBM and about 85% [70]Prato, and mixtures of about 5% [60]PCBM and about 95% [70]Prato.

The compositions described herein may comprise mixtures of $C_{60}$ fullerenes derivatized with ThCBM and $C_{70}$ fullerenes derivatized with PCBM, including: mixtures of about 95% [60]ThCBM and about 5% [70]PCBM, mixtures of about 85% [60]ThCBM and about 15% [70]PCBM, mixtures of about 75% [60]ThCBM and about 25% [70]PCBM, mixtures of about 65% [60]ThCBM and about 35% [70]

PCBM, mixtures of about 55% [60]ThCBM and about 45% [70]PCBM, mixtures of about 45% [60]ThCBM and about 55% [70]PCBM, mixtures of about 35% [60]ThCBM and about 65% [70]PCBM, mixtures of about 25% [60]ThCBM and about 75% [70]PCBM, mixtures of about 15% [60]ThCBM and about 85% [70]PCBM, and mixtures of about 5% [60]ThCBM and about 95% [70]PCBM.

The compositions described herein may comprise mixtures of $C_{60}$ fullerenes derivatized with ThCBM and $C_{70}$ fullerenes derivatized with Prato adducts, including: mixtures of about 95% [60]ThCBM and about 5% [70]Prato, mixtures of about 85% [60]ThCBM and about 15% [70]Prato, mixtures of about 75% [60]ThCBM and about 25% [70]Prato, mixtures of about 65% [60]ThCBM and about 35% [70]Prato, mixtures of about 55% [60]ThCBM and about 45% [70]Prato, mixtures of about 45% [60]ThCBM and about 55% [70]Prato, mixtures of about 35% [60]ThCBM and about 65% [70]Prato, mixtures of about 25% [60]ThCBM and about 75% [70]Prato, mixtures of about 15% [60]ThCBM and about 85% [70]Prato, and mixtures of about 5% [60]ThCBM and about 95% [70]Prato.

The compositions described herein may comprise mixtures of $C_{60}$ fullerenes derivatized with Prato adducts and $C_{70}$ fullerenes derivatized with PCBM, including: mixtures of about 95% [60]Prato and about 5% [70]PCBM, mixtures of about 85% [60]Prato and about 15% [70]PCBM, mixtures of about 75% [60]Prato and about 25% [70]PCBM, mixtures of about 65% [60]Prato and about 35% [70]PCBM, mixtures of about 55% [60]Prato and about 45% [70]PCBM, mixtures of about 45% [60]Prato and about 55% [70]PCBM, mixtures of about 35% [60]Prato and about 65% [70]PCBM, mixtures of about 25% [60]Prato and about 75% [70]PCBM, mixtures of about 15% [60]Prato and about 85% [70]PCBM, and mixtures of about 5% [60]Prato and about 95% [70]PCBM.

The compositions described herein may comprise mixtures of $C_{60}$ fullerenes derivatized with Prato adducts and $C_{70}$ fullerenes derivatized with ThCBM, including: mixtures of about 95% [60]Prato and about 5% [70]ThCBM, mixtures of about 85% [60]Prato and about 15% [70]ThCBM, mixtures of about 75% [60]Prato and about 25% [70]ThCBM, mixtures of about 65% [60]Prato and about 35% [70]ThCBM, mixtures of about 55% [60]Prato and about 45% [70]ThCBM, mixtures of about 45% [60]Prato and about 55% [70]ThCBM, mixtures of about 35% [60]Prato and about 65% [70]ThCBM, mixtures of about 25% [60]Prato and about 75% [70]ThCBM, mixtures of about 15% [60]Prato and about 85% [70]ThCBM, and mixtures of about 5% [60]Prato and about 95% [70]ThCBM.

Mixtures of Derivatized and Unreacted C60 Fullerenes

The compositions described herein may comprise mixtures of $C_{60}$ fullerenes derivatized with PCBM and unreacted $C_{60}$ fullerenes, including: mixtures of about 97% [60]PCBM and about 3% [60], about 87% [60]PCBM and about 13% [60], about 77% [60]PCBM and about 23% [60], about 67% [60]PCBM and about 33% [60], about 57% [60]PCBM and about 43% [60], about 47% [60]PCBM and about 53% [60], about 37% [60]PCBM and about 63% [60], about 27% [60]PCBM and about 73% [60], about 17% [60]PCBM and about 83% [60], and about 7% [60]PCBM and about 93% [60].

The compositions described herein may comprise mixtures of $C_{60}$ fullerenes derivatized with ThCBM and unreacted $C_{60}$ fullerenes, including: mixtures of about 97% [60]ThCBM and about 3% [60], about 87% [60]ThCBM and about 13% [60], about 77% [60]ThCBM and about 23% [60], about 67% [60]ThCBM and about 33% [60], about 57% [60]ThCBM and about 43% [60], about 47% [60]ThCBM and about 53% [60], about 37% [60]ThCBM and about 63% [60], about 27% [60]ThCBM and about 73% [60], about 17% [60]ThCBM and about 83% [60], and about 7% [60]ThCBM and about 93% [60].

The compositions described herein may comprise mixtures of $C_{60}$ fullerenes derivatized with Prato adducts and unreacted $C_{60}$ fullerenes, including: mixtures of about 97% [60]Prato and about 3% [60], about 87% [60]Prato and about 13% [60], about 77% [60]Prato and about 23% [60], about 67% [60]Prato and about 33% [60], about 57% [60]Prato and about 43% [60], about 47% [60]Prato and about 53% [60], about 37% [60]Prato and about 63% [60], about 27% [60]Prato and about 73% [60], about 17% [60]Prato and about 83% [60], and about 7% [60]Prato and about 93% [60].

The compositions described herein may comprise mixtures of $C_{60}$ fullerenes derivatized with Bingel and unreacted $C_{60}$ fullerenes, including: mixtures of about 97% [60]Bingel and about 3% [60], about 87% [60]Bingel and about 13% [60], about 77% [60]Bingel and about 23% [60], about 67% [60]Bingel and about 33% [60], about 57% [60]Bingel and about 43% [60], about 47% [60]Bingel and about 53% [60], about 37% [60]Bingel and about 63% [60], about 27% [60]Bingel and about 73% [60], about 17% [60]Bingel and about 83% [60], and about 7% [60]Bingel and about 93% [60].

The compositions described herein may comprise mixtures of $C_{60}$ fullerenes derivatized with diazoline and unreacted $C_{60}$ fullerenes, including: mixtures of about 97% [60]diazoline and about 3% [60], about 87% [60]diazoline and about 13% [60], about 77% [60]diazoline and about 23% [60], about 67% [60]diazoline and about 33% [60], about 57% [60]diazoline and about 43% [60], about 47% [60]diazoline and about 53% [60], about 37% [60]diazoline and about 63% [60], about 27% [60]diazoline and about 73% [60], about 17% [60]diazoline and about 83% [60], and about 7% [60]diazoline and about 93% [60].

The compositions described herein may comprise mixtures of $C_{60}$ fullerenes derivatized with azafulleroid and unreacted $C_{60}$ fullerenes, including: mixtures of about 97% [60]azafulleroid and about 3% [60], about 87% [60]azafulleroid and about 13% [60], about 77% [60]azafulleroid and about 23% [60], about 67% [60]azafulleroid and about 33% [60], about 57% [60]azafulleroid and about 43% [60], about 47% [60]azafulleroid and about 53% [60], about 37% [60]azafulleroid and about 63% [60], about 27% [60]azafulleroid and about 73% [60], about 17% [60]azafulleroid and about 83% [60], and about 7% [60]azafulleroid and about 93% [60].

The compositions described herein may comprise mixtures of $C_{60}$ fullerenes derivatized with ketolactam and unreacted $C_{60}$ fullerenes, including: mixtures of about 97% [60]ketolactam and about 3% [60], about 87% [60]ketolactam and about 13% [60], about 77% [60]ketolactam and about 23% [60], about 67% [60]ketolactam and about 33% [60], about 57% [60]ketolactam and about 43% [60], about 47% [60]ketolactam and about 53% [60], about 37% [60]ketolactam and about 63% [60], about 27% [60]ketolactam and about 73% [60], about 17% [60]ketolactam and about 83% [60], and about 7% [60]ketolactam and about 93% [60].

The compositions described herein may comprise mixtures of $C_{60}$ fullerenes derivatized with Diels Alder and unreacted $C_{60}$ fullerenes, including: mixtures of about 97% [60]Diels Alder and about 3% [60], about 87% [60]Diels Alder and about 13% [60], about 77% [60]Diels Alder and about 23% [60], about 67% [60]Diels Alder and about 33% [60], about 57% [60]Diels Alder and about 43% [60], about 47% [60]Diels Alder and about 53% [60], about 37% [60]Diels Alder and about 63% [60], about 27% [60]Diels Alder and about 73% [60], about 17% [60]Diels Alder and about 83% [60], and about 7% [60]Diels Alder and about 93% [60].

Mixtures of Derivatized and Unreacted C70 Fullerenes

The compositions described herein may comprise mixtures of C70 fullerenes derivatized with PCBM and unreacted $C_{60}$ fullerenes, including: mixtures of about 97% [70]PCBM and about 3% [70], about 87% [70]PCBM and about 13% [70], about 77% [70]PCBM and about 23% [70], about 67% [70]PCBM and about 33% [70], about 57% [70]PCBM and about 43% [70], about 47% [70]PCBM and about 53% [70], about 37% [70]PCBM and about 63% [70], about 27% [70]PCBM and about 73% [70], about 17% [70]PCBM and about 83% [70], and about 7% [70]PCBM and about 93% [70].

The compositions described herein may comprise mixtures of $C_{70}$ fullerenes derivatized with ThCBM and unreacted $C_{60}$ fullerenes, including: mixtures of about 97% [70]ThCBM and about 3% [70], about 87% [70]ThCBM and about 13% [70], about 77% [70]ThCBM and about 23% [70], about 67% [70]ThCBM and about 33% [70], about 57% [70]ThCBM and about 43% [70], about 47% [70]ThCBM and about 53% [70], about 37% [70]ThCBM and about 63% [70], about 27% [70]ThCBM and about 73% [70], about 17% [70]ThCBM and about 83% [70], and about 7% [70]ThCBM and about 93% [70].

The compositions described herein may comprise mixtures of $C_{70}$ fullerenes derivatized with Prato adducts and unreacted $C_{60}$ fullerenes, including: mixtures of about 97% [70]Prato and about 3% [70], about 87% [70]Prato and about 13% [70], about 77% [70]Prato and about 23% [70], about 67% [70]Prato and about 33% [70], about 57% [70]Prato and about 43% [70], about 47% [70]Prato and about 53% [70], about 37% [70]Prato and about 63% [70], about 27% [70]Prato and about 73% [70], about 17% [70]Prato and about 83% [70], and about 7% [70]Prato and about 93% [70].

The compositions described herein may comprise mixtures of $C_{70}$ fullerenes derivatized with Bingel and unreacted $C_{70}$ fullerenes, including: mixtures of about 97% [70]Bingel and about 3% [70], about 87% [70]Bingel and about 13% [70], about 77% [70]Bingel and about 23% [70], about 67% [70]Bingel and about 33% [70], about 57% [70]Bingel and about 43% [70], about 47% [70]Bingel and about 53% [70], about 37% [70]Bingel and about 63% [70], about 27% [70]Bingel and about 73% [70], about 17% [70]Bingel and about 83% [70], and about 7% [70]Bingel and about 93% [70].

The compositions described herein may comprise mixtures of $C_{70}$ fullerenes derivatized with diazoline and unreacted $C_{70}$ fullerenes, including: mixtures of about 97% [70]diazoline and about 3% [70], about 87% [70]diazoline and about 13% [70], about 77% [70]diazoline and about 23% [70], about 67% [70]diazoline and about 33% [70], about 57% [70]diazoline and about 43% [70], about 47% [70]diazoline and about 53% [70], about 37% [70]diazoline and about 63% [70], about 27% [70]diazoline and about 73% [70], about 17% [70]diazoline and about 83% [70], and about 7% [70]diazoline and about 93% [70].

The compositions described herein may comprise mixtures of $C_{70}$ fullerenes derivatized with azafulleroid and unreacted $C_{70}$ fullerenes, including: mixtures of about 97% [70]azafulleroid and about 3% [70], about 87% [70]azafulleroid and about 13% [70], about 77% [70]azafulleroid and about 23% [70], about 67% [70]azafulleroid and about 33% [70], about 57% [70]azafulleroid and about 43% [70], about 47% [70]azafulleroid and about 53% [70], about 37% [70]azafulleroid and about 63% [70], about 27% [70]azafulleroid and about 73% [70], about 17% [70]azafulleroid and about 83% [70], and about 7% [70]azafulleroid and about 93% [70].

The compositions described herein may comprise mixtures of $C_{70}$ fullerenes derivatized with ketolactam and unreacted $C_{70}$ fullerenes, including: mixtures of about 97% [70]ketolactam and about 3% [70], about 87% [70]ketolactam and about 13% [70], about 77% [70]ketolactam and about 23% [70], about 67% [70]ketolactam and about 33% [70], about 57% [70]ketolactam and about 43% [70], about 47% [70]ketolactam and about 53% [70], about 37% [70]ketolactam and about 63% [70], about 27% [70]ketolactam and about 73% [70], about 17% [70]ketolactam and about 83% [70], and about 7% [70]ketolactam and about 93% [70].

The compositions described herein may comprise mixtures of $C_{70}$ fullerenes derivatized with Diels Alder and unreacted $C_{70}$ fullerenes, including: mixtures of about 97% [70]Diels Alder and about 3% [70], about 87% [70]Diels Alder and about 13% [70], about 77% [70]Diels Alder and about 23% [70], about 67% [70]Diels Alder and about 33% [70], about 57% [70]Diels Alder and about 43% [70], about 47% [70]Diels Alder and about 53% [70], about 37% [70]Diels Alder and about 63% [70], about 27% [70]Diels Alder and about 73% [70], about 17% [70]Diels Alder and about 83% [70], and about 7% [70]Diels Alder and about 93% [70].

Mixtures of $C_{60}$ and $C_{70}$ Fullerene Bis-Derivatives, Derivatized with the Same Entity The compositions described herein may comprise mixtures of $C_{60}$ and $C_{70}$ fullerenes each derivatized with PCBM, including: mixtures of about 95% [60]-bis-PCBM and about 5% [70]-bis-PCBM, mixtures of about 85% [60]-bis-PCBM and about 15% [70]-bis-PCBM, mixtures of about 75% [60]-bis-PCBM and about 25% [70]-bis-PCBM, mixtures of about 65% [60]-bis-PCBM and about 35% [70]-bis-PCBM, mixtures of about 55% [60]-bis-PCBM and about 45% [70]-bis-PCBM, mixtures of about 45% [60]-bis-PCBM and about 55% [70]-bis-PCBM, mixtures of about 35% [60]-bis-PCBM and about 65% [70]-bis-PCBM, mixtures of about 25% [60]-bis-PCBM and about 75% [70]-bis-PCBM, mixtures of about 15% [60]-bis-PCBM and about 85% [70]-bis-PCBM, and mixtures of about 5% [60]-bis-PCBM and about 95% [70]-bis-PCBM.

The compositions described herein may comprise mixtures of $C_{60}$ and $C_{70}$ fullerenes each derivatized with ThCBM, including: mixtures of about 95% [60]-bis-ThCBM and about 5% [70]-bis-ThCBM, mixtures of about 85% [60]-bis-ThCBM and about 15% [70]-bis-ThCBM, mixtures of about 75% [60]-bis-ThCBM and about 25% [70]-bis-ThCBM, mixtures of about 65% [60]-bis-ThCBM and about 35% [70]-bis-ThCBM, mixtures of about 55% [60]-bis-ThCBM and about 45% [70]-bis-ThCBM, mixtures of about 45% [60]-bis-ThCBM and about 55% [70]-bis-ThCBM, mixtures of about 35% [60]-bis-ThCBM and about 65% [70]-bis-ThCBM, mixtures of about 25% [60]-bis-ThCBM and about 75% [70]-bis-ThCBM, mixtures of about 15% [60]-bis-ThCBM and about 85% [70]-bis-ThCBM, and mixtures of about 5% [60]-bis-ThCBM and about 95% [70]-bis-ThCBM.

The compositions described herein may comprise mixtures of $C_{60}$ and $C_{70}$ fullerenes each derivatized with Prato adducts, including: mixtures of about 95% [60]-bis-Prato and about 5% [70]-bis-Prato, mixtures of about 85% [60]-bis-Prato and about 15% [70]-bis-Prato, mixtures of about 75% [60]-bis-Prato and about 25% [70]-bis-Prato, mixtures of about 65% [60]-bis-Prato and about 35% [70]-bis-Prato, mixtures of about 55% [60]-bis-Prato and about 45% [70]-bis-Prato, mixtures of about 45% [60]-bis-Prato and about 55% [70]-bis-Prato, mixtures of about 35% [60]-bis-Prato and about 65% [70]-bis-Prato, mixtures of about 25% [60]-bis-Prato and about 75% [70]-bis-Prato, mixtures of about 15% [60]-bis-Prato and about 85% [70]-bis-Prato, and mixtures of about 5% [60]-bis-Prato and about 95% [70]-bis-Prato.

The compositions described herein may comprise mixtures of $C_{60}$ and $C_{70}$ fullerenes each derivatized with Bingel, including: mixtures of about 95% [60]-bis-Bingel and about 5% [70]-bis-Bingel, mixtures of about 85% [60]-bis-Bingel and about 15% [70]-bis-Bingel, mixtures of about 75% [60]-bis-Bingel and about 25% [70]-bis-Bingel, mixtures of about 65% [60]-bis-Bingel and about 35% [70]-bis-Bingel, mixtures of about 55% [60]-bis-Bingel and about 45% [70]-bis-Bingel, mixtures of about 45% [60]-bis-Bingel and about 55% [70]-bis-Bingel, mixtures of about 35% [60]-bis-Bingel and about 65% [70]-bis-Bingel, mixtures of about 25% [60]-bis-Bingel and about 75% [70]-bis-Bingel, mixtures of about 15% [60]-bis-Bingel and about 85% [70]-bis-Bingel, and mixtures of about 5% [60]-bis-Bingel and about 95% [70]-bis-Bingel.

The compositions described herein may comprise mixtures of $C_{60}$ and $C_{70}$ fullerenes each derivatized with diazoline, including: mixtures of about 95% [60]-bis-diazoline and about 5% [70]-bis-diazoline, mixtures of about 85% [60]-bis-diazoline and about 15% [70]-bis-diazoline, mixtures of about 75% [60]-bis-diazoline and about 25% [70]-bis-diazoline, mixtures of about 65% [60]-bis-diazoline and about 35% [70]-bis-diazoline, mixtures of about 55% [60]-bis-diazoline and about 45% [70]-bis-diazoline, mixtures of about 45% [60]-bis-diazoline and about 55% [70]-bis-diazoline, mixtures of about 35% [60]-bis-diazoline and about 65% [70]-bis-diazoline, mixtures of about 25% [60]-bis-diazoline and about 75% [70]-bis-diazoline, mixtures of about 15% [60]-bis-diazoline and about 85% [70]-bis-diazoline, and mixtures of about 5% [60]-bis-diazoline and about 95% [70]-bis-diazoline.

The compositions described herein may comprise mixtures of $C_{60}$ and $C_{70}$ fullerenes each derivatized with azafulleroid, including: mixtures of about 95% [60]-bis-azafulleroid and about 5% [70]-bis-azafulleroid, mixtures of about 85% [60]-bis-azafulleroid and about 15% [70]-bis-azafulleroid, mixtures of about 75% [60]-bis-azafulleroid and about 25% [70]-bis-azafulleroid, mixtures of about 65% [60]-bis-azafulleroid and about 35% [70]-bis-azafulleroid, mixtures of about 55% [60]-bis-azafulleroid and about 45% [70]-bis-azafulleroid, mixtures of about 45% [60]-bis-azafulleroid and about 55% [70]-bis-azafulleroid, mixtures of about 35% [60]-bis-azafulleroid and about 65% [70]-bis-azafulleroid, mixtures of about 25% [60]-bis-azafulleroid and about 75% [70]-bis-azafulleroid, mixtures of about 15% [60]-bis-azafulleroid and about 85% [70]-bis-azafulleroid, and mixtures of about 5% [60]-bis-azafulleroid and about 95% [70]-bis-azafulleroid.

The compositions described herein may comprise mixtures of $C_{60}$ and $C_{70}$ fullerenes each derivatized with ketolactam, including: mixtures of about 95% [60]-bis-ketolactam and about 5% [70]-bis-ketolactam, mixtures of about 85% [60]-bis-ketolactam and about 15% [70]-bis-ketolactam, mixtures of about 75% [60]-bis-ketolactam and about 25% [70]-bis-ketolactam, mixtures of about 65% [60]-bis-ketolactam and about 35% [70]-bis-ketolactam, mixtures of about 55% [60]-bis-ketolactam and about 45% [70]-bis-ketolactam, mixtures of about 45% [60]-bis-ketolactam and about 55% [70]-bis-ketolactam, mixtures of about 35% [60]-bis-ketolactam and about 65% [70]-bis-ketolactam, mixtures of about 25% [60]-bis-ketolactam and about 75% [70]-bis-ketolactam, mixtures of about 15% [60]-bis-ketolactam and about 85% [70]-bis-ketolactam, and mixtures of about 5% [60]-bis-ketolactam and about 95% [70]-bis-ketolactam.

The compositions described herein may comprise mixtures of $C_{60}$ and $C_{70}$ fullerenes each derivatized with Diels Alder, including: mixtures of about 95% [60]-bis-Diels Alder and about 5% [70]-bis-Diels Alder, mixtures of about 85% [60]-bis-Diels Alder and about 15% [70]-bis-Diels Alder, mixtures of about 75% [60]-bis-Diels Alder and about 25% [70]-bis-Diels Alder, mixtures of about 65% [60]-bis-Diels Alder and about 35% [70]-bis-Diels Alder, mixtures of about 55% [60]-bis-Diels Alder and about 45% [70]-bis-Diels Alder, mixtures of about 45% [60]-bis-Diels Alder and about 55% [70]-bis-Diels Alder, mixtures of about 35% [60]-bis-Diels Alder and about 65% [70]-bis-Diels Alder, mixtures of about 25% [60]-bis-Diels Alder and about 75% [70]-bis-Diels Alder, mixtures of about 15% [60]-bis-Diels Alder and about 85% [70]-bis-Diels Alder, and mixtures of about 5% [60]-bis-Diels Alder and about 95% [70]-bis-Diels Alder.

Mixtures of $C_{60}$ and $C_{70}$ Fullerene Bis-Derivatives, Derivatized with Different Entities The compositions described herein may comprise mixtures of $C_{60}$ fullerenes derivatized with PCBM and $C_{70}$ fullerenes derivatized with ThCBM, including: mixtures of about 95% [60]-bis-PCBM and about 5% [70]-bis-ThCBM, mixtures of about 85% [60]-bis-PCBM and about 15% [70]-bis-ThCBM, mixtures of about 75% [60]-bis-PCBM and about 25% [70]-bis-ThCBM, mixtures of about 65% [60]-bis-PCBM and about 35% [70]-bis-ThCBM, mixtures of about 55% [60]-bis-PCBM and about 45% [70]-bis-ThCBM, mixtures of about 45% [60]-bis-PCBM and about 55% [70]-bis-ThCBM, mixtures of about 35% [60]-bis-PCBM and about 65% [70]-bis-ThCBM, mixtures of about 25% [60]-bis-PCBM and about 75% [70]-bis-ThCBM, mixtures of about 15% [60]-bis-PCBM and about 85% [70]-bis-ThCBM, and mixtures of about 5% [60]-bis-PCBM and about 95% [70]-bis-ThCBM.

The compositions described herein may comprise mixtures of $C_{60}$ fullerenes derivatized with PCBM and $C_{70}$ fullerenes derivatized with Prato adducts, including: mixtures of about 95% [60]-bis-PCBM and about 5% [70]-bis-Prato, mixtures of about 85% [60]-bis-PCBM and about 15% [70]-bis-Prato, mixtures of about 75% [60]-bis-PCBM and about 25% [70]-bis-Prato, mixtures of about 65% [60]-bis-PCBM and about 35% [70]-bis-Prato, mixtures of about 55% [60]-bis-PCBM and about 45% [70]-bis-Prato, mixtures of about 45% [60]-bis-PCBM and about 55% [70]-bis-Prato, mixtures of about 35% [60]-bis-PCBM and about 65% [70]-bis-Prato, mixtures of about 25% [60]-bis-PCBM and about 75% [70]-bis-Prato, mixtures of about 15% [60]-bis-PCBM and about 85% [70]-bis-Prato, and mixtures of about 5% [60]-bis-PCBM and about 95% [70]-bis-Prato.

The compositions described herein may comprise mixtures of $C_{60}$ fullerenes derivatized with ThCBM and $C_{70}$ fullerenes derivatized with PCBM, including: mixtures of about 95% [60]-bis-ThCBM and about 5% [70]-bis-PCBM, mixtures of about 85% [60]-bis-ThCBM and about 15% [70]-bis-PCBM, mixtures of about 75% [60]-bis-ThCBM and about 25% [70]-bis-PCBM, mixtures of about 65% [60]-bis-ThCBM and about 35% [70]-bis-PCBM, mixtures of about 55% [60]-bis-ThCBM and about 45% [70]-bis-PCBM, mixtures of about 45% [60]-bis-ThCBM and about 55% [70]-bis-PCBM, mixtures of about 35% [60]-bis-ThCBM and about 65% [70]-bis-PCBM, mixtures of about 25% [60]-bis-ThCBM and about 75% [70]-bis-PCBM, mixtures of about 15% [60]-bis-ThCBM and about 85% [70]-bis-PCBM, and mixtures of about 5% [60]-bis-ThCBM and about 95% [70]-bis-PCBM.

The compositions described herein may comprise mixtures of $C_{60}$ fullerenes derivatized with ThCBM and $C_{70}$ fullerenes derivatized with Prato adducts, including: mixtures of about 95% [60]-bis-ThCBM and about 5% [70]-bis-Prato, mixtures of about 85% [60]-bis-ThCBM and about 15% [70]-bis-Prato, mixtures of about 75% [60]-bis-ThCBM and about 25% [70]-bis-Prato, mixtures of about 65% [60]-bis-ThCBM and about 35% [70]-bis-Prato, mixtures of about 55% [60]-bis-ThCBM and about 45% [70]-bis-Prato, mixtures of about 45% [60]-bis-ThCBM and about 55% [70]-bis-Prato, mixtures of about 35% [60]-bis-ThCBM and about 65% [70]-bis-Prato, mixtures of about 25% [60]-bis-ThCBM and about 75% [70]-bis-Prato, mixtures of about 15% [60]-bis-ThCBM and about 85% [70]-bis-Prato, and mixtures of about 5% [60]-bis-ThCBM and about 95% [70]-bis-Prato.

The compositions described herein may comprise mixtures of $C_{60}$ fullerenes derivatized with Prato adducts and $C_{70}$ fullerenes derivatized with PCBM, including: mixtures of about 95% [60]-bis-Prato and about 5% [70]-bis-PCBM, mixtures of about 85% [60]-bis-Prato and about 15% [70]-bis-PCBM, mixtures of about 75% [60]-bis-Prato and about 25% [70]-bis-PCBM, mixtures of about 65% [60]-bis-Prato and about 35% [70]-bis-PCBM, mixtures of about 55% [60]-bis-Prato and about 45% [70]-bis-PCBM, mixtures of about 45% [60]-bis-Prato and about 55% [70]-bis-PCBM, mixtures of about 35% [60]-bis-Prato and about 65% [70]-bis-PCBM, mixtures of about 25% [60]-bis-Prato and about 75% [70]-bis-PCBM, mixtures of about 15% [60]-bis-Prato and about 85% [70]-bis-PCBM, and mixtures of about 5% [60]-bis-Prato and about 95% [70]-bis-PCBM.

The compositions described herein may comprise mixtures of $C_{60}$ fullerenes derivatized with Prato adducts and $C_{70}$ fullerenes derivatized with ThCBM, including: mixtures of about 95% [60]-bis-Prato and about 5% [70]-bis-ThCBM, mixtures of about 85% [60]-bis-Prato and about 15% [70]-bis-ThCBM, mixtures of about 75% [60]-bis-Prato and about 25% [70]-bis-ThCBM, mixtures of about 65% [60]-bis-Prato and about 35% [70]-bis-ThCBM, mixtures of about 55% [60]-bis-Prato and about 45% [70]-bis-ThCBM, mixtures of about 45% [60]-bis-Prato and about 55% [70]-bis-ThCBM, mixtures of about 35% [60]-bis-Prato and about 65% [70]-bis-ThCBM, mixtures of about 25% [60]-bis-Prato and about 75% [70]-bis-ThCBM, mixtures of about 15% [60]-bis-Prato and about 85% [70]-bis-ThCBM, and mixtures of about 5% [60]-bis-Prato and about 95% [70]-bis-ThCBM.

Mixtures of Bis-Derivatized and Unreacted C60 Fullerenes

The compositions described herein may comprise mixtures of $C_{60}$ fullerenes derivatized with PCBM and unreacted $C_{60}$ fullerenes, including: mixtures of about 97% [60]-bis-PCBM and about 3% [60], about 87% [60]-bis-PCBM and about 13% [60], about 77% [60]-bis-PCBM and about 23% [60], about 67% [60]-bis-PCBM and about 33% [60], about 57% [60]-bis-PCBM and about 43% [60], about 47% [60]-bis-PCBM and about 53% [60], about 37% [60]-bis-PCBM and about 63% [60], about 27% [60]-bis-PCBM and about 73% [60], about 17% [60]-bis-PCBM and about 83% [60], and about 7% [60]-bis-PCBM and about 93% [60].

The compositions described herein may comprise mixtures of $C_{60}$ fullerenes derivatized with ThCBM and unreacted $C_{60}$ fullerenes, including: mixtures of about 97% [60]-bis-ThCBM and about 3% [60], about 87% [60]-bis-ThCBM and about 13% [60], about 77% [60]-bis-ThCBM and about 23% [60], about 67% [60]-bis-ThCBM and about 33% [60], about 57% [60]-bis-ThCBM and about 43% [60], about 47% [60]-bis-ThCBM and about 53% [60], about 37% [60]-bis-ThCBM and about 63% [60], about 27% [60]-bis-ThCBM and about 73% [60], about 17% [60]-bis-ThCBM and about 83% [60], and about 7% [60]-bis-ThCBM and about 93% [60].

The compositions described herein may comprise mixtures of $C_{60}$ fullerenes derivatized with Prato adducts and unreacted $C_{60}$ fullerenes, including: mixtures of about 97% [60]-bis-Prato and about 3% [60], about 87% [60]-bis-Prato and about 13% [60], about 77% [60]-bis-Prato and about 23% [60], about 67% [60]-bis-Prato and about 33% [60], about 57% [60]-bis-Prato and about 43% [60], about 47% [60]-bis-Prato and about 53% [60], about 37% [60]-bis-Prato and about 63% [60], about 27% [60]-bis-Prato and about 73% [60], about 17% [60]-bis-Prato and about 83% [60], and about 7% [60]-bis-Prato and about 93% [60].

The compositions described herein may comprise mixtures of $C_{60}$ fullerenes derivatized with Bingel adducts and unreacted $C_{60}$ fullerenes, including: mixtures of about 97% [60]-bis-Bingel and about 3% [60], about 87% [60]-bis-Bingel and about 13% [60], about 77% [60]-bis-Bingel and about 23% [60], about 67% [60]-bis-Bingel and about 33% [60], about 57% [60]-bis-Bingel and about 43% [60], about 47% [60]-bis-Bingel and about 53% [60], about 37% [60]-bis-Bingel and about 63% [60], about 27% [60]-bis-Bingel and about 73% [60], about 17% [60]-bis-Bingel and about 83% [60], and about 7% [60]-bis-Bingel and about 93% [60].

The compositions described herein may comprise mixtures of $C_{60}$ fullerenes derivatized with diazoline adducts and unreacted $C_{60}$ fullerenes, including: mixtures of about 97% [60]-bis-diazoline and about 3% [60], about 87% [60]-bis-diazoline and about 13% [60], about 77% [60]-bis-diazoline and about 23% [60], about 67% [60]-bis-diazoline and about 33% [60], about 57% [60]-bis-diazoline and about 43% [60], about 47% [60]-bis-diazoline and about 53% [60], about 37% [60]-bis-diazoline and about 63% [60], about 27% [60]-bis-diazoline and about 73% [60], about 17% [60]-bis-diazoline and about 83% [60], and about 7% [60]-bis-diazoline and about 93% [60].

The compositions described herein may comprise mixtures of $C_{60}$ fullerenes derivatized with azafulleroid adducts and unreacted $C_{60}$ fullerenes, including: mixtures of about 97% [60]-bis-azafulleroid and about 3% [60], about 87% [60]-bis-azafulleroid and about 13% [60], about 77% [60]-bis-azafulleroid and about 23% [60], about 67% [60]-bis-azafulleroid and about 33% [60], about 57% [60]-bis-azafulleroid and about 43% [60], about 47% [60]-bis-azafulleroid and about 53% [60], about 37% [60]-bis-azafulleroid and about 63% [60], about 27% [60]-bis-azafulleroid and about 73% [60], about 17% [60]-bis-azafulleroid and about 83% [60], and about 7% [60]-bis-azafulleroid and about 93% [60].

The compositions described herein may comprise mixtures of $C_{60}$ fullerenes derivatized with ketolactam adducts and unreacted $C_{60}$ fullerenes, including: mixtures of about 97% [60]-bis-ketolactam and about 3% [60], about 87% [60]-bis-ketolactam and about 13% [60], about 77% [60]-bis-ketolactam and about 23% [60], about 67% [60]-bis-ketolactam and about 33% [60], about 57% [60]-bis-ketolactam and about 43% [60], about 47% [60]-bis-ketolactam and about 53% [60], about 37% [60]-bis-ketolactam and about 63% [60], about 27% [60]-bis-ketolactam and about 73% [60], about 17% [60]-bis-ketolactam and about 83% [60], and about 7% [60]-bis-ketolactam and about 93% [60].

The compositions described herein may comprise mixtures of $C_{60}$ fullerenes derivatized with Diels Alder adducts and unreacted $C_{60}$ fullerenes, including: mixtures of about 97% [60]-bis-Diels Alder and about 3% [60], about 87% [60]-bis-Diels Alder and about 13% [60], about 77% [60]-bis-Diels Alder and about 23% [60], about 67% [60]-bis-Diels Alder and about 33% [60], about 57% [60]-bis-Diels Alder and about 43% [60], about 47% [60]-bis-Diels Alder and about 53% [60], about 37% [60]-bis-Diels Alder and about 63% [60], about 27% [60]-bis-Diels Alder and about 73% [60], about 17% [60]-bis-Diels Alder and about 83% [60], and about 7% [60]-bis-Diels Alder and about 93% [60].

Mixtures of Bis-Derivatized and Unreacted C70 Fullerenes

The compositions described herein may comprise mixtures of $C_{70}$ fullerenes derivatized with PCBM and unreacted $C_{60}$ fullerenes, including: mixtures of about 97% [70]-bis-PCBM and about 3% [70], about 87% [70]-bis-PCBM and about 13% [70], about 77% [70]-bis-PCBM and about 23% [70], about 67% [70]-bis-PCBM and about 33% [70], about 57% [70]-bis-PCBM and about 43% [70], about 47% [70]-bis-PCBM and about 53% [70], about 37% [70]-bis-PCBM and about 63% [70], about 27% [70]-bis-PCBM and about 73% [70], about 17% [70]-bis-PCBM and about 83% [70], and about 7% [70]-bis-PCBM and about 93% [70].

The compositions described herein may comprise mixtures of $C_{70}$ fullerenes derivatized with ThCBM and unreacted $C_{60}$ fullerenes, including: mixtures of about 97% [70]-bis-ThCBM and about 3% [70], about 87% [70]-bis-ThCBM and about 13% [70], about 77% [70]-bis-ThCBM and about 23% [70], about 67% [70]-bis-ThCBM and about 33% [70], about 57% [70]-bis-ThCBM and about 43% [70], about 47% [70]-bis-ThCBM and about 53% [70], about 37% [70]-bis-ThCBM and about 63% [70], about 27% [70]-bis-ThCBM and about 73% [70], about 17% [70]-bis-ThCBM and about 83% [70], and about 7% [70]-bis-ThCBM and about 93% [70].

The compositions described herein may comprise mixtures of C70 fullerenes derivatized with Prato adducts and unreacted $C_{60}$ fullerenes, including: mixtures of about 97% [70]-bis-Prato and about 3% [70], about 87% [70]-bis-Prato and about 13% [70], about 77% [70]-bis-Prato and about 23% [70], about 67% [70]-bis-Prato and about 33% [70], about 57% [70]-bis-Prato and about 43% [70], about 47% [70]-bis-Prato and about 53% [70], about 37% [70]-bis-Prato and about 63% [70], about 27% [70]-bis-Prato and about 73% [70], about 17% [70]-bis-Prato and about 83% [70], and about 7% [70]-bis-Prato and about 93% [70].

The compositions described herein may comprise mixtures of $C_{70}$ fullerenes derivatized with Bingel adducts and unreacted $C_{70}$ fullerenes, including: mixtures of about 97% [70]-bis-Bingel and about 3% [70], about 87% [70]-bis-Bingel and about 13% [70], about 77% [70]-bis-Bingel and about 23% [70], about 67% [70]-bis-Bingel and about 33% [70], about 57% [70]-bis-Bingel and about 43% [70], about 47% [70]-bis-Bingel and about 53% [70], about 37% [70]-bis-Bingel and about 63% [70], about 27% [70]-bis-Bingel and about 73% [70], about 17% [70]-bis-Bingel and about 83% [70], and about 7% [70]-bis-Bingel and about 93% [70].

The compositions described herein may comprise mixtures of $C_{70}$ fullerenes derivatized with diazoline adducts and unreacted $C_{70}$ fullerenes, including: mixtures of about 97% [70]-bis-diazoline and about 3% [70], about 87% [70]-bis-diazoline and about 13% [70], about 77% [70]-bis-diazoline and about 23% [70], about 67% [70]-bis-diazoline and about 33% [70], about 57% [70]-bis-diazoline and about 43% [70], about 47% [70]-bis-diazoline and about 53% [70], about 37% [70]-bis-diazoline and about 63% [70], about 27% [70]-bis-diazoline and about 73% [70], about 17% [70]-bis-diazoline and about 83% [70], and about 7% [70]-bis-diazoline and about 93% [70].

The compositions described herein may comprise mixtures of $C_{70}$ fullerenes derivatized with azafulleroid adducts and unreacted $C_{70}$ fullerenes, including: mixtures of about 97% [70]-bis-azafulleroid and about 3% [70], about 87% [70]-bis-azafulleroid and about 13% [70], about 77% [70]-bis-azafulleroid and about 23% [70], about 67% [70]-bis-azafulleroid and about 33% [70], about 57% [70]-bis-azafulleroid and about 43% [70], about 47% [70]-bis-azafulleroid and about 53% [70], about 37% [70]-bis-azafulleroid and about 63% [70], about 27% [70]-bis-azafulleroid and about 73% [70], about 17% [70]-bis-azafulleroid and about 83% [70], and about 7% [70]-bis-azafulleroid and about 93% [70].

The compositions described herein may comprise mixtures of $C_{70}$ fullerenes derivatized with ketolactam adducts and unreacted $C_{70}$ fullerenes, including: mixtures of about 97% [70]-bis-ketolactam and about 3% [70], about 87% [70]-bis-ketolactam and about 13% [70], about 77% [70]-bis-ketolactam and about 23% [70], about 67% [70]-bis-ketolactam and about 33% [70], about 57% [70]-bis-ketolactam and about 43% [70], about 47% [70]-bis-ketolactam and about 53% [70], about 37% [70]-bis-ketolactam and about 63% [70], about 27% [70]-bis-ketolactam and about 73% [70], about 17% [70]-bis-ketolactam and about 83% [70], and about 7% [70]-bis-ketolactam and about 93% [70].

The compositions described herein may comprise mixtures of $C_{70}$ fullerenes derivatized with Diels Alder adducts and unreacted $C_{70}$ fullerenes, including: mixtures of about 97% [70]-bis-Diels Alder and about 3% [70], about 87% [70]-bis-Diels Alder and about 13% [70], about 77% [70]-bis-Diels Alder and about 23% [70], about 67% [70]-bis-Diels Alder and about 33% [70], about 57% [70]-bis-Diels Alder and about 43% [70], about 47% [70]-bis-Diels Alder and about 53% [70], about 37% [70]-bis-Diels Alder and about 63% [70], about 27% [70]-bis-Diels Alder and about 73% [70], about 17% [70]-bis-Diels Alder and about 83% [70], and about 7% [70]-bis-Diels Alder and about 93% [70].

Mixtures of $C_{60}$ Derivatized with Different Entities

The compositions described herein may comprise mixtures of $C_{60}$ fullerenes derivatized with PCBM and $C_{60}$ fullerenes derivatized with ThCBM, including: mixtures of about 95% [60]PCBM and about 5% [60]ThCBM, mixtures of about 85% [60]PCBM and about 15% [60]ThCBM, mixtures of about 75% [60]PCBM and about 25% [60]ThCBM, mixtures of about 65% [60]PCBM and about 35% [60]ThCBM, mixtures of about 55% [60]PCBM and about 45% [60]ThCBM, mixtures of about 45% [60]PCBM and about 55% [60]ThCBM, mixtures of about 35% [60]PCBM and about 65% [60]ThCBM, mixtures of about 25% [60]PCBM and about 75% [60]ThCBM, mixtures of about 15% [60]PCBM and about 85% [60]ThCBM, and mixtures of about 5% [60]PCBM and about 95% [60]ThCBM.

The compositions described herein may comprise mixtures of $C_{60}$ fullerenes derivatized with PCBM and $C_{60}$ fullerenes derivatized with Prato adducts, including: mixtures of about 95% [60]PCBM and about 5% [60]Prato, mixtures of about 85% [60]PCBM and about 15% [60]Prato, mixtures of about 75% [60]PCBM and about 25% [60]Prato, mixtures of about 65% [60]PCBM and about 35% [60]Prato, mixtures of about 55% [60]PCBM and about 45% [60]Prato, mixtures of about 45% [60]PCBM and about 55% [60]Prato, mixtures of about 35% [60]PCBM and about 65% [60]Prato, mixtures of about 25% [60]PCBM and about 75% [60]Prato, mixtures of about 15% [60]PCBM and about 85% [60]Prato, and mixtures of about 5% [60]PCBM and about 95% [60]Prato.

The compositions described herein may comprise mixtures of $C_{60}$ fullerenes derivatized with ThCBM and $C_{60}$ fullerenes derivatized with Prato adducts, including: mixtures of about 95% [60]ThCBM and about 5% [60]Prato, mixtures of about 85% [60]ThCBM and about 15% [60]Prato, mixtures of about 75% [60]ThCBM and about 25% [60]Prato, mixtures of about 65% [60]ThCBM and about 35% [60]Prato, mixtures of about 55% [60]ThCBM and about 45% [60]Prato, mixtures of about 45% [60]ThCBM and about 55% [60]Prato, mixtures of about 35% [60]ThCBM and about 65% [60]Prato, mixtures of about 25% [60]ThCBM and about 75% [60]Prato, mixtures of about 15% [60]Th- CBM and about 85% [60]Prato, and mixtures of about 5% [60]ThCBM and about 95% [60]Prato.

Mixtures of $C_{70}$ Derivatized with Different Entities

The compositions described herein may comprise mixtures of $C_{70}$ fullerenes derivatized with PCBM and $C_{70}$ fullerenes derivatized with ThCBM, including: mixtures of about 95% [70]PCBM and about 5% [70]ThCBM, mixtures of about 85% [70]PCBM and about 15% [70]ThCBM, mixtures of about 75% [70]PCBM and about 25% [70]ThCBM, mixtures of about 65% [70]PCBM and about 35% [70]ThCBM, mixtures of about 55% [70]PCBM and about 45% [70]ThCBM, mixtures of about 45% [70]PCBM and about 55% [70]ThCBM, mixtures of about 35% [70]PCBM and about 65% [70]ThCBM, mixtures of about 25% [70]PCBM and about 75% [70]ThCBM, mixtures of about 15% [70] PCBM and about 85% [70]ThCBM, and mixtures of about 5% [70]PCBM and about 95% [70]ThCBM.

The compositions described herein may comprise mixtures of $C_{70}$ fullerenes derivatized with PCBM and $C_{70}$ fullerenes derivatized with Prato adducts, including: mixtures of about 95% [70]PCBM and about 5% [70]Prato, mixtures of about 85% [70]PCBM and about 15% [70]Prato, mixtures of about 75% [70]PCBM and about 25% [70]Prato, mixtures of about 65% [70]PCBM and about 35% [70]Prato, mixtures of about 55% [70]PCBM and about 45% [70]Prato, mixtures of about 45% [70]PCBM and about 55% [70]Prato, mixtures of about 35% [70]PCBM and about 65% [70]Prato, mixtures of about 25% [70]PCBM and about 75% [70]Prato, mixtures of about 15% [70]PCBM and about 85% [70]Prato, and mixtures of about 5% [70]PCBM and about 95% [70]Prato.

The compositions described herein may comprise mixtures of $C_{70}$ fullerenes derivatized with ThCBM and $C_{70}$ fullerenes derivatized with Prato adducts, including: mixtures of about 95% [70]ThCBM and about 5% [70]Prato, mixtures of about 85% [70]ThCBM and about 15% [70]Prato, mixtures of about 75% [70]ThCBM and about 25% [70]Prato, mixtures of about 65% [70]ThCBM and about 35% [70]Prato, mixtures of about 55% [70]ThCBM and about 45% [70]Prato, mixtures of about 45% [70]ThCBM and about 55% [70]Prato, mixtures of about 35% [70]ThCBM and about 65% [70]Prato, mixtures of about 25% [70]ThCBM and about 75% [70]Prato, mixtures of about 15% [70]ThCBM and about 85% [70]Prato, and mixtures of about 5% [70]ThCBM and about 95% [70]Prato.

The compositions described herein may also comprise ternary, quaternary, and higher mixtures of unreacted $C_{60}$ and $C_{70}$, derivatized $C_{60}$ and $C_{70}$, and higher order adduct derivatives, comprising bis, tris, ter, and higher. The ratios of adducts produced during synthesis can be modified by varying the amount of the BBMT precursor. Removal of multi-adduct compounds may be accomplished on a silica gel column.

Additional Embodiments

The present invention is described below by reference to certain embodiments. This description is not meant to limit the scope of the invention, but to convey the essence of the invention. Additional embodiments may be readily envisioned by one of ordinary skill in the art, and such embodiments fall within the scope of the invention.

One aspect of the invention relates to the use as a semiconductor a fullerene derivative mixture which has a composition resulting from the use of mixed fullerenes to perform the synthesis of the fullerene derivatives, wherein the mixed fullerenes composition is as produced from a fullerene synthesis process such as but not limited to arc-vaporization, laser ablation, or combustion synthesis.

In certain embodiments, the present invention relates to aforementioned invention, wherein one or more fullerene species has been removed from the as-produced fullerene mixture described above.

In certain embodiments, the present invention relates to aforementioned invention, wherein fullerenes higher in molecular weight than $C_{70}$ have been removed from the as-produced fullerene mixture.

In certain embodiments, the present invention relates to aforementioned invention, wherein one or more fullerene derivatives is removed from the resulting fullerene derivative mixture made from the as-produced fullerene mixture.

In certain embodiments, the present invention relates to aforementioned invention, wherein the fullerene derivatives of fullerenes higher in molecular weight than $C_{70}$ have been removed.

Another aspect of the invention relates to the use as a semiconductor compound of a mixture comprising $C_{60}$ methanofullerene derivatives and $C_{70}$ methanofullerene derivatives where the molar percentage of each is in the range of 1% to 99%.

In certain embodiments, the present invention relates to aforementioned invention, wherein the fullerene derivatives are Phenyl-$C_{61}$-Butyric-Acid-Methyl-Ester or Phenyl-$C_{71}$-Butyric-Acid-Methyl-Ester Methanofullerenes, Thiophenyl-$C_{61}$-Butyric-Acid-Methyl-Ester or Thiophenyl-$C_{71}$-Butyric-Acid-Methyl-Ester methanofullerenes, and Prato-$C_{61}$- or Prato-$C_{71}$-fullerenes.

Another aspect of the invention relates to a photodiode device wherein the n-type semiconductor comprised is as described above.

Another aspect of the invention relates to a transistor device wherein the n-type semiconductor comprised is as described above.

Another aspect of the invention relates to an ambipolar transistor device wherein the ambipolar semiconductor comprised is as described above.

In certain embodiments, the present invention relates to aforementioned invention, wherein the composition of the $C_{60}$ fullerene derivative is in the range of 20% to 90% and the composition of the $C_{70}$ fullerene derivative is in the range of 9% to 79%.

In certain embodiments, the present invention relates to aforementioned invention, wherein the molar percentage of the $C_{60}$ fullerene derivative is in the range 40% to 80%, and the molar percentage of the $C_{70}$ fullerene derivative is in the range of 19% to 59%.

In certain embodiments, the present invention relates to aforementioned invention, wherein the molar percentage of underivatized $C_{60}$ is in the range of 1% to 49% and the combined molar percentage of $C_{60}$ and $C_{70}$ derivatives is in the range of 50% to 98%.

In certain embodiments, the present invention relates to aforementioned invention, wherein the derivatized $C_{60}$ and/or $C_{70}$ comprises mono-, bis-, and tris-adducts.

The use as a semiconductor compound of a mixture of $C_{84}$ fullerene derivatives in a blend with $C_{70}$, $C_{76}$, and $C_{78}$ derivatives either in conjunction or alone.

Another aspect of the invention relates to a transistor device wherein the n-type semiconductor is as described above.

DEFINITIONS

For convenience, certain terms employed in the specification, examples, and appended claims are collected here.

The term "addend moieties" refers here to the chemical addend which is bonded to the fullerene core through the synthesis on a fullerene mixture. For example, the phenyl-butyric-acid-methyl-ester moiety of PCBM is referred to here as an addend moiety.

The term "fullerene chemical derivatives," e.g., C60 chemical derivatives, C70 chemical derivatives, C84 chemical derivatives refer to the addition of chemically bonded addends to the fullerene core, which can be accomplished by many chemical synthesis techniques, which are well known in the art and termed "fullerene chemistry." Common examples are methanofullerene chemical derivatives (e.g., PCBM), Prato chemical derivatives, Bingel chemical derivatives, diazoline chemical derivatives, azafulleroid chemical derivatives, ketolactam chemical derivatives, and Diels Alder chemical derivatives. In the case of fullerenes C70 and higher in molecular weight, the fullerene chemical derivative may be present in one or more isomeric forms, such as is known in the art for [70]PCBM and [84]PCBM. In the case of bis and higher adducts, even more isomeric forms may be present.

The term "class," e.g., " . . . same class of derivatives . . . " refers to a set or group of chemical derivatives that share a common addend moiety. Common examples are the PCBM class of chemical derivatives, the ThCBM class of chemical derivatives, and the Prato class of chemical derivatives.

The term "fullerene mixture" refers to a mixture of fullerenes, e.g., C60, C70, C76, C78, C84, and traces of other fullerenes, such as formed by fullerene production processes known in the art. Common fullerene production processes are arc-synthesis, combustion, laser ablation, among others. All fullerene processes produce a distribution of fullerenes of various molecular weight. For example, arc-synthesis typically produces ca. 60%-90% C60, 10%-30% C70, and 1%-10% fullerenes higher in molecular weight than C70. Combustion processes produce somewhat higher proportions of fullerenes C70 and higher, and can even produce more C70 than C60 proportionately. In this context, various other impurities may be present in the fullerene mixture used in the synthesis described herein, such as oxides and dimers of fullerenes, and amorphous carbon, in various amounts.

The term "synthesis of a fullerene mixture" refers to carrying out a typical fullerene chemical synthesis as is well known in the art, such as diazoalkane addition, Prato reaction, Bingel, etc. such as commonly carried out on pure grades of e.g., C60, C70, C84, etc., using a fullerene mixture as a reactant in place of the pure grade of fullerene.

The term "multi-adduct" chemical derivatives refer to bis, tris, ter-, etc. adducts, where more than one chemical addend of the same type is bonded to the fullerene core. For example, as a by-product of methanofullerene synthesis using diazoalkane addition, such as the synthesis of PCBM, roughly 10%-20% yield (based on fullerene reactant) of bis-adduct will be formed, and 1-2% yield of tris-adduct, and traces of tris and higher adducts, due to the multitude and symmetry of reactive sites on the fullerene (C60 and C70) core. One can also increase or decrease the yield of multi-adducts by varying equivalents of reactant, for example increasing the concentration of reactant being added to the fullerene core.

The term "fullerenes higher in molecular weight than C70" refers to fullerenes with a greater number of carbons than 70, such as C76, C78, and C84, but. "Chemical Derivatives" of these are for example in the case of PCBM synthesis, [76]PCBM, [78]PCBM, and [84]PCBM, which are formed as a by-product of reaction if C76, C78, and C84 are present in the reactant fullerene mixture, which they typically are. The fullerenes higher than C70 will react during the addend formation and remain present to some degree in the initial reaction product. For arc-synthesized fullerenes, the percentage of fullerenes higher in molecular weight than C70 are typically 3-6% of total fullerene content, and are primarily C76, C78, and C84. Combustion produced fullerenes typically have higher percentages of these fullerenes, and can be 15%-20% or higher of total fullerene content, and include other fullerenes higher in molecular weight than C70, such as C82, C90, etc.

The term "oxides" of fullerenes and fullerene derivatives refers to the epoxides and other products, which can be single or multi-addend products, of photochemical degradation of fullerenes and fullerene derivatives which are well known in the art to form when fullerenes are exposed to air and light. Minimization of the formation of these compounds is accomplished typically by reaction under inert atmosphere (e.g., N2), though typically some amount are present in any fullerene synthesis product. "Fullerene derivative oxides" refer to for example PCBM reacting with light and air to form a product consisting of one or more epoxides bonded to the fullerene core in addition to the phenyl-butyric-acid-methyl ester addend, or to the addition of the phenyl-butyric-acid-methyl ester addend to a fullerene already containing an epoxide addend. The fullerene oxides may be present in the fullerene reactant, and thus lead to derivative oxides, or the oxides may form as a result of the fullerene synthesis.

The term "dimer" refer to the formation of fullerene-fullerene bonds leading to, in the case of fullerenes, C60-C60, C70-70, and the like, which are spontaneously formed during the fullerene production process or later. These compounds are typically seen in some amount in fullerene sources. Dimers of fullerene derivatives can also form by addition of the addend to a dimer of the fullerene reactant, or spontaneously as a by-product of the fullerene chemical derivative synthesis. Dimers can also be oxidized.

The term "solution processing" refers to the technique well known in the art of dissolving or suspending an n-type or p-type semiconductor or combination of these and applying this solution to a surface, where the deposited solution is then allowed to dry. Techniques commonly used for this are spin-coating, doctor-blading, printing techniques (such as ink jet printing, roll-to-roll printing, silkscreening) or the like.

The term "heteroatom" is art-recognized and refers to an atom of any element other than carbon or hydrogen. Illustrative heteroatoms include boron, nitrogen, oxygen, phosphorus, sulfur and selenium.

The term "alkyl" is art-recognized, and includes saturated aliphatic groups, including straight-chain alkyl groups, branched-chain alkyl groups, cycloalkyl (alicyclic) groups, alkyl substituted cycloalkyl groups, and cycloalkyl substituted alkyl groups. In certain embodiments, a straight chain or branched chain alkyl has about 30 or fewer carbon atoms in its backbone (e.g., $C_1$-$C_{30}$ for straight chain, $C_3$-$C_{30}$ for branched chain), and alternatively, about 20 or fewer. Likewise, cycloalkyls have from about 3 to about 10 carbon atoms in their ring structure, and alternatively about 5, 6 or 7 carbons in the ring structure.

Unless the number of carbons is otherwise specified, "lower alkyl" refers to an alkyl group, as defined above, but having from one to about ten carbons, alternatively from one to about six carbon atoms in its backbone structure. Likewise, "lower alkenyl" and "lower alkynyl" have similar chain lengths.

The term "aralkyl" is art-recognized and refers to an alkyl group substituted with an aryl group (e.g., an aromatic or heteroaromatic group).

The terms "alkenyl" and "alkynyl" are art-recognized and refer to unsaturated aliphatic groups analogous in length and possible substitution to the alkyls described above, but that contain at least one double or triple bond respectively.

The term "aryl" is art-recognized and refers to 5-, 6- and 7-membered single-ring aromatic groups that may include from zero to four heteroatoms, for example, benzene, naphthalene, anthracene, pyrene, pyrrole, furan, thiophene, imidazole, oxazole, thiazole, triazole, pyrazole, pyridine, pyrazine, pyridazine and pyrimidine, and the like. Those aryl groups having heteroatoms in the ring structure may also be referred to as "aryl heterocycles" or "heteroaromatics." The aromatic ring may be substituted at one or more ring positions with such substituents as described above, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —CF$_3$, —CN, or the like. The term "aryl" also includes polycyclic ring systems having two or more cyclic rings in which two or more carbons are common to two adjoining rings (the rings are "fused rings") wherein at least one of the rings is aromatic, e.g., the other cyclic rings may be cycloalkyls, cycloalkenyls, cycloalkynyls, aryls and/or heterocyclyls.

The term "adduct" is art-recognized and refers to a new molecular species (AB) formed by direct combination of two separate molecular entities (A+B). The term "bis-adduct" refers to molecular species AB$_2$. The term "tris-adduct" refers to molecular species AB$_3$. The terms "adduct" and "derivative" are used interchangeably herein.

The terms ortho, meta and para are art-recognized and refer to 1,2-, 1,3- and 1,4-disubstituted benzenes, respectively. For example, the names 1,2-dimethylbenzene and ortho-dimethylbenzene are synonymous.

The terms "heterocyclyl", "heteroaryl", or "heterocyclic group" are art-recognized and refer to 3- to about 10-membered ring structures, alternatively 3- to about 7-membered rings, whose ring structures include one to four heteroatoms. Heterocycles may also be polycycles. Heterocyclyl groups include, for example, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, lactams such as azetidinones and pyrrolidinones, sultams, sultones, and the like. The heterocyclic ring may be substituted at one or more positions with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF$_3$, —CN, or the like.

The terms "polycyclyl" or "polycyclic group" are art-recognized and refer to two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle may be substituted with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF$_3$, —CN, or the like.

The term "carbocycle" is art-recognized and refers to an aromatic or non-aromatic ring in which each atom of the ring is carbon.

The term "nitro" is art-recognized and refers to —NO$_2$; the term "halogen" is art-recognized and refers to —F, —Cl, —Br or —I; the term "sulfhydryl" is art-recognized and refers to —SH; the term "hydroxyl" means —OH; and the term "sulfonyl" is art-recognized and refers to —SO$_2^-$. "Halide" designates the corresponding anion of the halogens, and "pseudohalide" has the definition set forth on 560 of "Advanced Inorganic Chemistry" by Cotton and Wilkinson.

The terms "amine" and "amino" are art-recognized and refer to both unsubstituted and substituted amines, e.g., a moiety that may be represented by the general formulas:

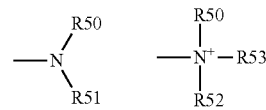

wherein R50, R51 and R52 each independently represent a hydrogen, an alkyl, an alkenyl, —(CH$_2$)$_m$—R61, or R50 and R51, taken together with the N atom to which they are attached complete a heterocycle having from 4 to 8 atoms in the ring structure; R61 represents an aryl, a cycloalkyl, a cycloalkenyl, a heterocycle or a polycycle; and m is zero or an integer in the range of 1 to 8. In certain embodiments, only one of R50 or R51 may be a carbonyl, e.g., R50, R51 and the nitrogen together do not form an imide. In other embodiments, R50 and R51 (and optionally R52) each independently represent a hydrogen, an alkyl, an alkenyl, or —(CH$_2$)$_m$—R61. Thus, the term "alkylamine" includes an amine group, as defined above, having a substituted or unsubstituted alkyl attached thereto, i.e., at least one of R50 and R51 is an alkyl group.

The term "acylamino" is art-recognized and refers to a moiety that may be represented by the general formula:

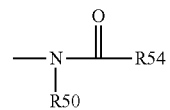

wherein R50 is as defined above, and R54 represents a hydrogen, an alkyl, an alkenyl or —(CH$_2$)$_m$—R61, where m and R61 are as defined above.

The term "amido" is art recognized as an amino-substituted carbonyl and includes a moiety that may be represented by the general formula:

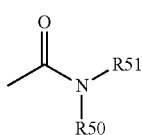

wherein R50 and R51 are as defined above. Certain embodiments of the amide in the present invention will not include imides which may be unstable.

The term "alkylthio" refers to an alkyl group, as defined above, having a sulfur radical attached thereto. In certain embodiments, the "alkylthio" moiety is represented by one of —S-alkyl, —S-alkenyl, —S-alkynyl, and —S—$(CH_2)_m$—R61, wherein m and R61 are defined above. Representative alkylthio groups include methylthio, ethyl thio, and the like.

The term "carboxyl" is art recognized and includes such moieties as may be represented by the general formulas:

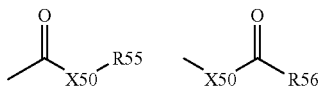

wherein X50 is a bond or represents an oxygen or a sulfur, and R55 and R56 represents a hydrogen, an alkyl, an alkenyl, —$(CH_2)_m$—R61 or a pharmaceutically acceptable salt, R56 represents a hydrogen, an alkyl, an alkenyl or —$(CH_2)_m$—R61, where m and R61 are defined above. Where X50 is an oxygen and R55 or R56 is not hydrogen, the formula represents an "ester". Where X50 is an oxygen, and R55 is as defined above, the moiety is referred to herein as a carboxyl group, and particularly when R55 is a hydrogen, the formula represents a "carboxylic acid". Where X50 is an oxygen, and R56 is hydrogen, the formula represents a "formate". In general, where the oxygen atom of the above formula is replaced by sulfur, the formula represents a "thiolcarbonyl" group. Where X50 is a sulfur and R55 or R56 is not hydrogen, the formula represents a "thiolester." Where X50 is a sulfur and R55 is hydrogen, the formula represents a "thiolcarboxylic acid." Where X50 is a sulfur and R56 is hydrogen, the formula represents a "thiolformate." On the other hand, where X50 is a bond, and R55 is not hydrogen, the above formula represents a "ketone" group. Where X50 is a bond, and R55 is hydrogen, the above formula represents an "aldehyde" group.

The terms "alkoxyl" or "alkoxy" are art-recognized and refer to an alkyl group, as defined above, having an oxygen radical attached thereto. Representative alkoxyl groups include methoxy, ethoxy, propyloxy, tert-butoxy and the like. An "ether" is two hydrocarbons covalently linked by an oxygen. Accordingly, the substituent of an alkyl that renders that alkyl an ether is or resembles an alkoxyl, such as may be represented by one of —O-alkyl, —O-alkenyl, —O-alkenyl, —O—$(CH_2)_m$—R61, where m and R61 are described above.

The term "sulfonate" is art recognized and refers to a moiety that may be represented by the general formula:

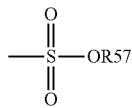

in which R57 is an electron pair, hydrogen, alkyl, cycloalkyl, or aryl.

The term "sulfate" is art recognized and includes a moiety that may be represented by the general formula:

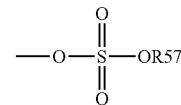

in which R57 is as defined above.

The term "sulfonamido" is art recognized and includes a moiety that may be represented by the general formula:

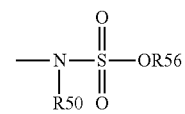

in which R50 and R56 are as defined above.

The term "sulfamoyl" is art-recognized and refers to a moiety that may be represented by the general formula:

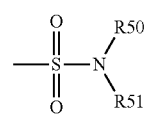

in which R50 and R51 are as defined above.

The term "sulfonyl" is art-recognized and refers to a moiety that may be represented by the general formula:

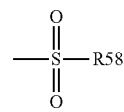

in which R58 is one of the following: hydrogen, alkyl, alkenyl, alkynyl, cycloalkyl, heterocyclyl, aryl or heteroaryl.

The term "sulfoxido" is art-recognized and refers to a moiety that may be represented by the general formula:

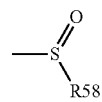

in which R58 is defined above.

The term "phosphoryl" is art-recognized and may in general be represented by the formula:

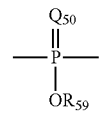

wherein Q50 represents S or O, and R59 represents hydrogen, a lower alkyl or an aryl. When used to substitute, e.g., an alkyl, the phosphoryl group of the phosphorylalkyl may be represented by the general formulas:

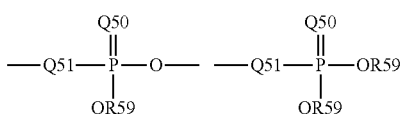

wherein Q50 and R59, each independently, are defined above, and Q51 represents O, S or N. When Q50 is S, the phosphoryl moiety is a "phosphorothioate".

The term "phosphoramidite" is art-recognized and may be represented in the general formulas:

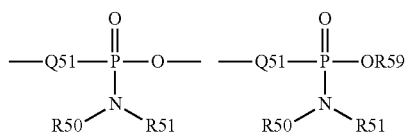

wherein Q51, R50, R51 and R59 are as defined above.

The term "phosphonamidite" is art-recognized and may be represented in the general formulas:

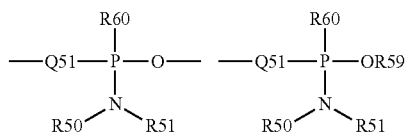

wherein Q51, R50, R51 and R59 are as defined above, and R60 represents a lower alkyl or an aryl.

Analogous substitutions may be made to alkenyl and alkynyl groups to produce, for example, aminoalkenyls, aminoalkynyls, amidoalkenyls, amidoalkynyls, iminoalkenyls, iminoalkynyls, thioalkenyls, thioalkynyls, carbonyl-substituted alkenyls or alkynyls.

The definition of each expression, e.g. alkyl, m, n, and the like, when it occurs more than once in any structure, is intended to be independent of its definition elsewhere in the same structure.

The term "selenoalkyl" is art-recognized and refers to an alkyl group having a substituted seleno group attached thereto. Exemplary "selenoethers" which may be substituted on the alkyl are selected from one of —Se-alkyl, —Se-alkenyl, —Se-alkynyl, and —Se—$(CH_2)_m$—R61, m and R61 being defined above.

The terms triflyl, tosyl, mesyl, and nonaflyl are art-recognized and refer to trifluoromethanesulfonyl, p-toluenesulfonyl, methanesulfonyl, and nonafluorobutanesulfonyl groups, respectively. The terms triflate, tosylate, mesylate, and nonaflate are art-recognized and refer to trifluoromethanesulfonate ester, p-toluenesulfonate ester, methanesulfonate ester, and nonafluorobutanesulfonate ester functional groups and molecules that contain said groups, respectively.

The abbreviations Me, Et, Ph, Tf, Nf, Ts, and Ms represent methyl, ethyl, phenyl, trifluoromethanesulfonyl, nonafluorobutanesulfonyl, p-toluenesulfonyl and methanesulfonyl, respectively. A more comprehensive list of the abbreviations utilized by organic chemists of ordinary skill in the art appears in the first issue of each volume of the *Journal of Organic Chemistry*; this list is typically presented in a table entitled *Standard List of Abbreviations*.

Certain compounds contained in compositions of the present invention may exist in particular geometric or stereoisomeric forms. In addition, polymers of the present invention may also be optically active. The present invention contemplates all such compounds, including cis- and trans-isomers, R- and S-enantiomers, diastereomers, (D)-isomers, (L)-isomers, the racemic mixtures thereof, and other mixtures thereof, as falling within the scope of the invention. Additional asymmetric carbon atoms may be present in a substituent such as an alkyl group. All such isomers, as well as mixtures thereof, are intended to be included in this invention.

If, for instance, a particular enantiomer of compound of the present invention is desired, it may be prepared by asymmetric synthesis, or by derivation with a chiral auxiliary, where the resulting diastereomeric mixture is separated and the auxiliary group cleaved to provide the pure desired enantiomers. Alternatively, where the molecule contains a basic functional group, such as amino, or an acidic functional group, such as carboxyl, diastereomeric salts are formed with an appropriate optically-active acid or base, followed by resolution of the diastereomers thus formed by fractional crystallization or chromatographic means well known in the art, and subsequent recovery of the pure enantiomers.

It will be understood that "substitution" or "substituted with" includes the implicit proviso that such substitution is in accordance with permitted valence of the substituted atom and the substituent, and that the substitution results in a stable compound, e.g., which does not spontaneously undergo transformation such as by rearrangement, cyclization, elimination, or other reaction.

The term "substituted" is also contemplated to include all permissible substituents of organic compounds. In a broad aspect, the permissible substituents include acyclic and cyclic, branched and unbranched, carbocyclic and heterocyclic, aromatic and nonaromatic substituents of organic compounds. Illustrative substituents include, for example, those described herein above. The permissible substituents may be one or more and the same or different for appropriate organic compounds. For purposes of this invention, the heteroatoms such as nitrogen may have hydrogen substituents and/or any permissible substituents of organic compounds described herein which satisfy the valences of the heteroatoms. This invention is not intended to be limited in any manner by the permissible substituents of organic compounds.

The phrase "protecting group" as used herein means temporary substituents which protect a potentially reactive functional group from undesired chemical transformations. Examples of such protecting groups include esters of carboxylic acids, silyl ethers of alcohols, and acetals and ketals of aldehydes and ketones, respectively. The field of protecting group chemistry has been reviewed (Greene, T. W.; Wuts, P.G.M. *Protective Groups in Organic Synthesis*, $2^{nd}$ ed.; Wiley: New York, 1991). Protected forms of the inventive compounds are included within the scope of this invention.

For purposes of this invention, the chemical elements are identified in accordance with the Periodic Table of the Elements, CAS version, *Handbook of Chemistry and Physics*, 67th Ed., 1986-87, inside cover.

Compositions of the Invention

Methanofullerenes

One aspect of the present invention relates to a composition comprising a compound of formula I and a compound of formula II, wherein formula I is represented by:

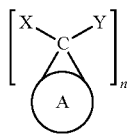

$$\text{I}$$

wherein n is 1 or 2;

A is a $C_{60}$ fullerene bonded to —C(X)(Y)— via a methano-bridge;

X is optionally substituted aryl or aralkyl; and

Y is an optionally substituted alkyl, optionally substituted cycloalkyl, optionally substituted heteroalkyl, optionally substituted heterocycloalkyl, optionally substituted alkenyl, or optionally substituted aralkyl; and formula II is represented by:

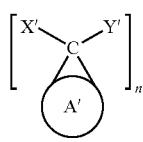

$$\text{II}$$

wherein n is 1 or 2;

A' is a $C_{70}$ fullerene bonded to —C(X)(Y)— via a methano-bridge;

X' is optionally substituted aryl or optionally substituted aralkyl; and

Y' is optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein X is aryl or aralkyl, each of which is optionally substituted with one or more of halogen, hydroxyl, alkyl, alkoxyl, alkenyl, —N$(R^1)_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is aryl or aralkyl, each of which is optionally substituted with one or more of halogen or alkyl.

In certain embodiments, the present invention relates to the aforementioned composition, wherein X is optionally substituted aryl.

In certain embodiments, the present invention relates to the aforementioned composition, wherein X is optionally substituted phenyl or thiophenyl.

In certain embodiments, the present invention relates to the aforementioned composition, wherein X is optionally substituted thiophenyl.

In certain embodiments, the present invention relates to the aforementioned composition, wherein X is phenyl optionally substituted with one or more of halogen, hydroxyl, alkyl, alkoxyl, alkenyl, —N$(R^1)_2$, —C(O)$R^1$, —OC(O)$R_1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is phenyl optionally substituted with one or more of halogen or alkyl.

In certain embodiments, the present invention relates to the aforementioned composition, wherein X is phenyl.

In certain embodiments, the present invention relates to the aforementioned composition, wherein Y is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N$(R^1)_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is alkyl, cycloalkyl, or heteroalkyl, each of which is optionally substituted with one or more of halogen, hydroxyl, alkyl, alkoxyl, alkenyl, —N$(R^1)_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is optionally substituted alkyl.

In certain embodiments, the present invention relates to the aforementioned composition, wherein Y is alkyl optionally substituted with one or more of —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is C1-C6 alkyl substituted with one or more of —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —CO$_2R^1$; wherein $R^1$ is alkyl.

In certain embodiments, the present invention relates to the aforementioned composition, wherein Y is —(CH$_2$)$_n$—CO$_2R^1$, n is an integer in the range of 1-6, and $R^1$ is alkyl.

In certain embodiments, the present invention relates to the aforementioned composition, wherein Y is —(CH$_2$)$_3$—CO$_2$CH$_3$.

In certain embodiments, the present invention relates to the aforementioned composition, wherein X is optionally substituted aryl, and Y is optionally substituted alkyl.

In certain embodiments, the present invention relates to the aforementioned composition, wherein X is optionally substituted phenyl or thiophenyl, and Y is C1-C6 alkyl substituted with a —CO$_2R^1$; wherein $R^1$ is alkyl.

In certain embodiments, the present invention relates to the aforementioned composition, wherein X is optionally substituted thiophenyl, and Y is C1-C6 alkyl substituted with a —CO$_2R^1$; wherein $R^1$ is alkyl.

In certain embodiments, the present invention relates to the aforementioned composition, wherein X is phenyl and Y is —(CH$_2$)$_3$—CO$_2$CH$_3$.

In certain embodiments, the present invention relates to the aforementioned composition, wherein X' is aryl or aralkyl, each of which is optionally substituted with one or more of halogen, hydroxyl, alkyl, alkoxyl, alkenyl, —N$(R^1)_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is aryl or aralkyl, each of which is optionally substituted with one or more of halogen or alkyl.

In certain embodiments, the present invention relates to the aforementioned composition, wherein X' is optionally substituted aryl.

In certain embodiments, the present invention relates to the aforementioned composition, wherein X' is optionally substituted phenyl or thiophenyl.

In certain embodiments, the present invention relates to the aforementioned composition, wherein X' is optionally substituted thiophenyl.

In certain embodiments, the present invention relates to the aforementioned composition, wherein X' is phenyl optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein X' is phenyl optionally substituted with one or more of halogen or alkyl.

In certain embodiments, the present invention relates to the aforementioned composition, wherein X' is phenyl.

In certain embodiments, the present invention relates to the aforementioned composition, wherein Y' is alkyl, cycloalkyl, heteroalkyl, heterocycloalkyl, alkenyl, or aralkyl, each of which is optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is alkyl, cycloalkyl, or heteroalkyl, each of which is optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is optionally substituted alkyl.

In certain embodiments, the present invention relates to the aforementioned composition, wherein Y' is alkyl optionally substituted with one or more of $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is C1-C6 alkyl substituted with one or more of $-C(O)R^1$, $-OC(O)R^1$, or $-CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a $-C(O)R^1$, $-OC(O)R^1$, or $-CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a $-CO_2R^1$; wherein $R^1$ is alkyl.

In certain embodiments, the present invention relates to the aforementioned composition, wherein Y' is $-(CH_2)_n-CO_2R^1$, n is an integer in the range of 1-6, and $R^1$ is alkyl.

In certain embodiments, the present invention relates to the aforementioned composition, wherein Y' is $-(CH_2)_3-CO_2CH_3$.

In certain embodiments, the present invention relates to the aforementioned composition, wherein X' is optionally substituted aryl, and Y' is optionally substituted alkyl.

In certain embodiments, the present invention relates to the aforementioned composition, wherein X' is optionally substituted phenyl or thiophenyl, and Y' is C1-C6 alkyl substituted with a $-CO_2R^1$; wherein $R^1$ is alkyl.

In certain embodiments, the present invention relates to the aforementioned composition, wherein X' is optionally substituted thiophenyl, and Y' is C1-C6 alkyl substituted with a $-CO_2R^1$; wherein $R^1$ is alkyl.

In certain embodiments, the present invention relates to the aforementioned composition, wherein X' is phenyl and Y' is $-(CH_2)_3-CO_2CH_3$.

In certain embodiments, the present invention relates to the aforementioned composition, wherein X and X' are optionally substituted aryl, and Y and Y' are optionally substituted alkyl.

In certain embodiments, the present invention relates to the aforementioned composition, wherein X and X' are optionally substituted phenyl or thiophenyl, and Y and Y' are C1-C6 alkyl substituted with a $-CO_2R^1$; wherein $R^1$ is alkyl.

In certain embodiments, the present invention relates to the aforementioned composition, wherein X and X' are optionally substituted thiophenyl, and Y and Y' are C1-C6 alkyl substituted with a $-CO_2R^1$; wherein $R^1$ is alkyl.

In certain embodiments, the present invention relates to the aforementioned composition, wherein X and X' are phenyl, and Y and Y' are $-(CH_2)_3-CO_2CH_3$.

In certain embodiments, the present invention relates to the aforementioned composition, wherein the ratio of the weight percentage of said compound of Formula I to said compound of Formula II is in the range of about 3:1 to about 1:3.

In certain embodiments, the present invention relates to the aforementioned composition, wherein the ratio of the weight percentage of said compound of Formula I to said compound of Formula II is in the range of about 3:1 to about 1:1.

In certain embodiments, the present invention relates to the aforementioned composition, wherein the ratio of the weight percentage of said compound of Formula I to said compound of Formula II is about 2:1.

In certain embodiments, the present invention relates to the aforementioned composition, wherein said compound of Formula I comprises about 50 wt % to about 75 wt % of said composition, and said compound of Formula II comprises about 25 wt % to about 50 wt % of said composition such that the sum of the weight percent of said compound of Formula I and said compound of Formula II equals greater than about 99 wt % of said composition.

In certain embodiments, the present invention relates to the aforementioned composition, wherein said compound of Formula I comprises about 60 wt % to about 70 wt % of said composition, and said compound of Formula II comprises about 30 wt % to about 40 wt % of said composition such that the sum of the weight percent of said compound of Formula I and said compound of Formula II equals greater than about 99 wt % of said composition.

Another aspect of the present invention relates to a composition consisting essentially of a compound of formula I and a compound of formula II, wherein formula I is represented by:

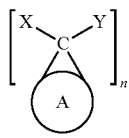

wherein n is 1 or 2;

A is a $C_{60}$ fullerene bonded to —C(X)(Y)— via a methano-bridge;

X is optionally substituted aryl or aralkyl; and

Y is optionally substituted alkyl, optionally substituted cycloalkyl, optionally substituted heteroalkyl, optionally substituted heterocycloalkyl, optionally substituted alkenyl, or optionally substituted aralkyl; and formula II is represented by:

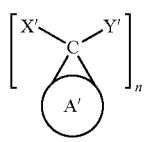

wherein n is 1 or 2;

A' is a $C_{70}$ fullerene bonded to —C(X)(Y)— via a methano-bridge;

X' is optionally substituted aryl or optionally substituted aralkyl; and

Y' is optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein X is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is aryl or aralkyl, each of which is optionally substituted with one or more of halogen or alkyl.

In certain embodiments, the present invention relates to the aforementioned composition, wherein X is optionally substituted aryl.

In certain embodiments, the present invention relates to the aforementioned composition, wherein X is optionally substituted phenyl or thiophenyl.

In certain embodiments, the present invention relates to the aforementioned composition, wherein X is optionally substituted thiophenyl.

In certain embodiments, the present invention relates to the aforementioned composition, wherein X is phenyl optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is phenyl optionally substituted with one or more of halogen or alkyl.

In certain embodiments, the present invention relates to the aforementioned composition, wherein X is phenyl.

In certain embodiments, the present invention relates to the aforementioned composition, wherein Y is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is alkyl, cycloalkyl, or heteroalkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is optionally substituted alkyl.

In certain embodiments, the present invention relates to the aforementioned composition, wherein Y is alkyl optionally substituted with one or more of —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is C1-C6 alkyl substituted with one or more of —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —CO$_2R^1$; wherein $R^1$ is alkyl.

In certain embodiments, the present invention relates to the aforementioned composition, wherein Y is —(CH$_2$)$_n$—CO$_2R^1$, n is an integer in the range of 1-6, and $R^1$ is alkyl.

In certain embodiments, the present invention relates to the aforementioned composition, wherein Y is —(CH$_2$)$_3$—CO$_2$CH$_3$.

In certain embodiments, the present invention relates to the aforementioned composition, wherein X is optionally substituted aryl, and Y is optionally substituted alkyl.

In certain embodiments, the present invention relates to the aforementioned composition, wherein X is optionally substituted phenyl or thiophenyl, and Y is C1-C6 alkyl substituted with a —CO$_2R^1$; wherein $R^1$ is alkyl.

In certain embodiments, the present invention relates to the aforementioned composition, wherein X is optionally substituted thiophenyl, and Y is C1-C6 alkyl substituted with a —CO$_2R^1$; wherein $R^1$ is alkyl.

In certain embodiments, the present invention relates to the aforementioned composition, wherein X is phenyl and Y is —(CH$_2$)$_3$—CO$_2$CH$_3$.

In certain embodiments, the present invention relates to the aforementioned composition, wherein X' is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is aryl or aralkyl, each of which is optionally substituted with one or more of halogen or alkyl.

In certain embodiments, the present invention relates to the aforementioned composition, wherein X' is optionally substituted aryl.

In certain embodiments, the present invention relates to the aforementioned composition, wherein X' is optionally substituted phenyl or thiophenyl.

In certain embodiments, the present invention relates to the aforementioned composition, wherein X' is optionally substituted thiophenyl.

In certain embodiments, the present invention relates to the aforementioned composition, wherein X' is phenyl optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein X' is phenyl optionally substituted with one or more of halogen or alkyl.

In certain embodiments, the present invention relates to the aforementioned composition, wherein X' is phenyl.

In certain embodiments, the present invention relates to the aforementioned composition, wherein Y' is alkyl, cycloalkyl, heteroalkyl, heterocycloalkyl, alkenyl, or aralkyl, each of which is optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is alkyl, cycloalkyl, or heteroalkyl, each of which is optionally substituted with one or more of halogen, hydroxyl, alkyl, alkoxyl, alkenyl, $-N(R^1)_2$, $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is optionally substituted alkyl.

In certain embodiments, the present invention relates to the aforementioned composition, wherein Y' is alkyl optionally substituted with one or more of $-C(O)R^1$, $-OC(O)R^1$, $-CO_2R^1$, or $-N(R^1)C(O)R^1$; wherein $R^1$ represents independently for each occurrence H, alkyl, aryl, or aralkyl.

In certain embodiments, the present invention relates to the aforementioned composition, wherein Y' is C1-C6 alkyl substituted with one or more of $-C(O)R^1$, $-OC(O)R^1$, or $-CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a $-C(O)R^1$, $-OC(O)R^1$, or $-CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a $-CO_2R^1$; wherein $R^1$ is alkyl.

In certain embodiments, the present invention relates to the aforementioned composition, wherein Y' is $-(CH_2)_n-CO_2R^1$, n is an integer in the range of 1-6, and $R^1$ is alkyl.

In certain embodiments, the present invention relates to the aforementioned composition, wherein Y' is $-(CH_2)_3-CO_2CH_3$.

In certain embodiments, the present invention relates to the aforementioned composition, wherein X' is optionally substituted aryl, and Y' is optionally substituted alkyl.

In certain embodiments, the present invention relates to the aforementioned composition, wherein X' is optionally substituted phenyl or thiophenyl, and Y' is C1-C6 alkyl substituted with a $-CO_2R^1$; wherein $R^1$ is alkyl.

In certain embodiments, the present invention relates to the aforementioned composition, wherein X' is optionally substituted thiophenyl, and Y' is C1-C6 alkyl substituted with a $-CO_2R^1$; wherein $R^1$ is alkyl.

In certain embodiments, the present invention relates to the aforementioned composition, wherein X' is phenyl and Y' is $-(CH_2)_3-CO_2CH_3$.

In certain embodiments, the present invention relates to the aforementioned composition, wherein X and X' are optionally substituted aryl, and Y and Y' are optionally substituted alkyl.

In certain embodiments, the present invention relates to the aforementioned composition, wherein X and X' are optionally substituted phenyl or thiophenyl, and Y and Y' are C1-C6 alkyl substituted with a $-CO_2R^1$; wherein $R^1$ is alkyl.

In certain embodiments, the present invention relates to the aforementioned composition, wherein X and X' are optionally substituted thiophenyl, and Y and Y' are C1-C6 alkyl substituted with a $-CO_2R^1$; wherein $R^1$ is alkyl.

In certain embodiments, the present invention relates to the aforementioned composition, wherein X and X' are phenyl, and Y and Y' are $-(CH_2)_3-CO_2CH_3$.

In certain embodiments, the present invention relates to the aforementioned composition, wherein the ratio of the weight percentage of said compound of Formula I to said compound of Formula II is in the range of about 3:1 to about 1:3.

In certain embodiments, the present invention relates to the aforementioned composition, wherein the ratio of the weight percentage of said compound of Formula I to said compound of Formula II is in the range of about 3:1 to about 1:1.

In certain embodiments, the present invention relates to the aforementioned composition, wherein the ratio of the weight percentage of said compound of Formula I to said compound of Formula II is about 2:1.

In certain embodiments, the present invention relates to the aforementioned composition, wherein said compound of Formula I comprises about 50 wt % to about 75 wt % of said composition, and said compound of Formula II comprises about 25 wt % to about 50 wt % of said composition such that the sum of the weight percent of said compound of Formula I and said compound of Formula II equals greater than about 99 wt % of said composition.

In certain embodiments, the present invention relates to the aforementioned composition, wherein said compound of Formula I comprises about 60 wt % to about 70 wt % of said composition, and said compound of Formula II comprises about 30 wt % to about 40 wt % of said composition such that the sum of the weight percent of said compound of Formula I and said compound of Formula II equals greater than about 99 wt % of said composition.

Prato Derivatives

In certain embodiments, the invention refers to a composition comprising a compound of formula III, and a compound of formula IV, wherein formula III is represented by:

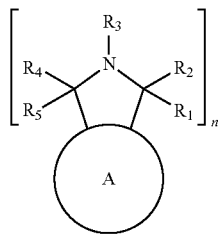

III wherein n is 1 or 2;

A is a $C_{60}$ fullerene bonded to —$C(R_4R_5)$—$N(R_3)$—$C(R_1R_2)$—;

$R_1$ is optionally substituted aryl or aralkyl; and $R_2$, $R_3$, $R_4$, and $R_5$ are optionally substituted alkyl, optionally substituted cycloalkyl, optionally substituted heteroalkyl, optionally substituted heterocycloalkyl, optionally substituted alkenyl, or optionally substituted aralkyl; and formula IV is represented by:

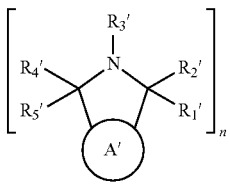

IV wherein n is 1 or 2;

A' is a $C_{70}$ fullerene bonded to —$C(R_4R_5)$—$N(R_3)$—$C(R_1R_2)$—;

$R_1'$ is optionally substituted aryl or optionally substituted aralkyl; and $R_2'$, $R_3'$, $R_4'$, and $R_5'$ are optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein $R_1$ is aryl or aralkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_1$ is aryl or aralkyl, each of which is optionally substituted with one or more of halogen or alkyl.

In certain embodiments, the present invention relates to the aforementioned composition, wherein $R_1$ is optionally substituted aryl.

In certain embodiments, the present invention relates to the aforementioned composition, wherein $R_1$ is optionally substituted phenyl or thiophenyl.

In certain embodiments, the present invention relates to the aforementioned composition, wherein $R_1$ is phenyl optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_1$ is phenyl optionally substituted with one or more of halogen or alkyl.

In certain embodiments, the present invention relates to the aforementioned composition, wherein $R_1$ is phenyl.

In certain embodiments, the present invention relates to the aforementioned composition, wherein $R_2$, $R_3$, $R_4$, and/or $R_5$ are alkyl, cycloalkyl, heteroalkyl, heterocycloalkyl, alkenyl, or aralkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R_3$, $R_4$, and/or $R_5$ are alkyl, cycloalkyl, or heteroalkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R_3$, $R_4$, and/or $R_5$ are optionally substituted alkyl.

In certain embodiments, the present invention relates to the aforementioned composition, wherein $R_2$, $R_3$, $R_4$, and/or $R_5$ are alkyl optionally substituted with one or more of —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R_3$, $R_4$, and/or $R_5$ are C1-C6 alkyl substituted with one or more of —$C(O)X^1$, —$OC(O)X^1$, or —$CO_2X^1$; wherein $X^1$ represents independently for each occurrence alkyl, aryl, or aralkyl.

In certain embodiments, the present invention relates to the aforementioned composition, wherein $R_2$, $R_3$, $R_4$, and/or $R_5$ are C1-C6 alkyl substituted with a —$C(O)X^1$, —$OC(O)X^1$, or —$CO_2X^1$; wherein $X^1$ represents independently for each occurrence alkyl, aryl, or aralkyl.

In certain embodiments, the present invention relates to the aforementioned composition, wherein $R_2$, $R_3$, $R_4$, and/or $R_5$ are C1-C6 alkyl substituted with a —$CO_2X^1$; wherein $X^1$ is alkyl.

In certain embodiments, the present invention relates to the aforementioned composition, wherein $R_2$, $R_3$, $R_4$, and/or $R_5$ are —$(CH_2)_n$—$CO_2X^1$, n is an integer in the range of 1-6, and $X^1$ is alkyl.

In certain embodiments, the present invention relates to the aforementioned composition, wherein $R_2$, $R_3$, $R_4$, and/or $R_5$ are —$(CH_2)_3$—$CO_2CH_3$.

In certain embodiments, the present invention relates to the aforementioned composition, wherein $R_1$ is optionally substituted aryl, and $R_2$, $R_3$, $R_4$, and/or $R_5$ are optionally substituted alkyl.

In certain embodiments, the present invention relates to the aforementioned composition, wherein $R_1$ is optionally substituted phenyl or thiophenyl, and $R_2$, $R_3$, $R_4$, and/or $R_5$ are C1-C6 alkyl substituted with a —$CO_2X^1$; wherein $X^1$ is alkyl.

In certain embodiments, the present invention relates to the aforementioned composition, wherein $R_1$ is phenyl and $R_2$, $R_3$, $R_4$, and/or $R_5$ are —$(CH_2)_3$—$CO_2CH_3$.

In certain embodiments, the present invention relates to the aforementioned composition, wherein $R_1'$ is aryl or aralkyl, each of which is optionally substituted with one or more of halogen, hydroxyl, alkyl, alkoxyl, alkenyl, —$N(X^1)_2$, —C(O)X$^1$, —OC(O)X$^1$, —CO$_2$X$^1$, or —N(X$^1$)C(O)X$^1$; wherein X$^1$ represents independently for each occurrence H, alkyl, aryl, or aralkyl.

In certain embodiments, the present invention relates to the aforementioned composition, wherein R$_1$' is aryl or aralkyl, each of which is optionally substituted with one or more of halogen or alkyl.

In certain embodiments, the present invention relates to the aforementioned composition, wherein R$_1$' is optionally substituted aryl.

In certain embodiments, the present invention relates to the aforementioned composition, wherein R$_1$' is optionally substituted phenyl or thiophenyl.

In certain embodiments, the present invention relates to the aforementioned composition, wherein R$_1$' is phenyl optionally substituted with one or more of halogen, hydroxyl, alkyl, alkoxyl, alkenyl, —N(X$^1$)$_2$, —C(O)X$^1$, —OC(O)X$^1$, —CO$_2$X$^1$, or —N(X$^1$)C(O)X$^1$; wherein X$^1$ represents independently for each occurrence H, alkyl, aryl, or aralkyl.

In certain embodiments, the present invention relates to the aforementioned composition, wherein R$_1$' is phenyl optionally substituted with one or more of halogen or alkyl.

In certain embodiments, the present invention relates to the aforementioned composition, wherein R$_1$' is phenyl.

In certain embodiments, the present invention relates to the aforementioned composition, wherein R$_2$', R$_3$', R$_4$', and/or R$_5$' are alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N(X$^1$)$_2$, —C(O)X$^1$, —OC(O)X$^1$, —CO$_2$X$^1$, or —N(X$^1$)C(O)X$^1$; wherein X$^1$ represents independently for each occurrence H, alkyl, aryl, or aralkyl.

In certain embodiments, the present invention relates to the aforementioned composition, wherein R$_2$', R$_3$', R$_4$', and/or R$_5$' are alkyl, cycloalkyl, or heteroalkyl, each of which is optionally substituted with one or more of halogen, hydroxyl, alkyl, alkoxyl, alkenyl, —N(X$^1$)$_2$, —C(O)X$^1$, —OC(O)X$^1$, —CO$_2$X$^1$, or —N(X$^1$)C(O)X$^1$; wherein X$^1$ represents independently for each occurrence H, alkyl, aryl, or aralkyl.

In certain embodiments, the present invention relates to the aforementioned composition, wherein R$_2$', R$_3$', R$_4$', and/or R$_5$' are optionally substituted alkyl.

In certain embodiments, the present invention relates to the aforementioned composition, wherein R$_2$', R$_3$', R$_4$', and/or R$_5$' are alkyl optionally substituted with one or more of —C(O)X$^1$, —OC(O)X$^1$, —CO$_2$X$^1$, or —N(X$^1$)C(O)X$^1$; wherein X$^1$ represents independently for each occurrence H, alkyl, aryl, or aralkyl.

In certain embodiments, the present invention relates to the aforementioned composition, wherein R$_2$', R$_3$', R$_4$', and/or R$_5$' are C1-C6 alkyl substituted with one or more of —C(O)X$^1$, —OC(O)X$^1$, or —CO$_2$X$^1$; wherein X$^1$ represents independently for each occurrence alkyl, aryl, or aralkyl.

In certain embodiments, the present invention relates to the aforementioned composition, wherein R$_2$', R$_3$', R$_4$', and/or R$_5$' are C1-C6 alkyl substituted with a —C(O)X$^1$, —OC(O)X$^1$, or —CO$_2$X$^1$; wherein X$^1$ represents independently for each occurrence alkyl, aryl, or aralkyl.

In certain embodiments, the present invention relates to the aforementioned composition, wherein R$_2$', R$_3$', R$_4$', and/or R$_5$' are C1-C6 alkyl substituted with a —CO$_2$X$^1$; wherein X$^1$ is alkyl.

In certain embodiments, the present invention relates to the aforementioned composition, wherein R$_2$', R$_3$', R$_4$', and/or R$_5$' are —(CH$_2$)$_n$—CO$_2$X$^1$, n is an integer in the range of 1-6, and X$^1$ is alkyl.

In certain embodiments, the present invention relates to the aforementioned composition, wherein R$_2$', R$_3$', R$_4$', and/or R$_5$' are —(CH$_2$)$_3$—CO$_2$CH$_3$.

In certain embodiments, the present invention relates to the aforementioned composition, wherein R$_1$' is optionally substituted aryl, and R$_2$', R$_3$', R$_4$', and/or R$_5$' are optionally substituted alkyl.

In certain embodiments, the present invention relates to the aforementioned composition, wherein R$_1$' is optionally substituted phenyl or thiophenyl, and R$_2$', R$_3$', R$_4$', and/or R$_5$' are C$_1$-C$_6$ alkyl substituted with a —CO$_2$X$^1$; wherein X$^1$ is alkyl.

In certain embodiments, the present invention relates to the aforementioned composition, wherein R$_1$' is phenyl; and R$_2$', R$_3$', R$_4$', and/or R$_5$' are —(CH$_2$)$_3$—CO$_2$CH$_3$.

In certain embodiments, the present invention relates to the aforementioned composition, wherein R$_1$ and R$_1$' are optionally substituted aryl, and R$_2$, R$_3$, R$_4$, and/or R$_5$ and R$_2$', R$_3$', R$_4$', and/or R$_5$' are optionally substituted alkyl.

In certain embodiments, the present invention relates to the aforementioned composition, wherein R$_1$ and R$_1$' are optionally substituted phenyl or thiophenyl, and R$_2$, R$_3$, R$_4$, and/or R$_5$ and R$_2$', R$_3$', R$_4$', and/or R$_5$' are C1-C6 alkyl substituted with a —CO$_2$X$^1$; wherein X$^1$ is alkyl.

In certain embodiments, the present invention relates to the aforementioned composition, wherein R$_1$ and R$_1$' are phenyl, and R$_2$, R$_3$, R$_4$, and/or R$_5$ and R$_2$', R$_3$', R$_4$', and/or R$_5$' are —(CH$_2$)$_3$—CO$_2$CH$_3$.

In certain embodiments, the present invention relates to the aforementioned composition, wherein the ratio of the weight percentage of said compound of Formula III to said compound of Formula IV is in the range of about 3:1 to about 1:3.

In certain embodiments, the present invention relates to the aforementioned composition, wherein the ratio of the weight percentage of said compound of Formula III to said compound of Formula IV is in the range of about 3:1 to about 1:1.

In certain embodiments, the present invention relates to the aforementioned composition, wherein the ratio of the weight percentage of said compound of Formula III to said compound of Formula IV is about 2:1.

In certain embodiments, the present invention relates to the aforementioned composition, wherein said compound of Formula III comprises about 5 wt % to about 95 wt % of said composition, and said compound of Formula IV comprises about 5 wt % to about 95 wt % of said composition such that the sum of the weight percent of said compound of Formula III and said compound of Formula IV equals greater than about 99 wt % of said composition.

In certain embodiments, the present invention relates to the aforementioned composition, wherein said compound of Formula III comprises about 5 wt % to about 95 wt % of said composition, and said compound of Formula IV comprises about 5 wt % to about 95 wt % of said composition such that the sum of the weight percent of said compound of Formula III and said compound of Formula IV equals greater than about 99 wt % of said composition.

In certain embodiments, the present invention relates to a composition, consisting essentially of a compound of formula III, and a compound of formula IV, wherein formula III is represented by:

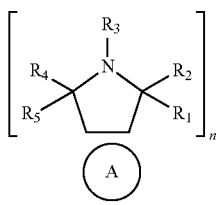

wherein
n is 1 for the mono-adduct and n is 2 for the bis-adduct;
A is a $C_{60}$ fullerene bonded to —$C(R_4R_5)$—$N(R_3)$—$C(R^1R_2)$—;
$R_1$ is optionally substituted aryl or aralkyl; and
$R_2$, $R_3$, $R_4$, and $R_5$ are optionally substituted alkyl, optionally substituted cycloalkyl, optionally substituted heteroalkyl, optionally substituted heterocycloalkyl, optionally substituted alkenyl, or optionally substituted aralkyl; and
formula IV is represented by:

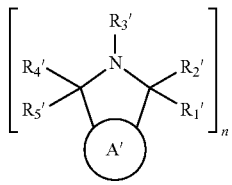

wherein
n is 1 for the mono-adduct and n is 2 for the bis-adduct;
A' is a $C_{70}$ fullerene bonded to —$C(R_4R_5)$—$N(R_3)$—$C(R_1R_2)$—;
$R_1'$ is optionally substituted aryl or optionally substituted aralkyl; and
$R_2'$, $R_3'$, $R_4'$, and $R_5'$ are optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein $R_1$ is aryl or aralkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_1$ is aryl or aralkyl, each of which is optionally substituted with one or more of halogen or alkyl.

In certain embodiments, the present invention relates to the aforementioned composition, wherein $R_1$ is optionally substituted aryl.

In certain embodiments, the present invention relates to the aforementioned composition, wherein $R_1$ is optionally substituted phenyl or thiophenyl.

In certain embodiments, the present invention relates to the aforementioned composition, wherein $R_1$ is phenyl optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_1$ is phenyl optionally substituted with one or more of halogen or alkyl.

In certain embodiments, the present invention relates to the aforementioned composition, wherein $R_1$ is phenyl.

In certain embodiments, the present invention relates to the aforementioned composition, wherein $R_2$, $R_3$, $R_4$, and/or $R_5$ are alkyl, cycloalkyl, heteroalkyl, heterocycloalkyl, alkenyl, or aralkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R^3$, $R_4$, and/or $R_5$ are alkyl, cycloalkyl, or heteroalkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R_3$, $R_4$, and/or $R_5$ are optionally substituted alkyl.

In certain embodiments, the present invention relates to the aforementioned composition, wherein $R_2$, $R_3$, $R_4$, and/or $R_5$ are alkyl optionally substituted with one or more of —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_2$, $R_3$, $R_4$, and/or $R_5$ are C1-C6 alkyl substituted with one or more of —$C(O)X^1$, —$OC(O)X^1$, or —$CO_2X^1$; wherein $X^1$ represents independently for each occurrence alkyl, aryl, or aralkyl.

In certain embodiments, the present invention relates to the aforementioned composition, wherein $R_2$, $R_3$, $R_4$, and/or $R_5$ are C1-C6 alkyl substituted with a —$C(O)X^1$, —$OC(O)X^1$, or —$CO_2X^1$; wherein $X^1$ represents independently for each occurrence alkyl, aryl, or aralkyl.

In certain embodiments, the present invention relates to the aforementioned composition, wherein $R_2$, $R_3$, $R_4$, and/or $R_5$ are C1-C6 alkyl substituted with a —$CO_2X^1$; wherein $X^1$ is alkyl.

In certain embodiments, the present invention relates to the aforementioned composition, wherein $R_2$, $R_3$, $R_4$, and/or $R_5$ are —$(CH_2)_n$—$CO_2X^1$, n is an integer in the range of 1-6, and $X^1$ is alkyl.

In certain embodiments, the present invention relates to the aforementioned composition, wherein $R_2$, $R_3$, $R_4$, and/or $R_5$ are —$(CH_2)_3$—$CO_2CH_3$.

In certain embodiments, the present invention relates to the aforementioned composition, wherein $R_1$ is optionally substituted aryl, and $R_2$, $R_3$, $R_4$, and/or $R_5$ are optionally substituted alkyl.

In certain embodiments, the present invention relates to the aforementioned composition, wherein $R_1$ is optionally substituted phenyl or thiophenyl, and $R_2$, $R_3$, $R_4$, and/or $R_5$ are C1-C6 alkyl substituted with a —$CO_2X^1$; wherein $X^1$ is alkyl.

In certain embodiments, the present invention relates to the aforementioned composition, wherein $R_1$ is phenyl and $R_2$, $R_3$, $R_4$, and/or $R_5$ are —$(CH_2)_3$—$CO_2CH_3$.

In certain embodiments, the present invention relates to the aforementioned composition, wherein $R_1'$ is aryl or aralkyl, each of which is optionally substituted with one or more of halogen, hydroxyl, alkyl, alkoxyl, alkenyl, —$N(X^1)_2$, —$C(O)X^1$, —$OC(O)X^1$, —$CO_2X^1$, or —$N(X^1)C(O)X^1$; wherein $X^1$ represents independently for each occurrence H, alkyl, aryl, or aralkyl.

In certain embodiments, the present invention relates to the aforementioned composition, wherein $R_1'$ is aryl or aralkyl, each of which is optionally substituted with one or more of halogen or alkyl.

In certain embodiments, the present invention relates to the aforementioned composition, wherein $R_1'$ is optionally substituted aryl.

In certain embodiments, the present invention relates to the aforementioned composition, wherein $R_1'$ is optionally substituted phenyl or thiophenyl.

In certain embodiments, the present invention relates to the aforementioned composition, wherein $R_1'$ is phenyl optionally substituted with one or more of halogen, hydroxyl, alkyl, alkoxyl, alkenyl, $-N(X^1)_2$, $-C(O)X^1$, $-OC(O)X^1$, $-CO_2X^1$, or $-N(X^1)C(O)X^1$; wherein $X^1$ represents independently for each occurrence H, alkyl, aryl, or aralkyl.

In certain embodiments, the present invention relates to the aforementioned composition, wherein $R_1'$ is phenyl optionally substituted with one or more of halogen or alkyl.

In certain embodiments, the present invention relates to the aforementioned composition, wherein $R_1'$ is phenyl.

In certain embodiments, the present invention relates to the aforementioned composition, wherein $R_2'$, $R_3'$, $R_4'$, and/or $R_5'$ are alkyl, cycloalkyl, heteroalkyl, heterocycloalkyl, alkenyl, or aralkyl, each of which is optionally substituted with one or more of halogen, hydroxyl, alkyl, alkoxyl, alkenyl, $-N(X^1)_2$, $-C(O)X^1$, $-OC(O)X^1$, $-CO_2X^1$, or $-N(X^1)C(O)X^1$; wherein $X^1$ represents independently for each occurrence H, alkyl, aryl, or aralkyl.

In certain embodiments, the present invention relates to the aforementioned composition, wherein $R_2'$, $R_3'$, $R_4'$, and/or $R_5'$ are alkyl, cycloalkyl, or heteroalkyl, each of which is optionally substituted with one or more of halogen, hydroxyl, alkyl, alkoxyl, alkenyl, $-N(X^1)_2$, $-C(O)X^1$, $-OC(O)X^1$, $-CO_2X^1$, or $-N(X^1)C(O)X^1$; wherein $X^1$ represents independently for each occurrence H, alkyl, aryl, or aralkyl.

In certain embodiments, the present invention relates to the aforementioned composition, wherein $R_2'$, $R_3'$, $R_4'$, and/or $R_5'$ are optionally substituted alkyl.

In certain embodiments, the present invention relates to the aforementioned composition, wherein $R_2'$, $R_3'$, $R_4'$, and/or $R_5'$ are alkyl optionally substituted with one or more of $-C(O)X^1$, $-OC(O)X^1$, $-CO_2X^1$, or $-N(X^1)C(O)X^1$; wherein $X^1$ represents independently for each occurrence H, alkyl, aryl, or aralkyl.

In certain embodiments, the present invention relates to the aforementioned composition, wherein $R_2'$, $R_3'$, $R_4'$, and/or $R_5'$ are C1-C6 alkyl substituted with one or more of $-C(O)X^1$, $-OC(O)X^1$, or $-CO_2X^1$; wherein $X^1$ represents independently for each occurrence alkyl, aryl, or aralkyl.

In certain embodiments, the present invention relates to the aforementioned composition, wherein $R_2'$, $R_3'$, $R_4'$, and/or $R_5'$ are C1-C6 alkyl substituted with a $-C(O)X^1$, $-OC(O)X^1$, or $-CO_2X^1$; wherein $X^1$ represents independently for each occurrence alkyl, aryl, or aralkyl.

In certain embodiments, the present invention relates to the aforementioned composition, wherein $R_2'$, $R_3'$, $R_4'$, and/or $R_5'$ are C1-C6 alkyl substituted with a $-CO_2X^1$; wherein $X^1$ is alkyl.

In certain embodiments, the present invention relates to the aforementioned composition, wherein $R_2'$, $R_3'$, $R_4'$, and/or $R_5'$ are $-(CH_2)_n-CO_2X^1$, n is an integer in the range of 1-6, and $X^1$ is alkyl.

In certain embodiments, the present invention relates to the aforementioned composition, wherein $R_2'$, $R_3'$, $R_4'$, and/or $R_5'$ are $-(CH_2)_3-CO_2CH_3$.

In certain embodiments, the present invention relates to the aforementioned composition, wherein $R_1'$ is optionally substituted aryl, and $R_2'$, $R_3'$, $R_4'$, and/or $R_5'$ are optionally substituted alkyl.

In certain embodiments, the present invention relates to the aforementioned composition, wherein $R_1'$ is optionally substituted phenyl or thiophenyl, and $R_2'$, $R_3'$, $R_4'$, and/or $R_5'$ are $C_1$-$C_6$ alkyl substituted with a $-CO_2X^1$; wherein $X^1$ is alkyl.

In certain embodiments, the present invention relates to the aforementioned composition, wherein $R_1'$ is phenyl and $R_2'$, $R_3'$, $R_4'$, and/or $R_5'$ are $-(CH_2)_3-CO_2CH_3$.

In certain embodiments, the present invention relates to the aforementioned composition, wherein $R_1$ and $R_1'$ are optionally substituted aryl, and $R_2$, $R_3$, $R_4$, and/or $R_5$ and $R_2'$, $R_3'$, $R_4'$, and/or $R_5'$ are optionally substituted alkyl.

In certain embodiments, the present invention relates to the aforementioned composition, wherein $R_1$ and $R_1'$ are optionally substituted phenyl or thiophenyl, and $R_2$, $R_3$, $R_4$, and/or $R_5$ and $R_2'$, $R_3'$, $R_4'$, and/or $R_5'$ are C1-C6 alkyl substituted with a $-CO_2X^1$; wherein $X^1$ is alkyl.

In certain embodiments, the present invention relates to the aforementioned composition, wherein $R_1$ and $R_1'$ are phenyl, and $R_2$, $R_3$, $R_4$, and/or $R_5$ and $R_2'$, $R_3'$, $R_4'$, and/or $R_5'$ are $-(CH_2)_3-CO_2CH_3$.

In certain embodiments, the present invention relates to the aforementioned composition, wherein the ratio of the weight percentage of said compound of Formula III to said compound of Formula IV is in the range of about 3:1 to about 1:3.

In certain embodiments, the present invention relates to the aforementioned composition, wherein the ratio of the weight percentage of said compound of Formula III to said compound of Formula IV is in the range of about 3:1 to about 1:1.

In certain embodiments, the present invention relates to the aforementioned composition, wherein the ratio of the weight percentage of said compound of Formula III to said compound of Formula IV is about 2:1.

In certain embodiments, the present invention relates to the aforementioned composition, wherein said compound of Formula III comprises about 5 wt % to about 95 wt % of said composition, and said compound of Formula IV comprises about 5 wt % to about 95 wt % of said composition such that the sum of the weight percent of said compound of Formula III and said compound of Formula IV equals greater than about 99 wt % of said composition.

In certain embodiments, the present invention relates to the aforementioned composition, wherein said compound of Formula III comprises about 5 wt % to about 95 wt % of said composition, and said compound of Formula IV comprises about 5 wt % to about 95 wt % of said composition such that the sum of the weight percent of said compound of Formula III and said compound of Formula IV equals greater than about 99 wt % of said composition.

Bis-Derivatives

In certain embodiments, the present invention relates to a composition, comprising a compound of formula V, and a compound of formula VI, wherein formula V is represented by:

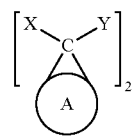

V wherein

A is a $C_{60}$ fullerene bonded to —C(X)(Y)— via a methano-bridge;

X is optionally substituted aryl or aralkyl; and

Y is an optionally substituted alkyl, optionally substituted cycloalkyl, optionally substituted heteroalkyl, optionally substituted heterocycloalkyl, optionally substituted alkenyl, or optionally substituted aralkyl; and formula VI is represented by:

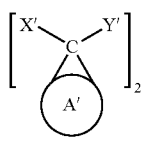

VI wherein

A' is a $C_{70}$ fullerene bonded to —C(X)(Y)— via a methano-bridge;

X' is optionally substituted aryl or optionally substituted aralkyl; and

Y' is optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein X is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is aryl or aralkyl, each of which is optionally substituted with one or more of halogen or alkyl.

In certain embodiments, the present invention relates to the aforementioned composition, wherein X is optionally substituted aryl.

In certain embodiments, the present invention relates to the aforementioned composition, wherein X is optionally substituted phenyl or thiophenyl.

In certain embodiments, the present invention relates to the aforementioned composition, wherein X is phenyl optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is phenyl optionally substituted with one or more of halogen or alkyl.

In certain embodiments, the present invention relates to the aforementioned composition, wherein X is phenyl.

In certain embodiments, the present invention relates to the aforementioned composition, wherein Y is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is alkyl, cycloalkyl, or heteroalkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is optionally substituted alkyl.

In certain embodiments, the present invention relates to the aforementioned composition, wherein Y is alkyl optionally substituted with one or more of —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is C1-C6 alkyl substituted with one or more of —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —C(O)$R^1$, —OC(O)$R^1$, or —CO$_2R^1$; wherein $R^1$ represents independently for each occurrence alkyl, aryl, or aralkyl.

In certain embodiments, the present invention relates to the aforementioned composition, wherein Y is C1-C6 alkyl substituted with a —CO$_2R^1$; wherein $R^1$ is alkyl.

In certain embodiments, the present invention relates to the aforementioned composition, wherein Y is —(CH$_2$)$_n$—CO$_2R^1$, n is an integer in the range of 1-6, and $R^1$ is alkyl.

In certain embodiments, the present invention relates to the aforementioned composition, wherein Y is —(CH$_2$)$_3$—CO$_2$CH$_3$.

In certain embodiments, the present invention relates to the aforementioned composition, wherein X is optionally substituted aryl, and Y is optionally substituted alkyl.

In certain embodiments, the present invention relates to the aforementioned composition, wherein X is optionally substituted phenyl or thiophenyl, and Y is C1-C6 alkyl substituted with a —CO$_2R^1$; wherein $R^1$ is alkyl.

In certain embodiments, the present invention relates to the aforementioned composition, wherein X is phenyl and Y is —(CH$_2$)$_3$—CO$_2$CH$_3$.

In certain embodiments, the present invention relates to the aforementioned composition, wherein X' is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is aryl or aralkyl, each of which is optionally substituted with one or more of halogen or alkyl.

In certain embodiments, the present invention relates to the aforementioned composition, wherein X' is optionally substituted aryl.

In certain embodiments, the present invention relates to the aforementioned composition, wherein X' is optionally substituted phenyl or thiophenyl.

In certain embodiments, the present invention relates to the aforementioned composition, wherein X' is phenyl optionally substituted with one or more of halogen, hydroxyl, alkyl, alkoxyl, alkenyl, —N($R^1$)$_2$, —C(O)$R^1$, —OC(O)$R^1$, —CO$_2R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is phenyl optionally substituted with one or more of halogen or alkyl.

In certain embodiments, the present invention relates to the aforementioned composition, wherein X' is phenyl.

In certain embodiments, the present invention relates to the aforementioned composition, wherein Y' is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N(R$^1$)$_2$, —C(O)R$^1$, —OC(O)R$^1$, —CO$_2$R$^1$, or —N(R$^1$)C(O)R$^1$; wherein R$^1$ represents independently for each occurrence H, alkyl, aryl, or aralkyl.

In certain embodiments, the present invention relates to the aforementioned composition, wherein Y' is alkyl, cycloalkyl, or heteroalkyl, each of which is optionally substituted with one or more of halogen, hydroxyl, alkyl, alkoxyl, alkenyl, —N(R$^1$)$_2$, —C(O)R$^1$, —OC(O)R$^1$, —CO$_2$R$^1$, or —N(R$^1$)C(O)R$^1$; wherein R$^1$ represents independently for each occurrence H, alkyl, aryl, or aralkyl.

In certain embodiments, the present invention relates to the aforementioned composition, wherein Y' is optionally substituted alkyl.

In certain embodiments, the present invention relates to the aforementioned composition, wherein Y' is alkyl optionally substituted with one or more of —C(O)R$^1$, —OC(O)R$^1$, —CO$_2$R$^1$, or —N(R$^1$)C(O)R$^1$; wherein R$^1$ represents independently for each occurrence H, alkyl, aryl, or aralkyl.

In certain embodiments, the present invention relates to the aforementioned composition, wherein Y' is C1-C6 alkyl substituted with one or more of —C(O)R$^1$, —OC(O)R$^1$, or —CO$_2$R$^1$; wherein R$^1$ represents independently for each occurrence alkyl, aryl, or aralkyl.

In certain embodiments, the present invention relates to the aforementioned composition, wherein Y' is C1-C6 alkyl substituted with a —C(O)R$^1$, —OC(O)R$^1$, or —CO$_2$R$^1$; wherein R$^1$ represents independently for each occurrence alkyl, aryl, or aralkyl.

In certain embodiments, the present invention relates to the aforementioned composition, wherein Y' is C1-C6 alkyl substituted with a —CO$_2$R$^1$; wherein R$^1$ is alkyl.

In certain embodiments, the present invention relates to the aforementioned composition, wherein Y' is —(CH$_2$)$_n$—CO$_2$R$^1$, n is an integer in the range of 1-6, and R$^1$ is alkyl.

In certain embodiments, the present invention relates to the aforementioned composition, wherein Y' is —(CH$_2$)$_3$—CO$_2$CH$_3$.

In certain embodiments, the present invention relates to the aforementioned composition, wherein X' is optionally substituted aryl, and Y' is optionally substituted alkyl.

In certain embodiments, the present invention relates to the aforementioned composition, wherein X' is optionally substituted phenyl or thiophenyl, and Y' is C1-C6 alkyl substituted with a —CO$_2$R$^1$; wherein R$^1$ is alkyl.

In certain embodiments, the present invention relates to the aforementioned composition, wherein X' is phenyl and Y' is —(CH$_2$)$_3$—CO$_2$CH$_3$.

In certain embodiments, the present invention relates to the aforementioned composition, wherein X and X' are optionally substituted aryl, and Y and Y' are optionally substituted alkyl.

In certain embodiments, the present invention relates to the aforementioned composition, wherein X and X' are optionally substituted phenyl or thiophenyl, and Y and Y' are C1-C6 alkyl substituted with a —CO$_2$R$^1$; wherein R$^1$ is alkyl.

In certain embodiments, the present invention relates to the aforementioned composition, wherein X and X' are phenyl, and Y and Y' are —(CH$_2$)$_3$—CO$_2$CH$_3$.

In certain embodiments, the present invention relates to the aforementioned composition, wherein the ratio of the weight percentage of said compound of Formula V to said compound of Formula VI is in the range of about 3:1 to about 1:3.

In certain embodiments, the present invention relates to the aforementioned composition, wherein the ratio of the weight percentage of said compound of Formula V to said compound of Formula VI is in the range of about 3:1 to about 1:1.

In certain embodiments, the present invention relates to the aforementioned composition, wherein the ratio of the weight percentage of said compound of Formula V to said compound of Formula VI is about 2:1.

In certain embodiments, the present invention relates to the aforementioned composition, wherein said compound of Formula V comprises about 5 wt % to about 95 wt % of said composition, and said compound of Formula VI comprises about 5 wt % to about 95 wt % of said composition such that the sum of the weight percent of said compound of Formula V and said compound of Formula VI equals greater than about 99 wt % of said composition.

In certain embodiments, the present invention relates to the aforementioned composition, wherein said compound of Formula V comprises about 5 wt % to about 95 wt % of said composition, and said compound of Formula VI comprises about 5 wt % to about 95 wt % of said composition such that the sum of the weight percent of said compound of Formula V and said compound of Formula VI equals greater than about 99 wt % of said composition.

In certain embodiments, the present invention relates to a composition, consisting essentially of a compound of formula V, and a compound of formula VI, wherein formula V is represented by:

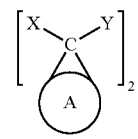

V wherein

A is a C$_{60}$ fullerene bonded to —C(X)(Y)— via a methano-bridge;

X is optionally substituted aryl or aralkyl; and

Y is optionally substituted alkyl, optionally substituted cycloalkyl, optionally substituted heteroalkyl, optionally substituted heterocycloalkyl, optionally substituted alkenyl, or optionally substituted aralkyl; and formula II is represented by:

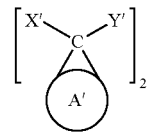

VI wherein

A' is a C$_{70}$ fullerene bonded to —C(X)(Y)— via a methano-bridge;

X' is optionally substituted aryl or optionally substituted aralkyl; and

Y' is optionally substituted alkyl, optionally substituted cycloalkyl, optionally substituted heteroalkyl, optionally substituted heterocycloalkyl, optionally substituted alkenyl, or optionally substituted aralkyl.

In certain embodiments, the present invention relates to the aforementioned composition, wherein X is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is aryl or aralkyl, each of which is optionally substituted with one or more of halogen or alkyl.

In certain embodiments, the present invention relates to the aforementioned composition, wherein X is optionally substituted aryl.

In certain embodiments, the present invention relates to the aforementioned composition, wherein X is optionally substituted phenyl or thiophenyl.

In certain embodiments, the present invention relates to the aforementioned composition, wherein X is phenyl optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X is phenyl optionally substituted with one or more of halogen or alkyl.

In certain embodiments, the present invention relates to the aforementioned composition, wherein X is phenyl.

In certain embodiments, the present invention relates to the aforementioned composition, wherein Y is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is alkyl, cycloalkyl, or heteroalkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is optionally substituted alkyl.

In certain embodiments, the present invention relates to the aforementioned composition, wherein Y is alkyl optionally substituted with one or more of —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y is C1-C6 alkyl substituted with one or more of —C(O)$R^1$, —OC(O)$R^1$, or —CO$_2$$R^1$; wherein $R^1$ represents independently for each occurrence alkyl, aryl, or aralkyl.

In certain embodiments, the present invention relates to the aforementioned composition, wherein Y is C1-C6 alkyl substituted with a —C(O)$R^1$, —OC(O)$R^1$, or —CO$_2$$R^1$; wherein $R^1$ represents independently for each occurrence alkyl, aryl, or aralkyl.

In certain embodiments, the present invention relates to the aforementioned composition, wherein Y is C1-C6 alkyl substituted with a —CO$_2$$R^1$; wherein $R^1$ is alkyl.

In certain embodiments, the present invention relates to the aforementioned composition, wherein Y is —(CH$_2$)$_n$—CO$_2$$R^1$, n is an integer in the range of 1-6, and $R^1$ is alkyl.

In certain embodiments, the present invention relates to the aforementioned composition, wherein Y is —(CH$_2$)$_3$—CO$_2$CH$_3$.

In certain embodiments, the present invention relates to the aforementioned composition, wherein X is optionally substituted aryl, and Y is optionally substituted alkyl.

In certain embodiments, the present invention relates to the aforementioned composition, wherein X is optionally substituted phenyl or thiophenyl, and Y is C1-C6 alkyl substituted with a —CO$_2$$R^1$; wherein $R^1$ is alkyl.

In certain embodiments, the present invention relates to the aforementioned composition, wherein X is phenyl and Y is —(CH$_2$)$_3$—CO$_2$CH$_3$.

In certain embodiments, the present invention relates to the aforementioned composition, wherein X' is aryl or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is aryl or aralkyl, each of which is optionally substituted with one or more of halogen or alkyl.

In certain embodiments, the present invention relates to the aforementioned composition, wherein X' is optionally substituted aryl.

In certain embodiments, the present invention relates to the aforementioned composition, wherein X' is optionally substituted phenyl or thiophenyl.

In certain embodiments, the present invention relates to the aforementioned composition, wherein X' is phenyl optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein X' is phenyl optionally substituted with one or more of halogen or alkyl.

In certain embodiments, the present invention relates to the aforementioned composition, wherein X' is phenyl.

In certain embodiments, the present invention relates to the aforementioned composition, wherein Y' is alkyl, cycloalkyl, heteroalkyl, heterocycloalkyl, alkenyl, or aralkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y' is alkyl, cycloalkyl, or heteroalkyl, each of which is optionally substituted with one or more of halogen, hydroxyl, alkyl, alkoxyl, alkenyl, —N($R^1$)$_2$, —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y' is optionally substituted alkyl.

In certain embodiments, the present invention relates to the aforementioned composition, wherein Y' is alkyl optionally substituted with one or more of —C(O)$R^1$, —OC(O)$R^1$, —CO$_2$$R^1$, or —N($R^1$)C(O)$R^1$; wherein $R^1$ represents independently for each occurrence H, alkyl, aryl, or aralkyl.

In certain embodiments, the present invention relates to the aforementioned composition, wherein Y' is C1-C6 alkyl substituted with one or more of —C(O)$R^1$, —OC(O)$R^1$, or —$CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a —$C(O)R^1$, —$OC(O)R^1$, or —$CO_2R^1$; wherein $R^1$ represents independently for each occurrence alkyl, aryl, or aralkyl.

In certain embodiments, the present invention relates to the aforementioned composition, wherein Y' is C1-C6 alkyl substituted with a —$CO_2R^1$; wherein $R^1$ is alkyl.

In certain embodiments, the present invention relates to the aforementioned composition, wherein Y' is —$(CH_2)_n$—$CO_2R^1$, n is an integer in the range of 1-6, and $R^1$ is alkyl.

In certain embodiments, the present invention relates to the aforementioned composition, wherein Y' is —$(CH_2)_3$—$CO_2CH_3$.

In certain embodiments, the present invention relates to the aforementioned composition, wherein X' is optionally substituted aryl, and Y' is optionally substituted alkyl.

In certain embodiments, the present invention relates to the aforementioned composition, wherein X' is optionally substituted phenyl or thiophenyl, and Y' is C1-C6 alkyl substituted with a —$CO_2R^1$; wherein $R^1$ is alkyl.

In certain embodiments, the present invention relates to the aforementioned composition, wherein X' is phenyl and Y' is —$(CH_2)_3$—$CO_2CH_3$.

In certain embodiments, the present invention relates to the aforementioned composition, wherein X and X' are optionally substituted aryl, and Y and Y' are optionally substituted alkyl.

In certain embodiments, the present invention relates to the aforementioned composition, wherein X and X' are optionally substituted phenyl or thiophenyl, and Y and Y' are C1-C6 alkyl substituted with a —$CO_2R^1$; wherein $R^1$ is alkyl.

In certain embodiments, the present invention relates to the aforementioned composition, wherein X and X' are phenyl, and Y and Y' are —$(CH_2)_3$—$CO_2CH_3$.

In certain embodiments, the present invention relates to the aforementioned composition, wherein the ratio of the weight percentage of said compound of Formula V to said compound of Formula VI is in the range of about 3:1 to about 1:3.

In certain embodiments, the present invention relates to the aforementioned composition, wherein the ratio of the weight percentage of said compound of Formula V to said compound of Formula VI is in the range of about 3:1 to about 1:1.

In certain embodiments, the present invention relates to the aforementioned composition, wherein the ratio of the weight percentage of said compound of Formula V to said compound of Formula VI is about 2:1.

In certain embodiments, the present invention relates to the aforementioned composition, wherein said compound of Formula V comprises about 5 wt % to about 95 wt % of said composition, and said compound of Formula VI comprises about 5 wt % to about 95 wt % of said composition such that the sum of the weight percent of said compound of Formula V and said compound of Formula VI equals greater than about 99 wt % of said composition.

In certain embodiments, the present invention relates to the aforementioned composition, wherein said compound of Formula V comprises about 5 wt % to about 95 wt % of said composition, and said compound of Formula VI comprises about 5 wt % to about 95 wt % of said composition such that the sum of the weight percent of said compound of Formula V and said compound of Formula VI equals greater than about 99 wt % of said composition.

Other Bis-Adducts

In certain embodiments, the present invention relates to bis-adducts of PCBM, bis-adducts of ThCBM, bis-adducts of Prato, bis-adducts of Bingel, bis-adducts of diazoline, bis-adducts of azafulleroid, bis-adducts of ketolactam, and bis-adducts of Diels Alder.

Other Embodiments

In certain embodiments, the present invention relates to the aforementioned compositions, further comprising about 0.0001% to about 5% oxides of $C_{60}$ fullerenes, and/or about 0.0001% to about 5% oxides of $C_{70}$ fullerenes, and/or about 0.0001% to about 5% oxides of $C_{60}$ fullerene derivatives, and/or about 0.0001% to about 5% $C_{70}$ fullerene derivatives.

In certain embodiments, the present invention relates to the aforementioned compositions, further comprising about 0.001% to about 2% oxides of $C_{60}$ fullerenes, and/or about 0.001% to about 2% oxides of $C_{70}$ fullerenes, and/or about 0.001% to about 2% oxides of $C_{60}$ fullerene derivatives, and/or about 0.001% to about 2% $C_{70}$ fullerene derivatives.

In certain embodiments, the present invention relates to the aforementioned compositions, further comprising about 0.01% to about 1% oxides of $C_{60}$ fullerenes, and/or about 0.01% to about 1% oxides of $C_{70}$ fullerenes, and/or about 0.01% to about 1% oxides of $C_{60}$ fullerene derivatives, and/or about 0.01% to about 1% $C_{70}$ fullerene derivatives.

In certain embodiments, the present invention relates to the aforementioned compositions, further comprising about 0.0001% to about 5% dimer compounds of unreacted $C_{60}$ fullerenes, and/or about 0.0001% to about 5% dimer compounds of unreacted $C_{70}$ fullerenes, and/or about 0.0001% to about 5% dimer compounds of $C_{60}$ fullerene derivatives, and/or about 0.0001% to about 5% dimer compounds of $C_{70}$ fullerene derivatives.

In certain embodiments, the present invention relates to the aforementioned compositions, further comprising about 0.001% to about 2% dimer compounds of unreacted $C_{60}$ fullerenes, and/or about 0.001% to about 2% dimer compounds of unreacted $C_{70}$ fullerenes, and/or about 0.001% to about 2% dimer compounds of $C_{60}$ fullerene derivatives, and/or about 0.001% to about 2% dimer compounds of $C_{70}$ fullerene derivatives.

In certain embodiments, the present invention relates to the aforementioned compositions, further comprising about 0.001% to about 1% dimer compounds of unreacted $C_{60}$ fullerenes, and/or about 0.001% to about 1% dimer compounds of unreacted $C_{70}$ fullerenes, and/or about 0.001% to about 1% dimer compounds of $C_{60}$ fullerene derivatives, and/or about 0.001% to about 1% dimer compounds of $C_{70}$ fullerene derivatives.

In certain embodiments, the present invention relates to the aforementioned compositions, further comprising C60 and C70 bis-adduct chemical derivatives; about 0.0001% to about 50% C60 and C70 (cumulative); mono-adduct chemical derivatives of C60 and C70 in the range about 0.001% to about 50%; fullerenes higher in molecular weight than C70 and derivatives of these fullerenes in the range about 0.000001% to about 3%; oxides of C60 and C70 and oxides of C60 and C70 derivatives in the range about 0.0001% to about 5%; and dimer compounds of C60 and C70 and C60 and C70 derivatives in the range about 0.0001% to about 5%. The ratio of C60 to C70 derivatives (to each other), whether mono or multi, can be anywhere from about 0.001% of each one; i.e., about 99.999% [60]PCBM, about 0.001% [70]PCBM or about 0.001% [60]PCBM, about 99.999% [70]PCBM.

In certain other embodiments, the present invention relates to the aforementioned compositions, further comprising a C60 mono-adduct chemical derivative; about 0.0001% to about 50% C60; multi-adducts of the C60 chemical derivative in the range of about 0.001% to about 30%; fullerenes higher in molecular weight than C70 and derivatives of these fullerenes less than about 0.000001% about 1%; oxides of C60 and C70 and the C60 and C70 derivatives about 0.0001% to about 1%.

In certain other embodiments, the present invention relates to the aforementioned compositions, further comprising a C70 mono-adduct chemical derivative; about 0.0001% to about 50% C70; multi-adducts of the C70 chemical derivative in the range of about 0.001% to about 30%; fullerenes higher in molecular weight than C70 and derivatives of these fullerenes less than about 0.000001% about 1%; oxides of C70 and C70 and the C60 and C70 derivatives about 0.0001% to about 1%.

In certain embodiments, the present invention relates to the aforementioned compositions, further comprising less than about 0.0001% unreacted $C_{60}$ to about 50% unreacted $C_{60}$ and/or less than about 0.0001% unreacted $C_{70}$ to about 50% unreacted $C_{70}$.

In certain embodiments, the present invention relates to the aforementioned compositions, further comprising less than about 0.01% unreacted $C_{60}$ to about 10% unreacted $C_{60}$ and/or less than about 0.01% unreacted $C_{70}$ to about 10% unreacted $C_{70}$.

In certain embodiments, the present invention relates to the aforementioned compositions, further comprising less than about 0.1% unreacted $C_{60}$ to about 5% unreacted $C_{60}$ and/or less than about 0.1% unreacted $C_{70}$ to about 5% unreacted $C_{70}$.

In certain embodiments, the present invention relates to the aforementioned compositions further comprising about 0.001% to about 50% multi-adduct derivatives of $C_{60}$ and/or about 0.001% to about 50% multi-adduct derivatives of $C_{70}$.

In certain embodiments, the present invention relates to the aforementioned compositions further comprising about 0.01% to about 5% multi-adduct derivatives of $C_{60}$ and/or about 0.01% to about 5% multi-adduct derivatives of $C_{70}$.

In certain embodiments, the present invention relates to the aforementioned compositions further comprising about 0.01% to about 1% multi-adduct derivatives of $C_{60}$ and/or about 0.01% to about 1% multi-adduct derivatives of $C_{70}$.

In certain embodiments, the present invention relates to the aforementioned compositions, further comprising less than about 10% $C_{60}$ mono-adduct chemical derivatives and/or less than about 10% $C_{70}$ mono-adduct chemical derivatives.

In certain embodiments, the present invention relates to the aforementioned compositions, further comprising less than about 5% $C_{60}$ mono-adduct chemical derivatives and/or less than about 5% $C_{70}$ mono-adduct chemical derivatives.

In certain embodiments, the present invention relates to the aforementioned compositions, further comprising less than about 2% $C_{60}$ mono-adduct chemical derivatives and/or less than about 2% $C_{70}$ mono-adduct chemical derivatives.

In certain embodiments, the present invention relates to the aforementioned compositions, further comprising about 0.000001% to about 3% unreacted fullerenes greater than $C_{70}$ and/or about 0.000001% to about 3% fullerene derivatives greater than $C_{70}$.

In certain embodiments, the present invention relates to the aforementioned compositions, further comprising about 0.001% to about 0.5% unreacted fullerenes greater than $C_{70}$ and/or about 0.001% to about 0.5% fullerene derivatives greater than $C_{70}$.

In certain embodiments, the present invention relates to the aforementioned compositions, further comprising less than about 0.1% unreacted fullerenes greater than $C_{70}$ and/or less than about 0.1% fullerene derivatives greater than $C_{70}$.

Additional Process Embodiments

In certain embodiments, the present invention relates to the method of synthesizing a mixture of fullerene derivatives or a pure component fullerene derivative by substituting a mixture of fullerenes for a pure fullerene in a fullerene synthesis; varying the ratio of fullerene derivative content by using a purification technique.

In certain embodiments, the present invention relates to the aforementioned method where the purification method is filtration or elution over activated charcoal.

In certain embodiments, the present invention relates to the aforementioned method where the purification method is adsorption on activated charcoal followed by filtration.

In certain embodiments, the present invention relates to the aforementioned method where the purification comprises multiple repeated steps.

In certain embodiments, the present invention relates to the aforementioned method where the purification method is preparatory scale HPLC.

In certain embodiments, the present invention relates to the aforementioned method where the product obtained is substantially pure [60]derivative, [70]derivative, [76]derivative, [78]derivative, or [84]derivative In certain embodiments, the present invention relates to the aforementioned method where the product obtained is any of claims the aforementioned compositions.

In certain embodiments, the present invention relates to the aforementioned method where the product comprises methanofullerene derivatives.

In certain embodiments, the present invention relates to the aforementioned method where product comprises PCBM derivatives.

In certain embodiments, the present invention relates to the aforementioned method where the product comprises ThCBM derivatives.

In certain embodiments, the present invention relates to the aforementioned method, where the fullerene derivatives consist of the same addend, by first contacting the fullerene derivative mixture dissolved in a first solvent with activated carbon in the range of 0.01 g/g (total) of fullerene derivative to 30 g/g (total) of fullerene derivative; eluting the supernatant to obtain a mixture higher in proportion relative to the original mixture in fullerene derivatives of lower molecular weight; contacting the activated carbon with a second solvent in which the fullerene derivatives are more soluble than the first solvent; eluting the second solvent to obtain a mixture higher in proportion relative to the original mixture in fullerene derivatives of higher molecular weight; repeating the above procedure as necessary to obtain the desired proportion of fullerene derivatives.

In certain embodiments, the present invention relates to the aforementioned method where the contacting procedure is passing the fullerene mixture over a bed of activated carbon, with or without a supporting medium.

In certain embodiments, the present invention relates to the aforementioned method where the contacting procedure is suspension of the activated carbon in the fullerene mixture by mixing;

In certain embodiments, the present invention relates to the aforementioned method where the proportion of activated carbon to g total of fullerene derivative mixture is in the range 0.1 g/g to 10 g/g.

In certain embodiments, the present invention relates to the aforementioned method where the proportion of activated carbon to g total of fullerene derivative mixture is 0.2 g/g to 5 g/g.

In certain embodiments, the present invention relates to the aforementioned method where the product is a mixture of C60 chemical derivatives and C70 chemical derivatives in the proportion of 100:1 to 1:100 percent molar.

In certain embodiments, the present invention relates to the aforementioned method where the product is 20:1 to 1:20 percent molar.

In certain embodiments, the present invention relates to the aforementioned method where the product is 5:1 to 1:5 percent molar.

In certain embodiments, the present invention relates to the aforementioned method where the proportion is altered so as to obtain substantially pure C60 derivative.

In certain embodiments, the present invention relates to the aforementioned method where the proportion is altered so as to obtain substantially pure C70 derivative.

In certain embodiments, the present invention relates to the aforementioned method where the proportion is altered so as to obtain derivatives of fullerenes higher than C70 of less than 0.5% molar relative to total fullerene derivatives.

In certain embodiments, the present invention relates to the aforementioned method where the supporting medium is silica gel or sand.

Additional Composition Embodiments

In certain embodiments, the present invention relates to a composition comprising: C60 and C70 chemical derivatives formed by synthesis on a fullerene mixture, wherein the addend moieties of the C60 and the C70 are the same; further comprised of
0.0001%-50% molar C60 and C70 (cumulative); multi-adduct chemical derivatives of C60 and C70 in the range 0.001%-50% molar; oxides of C60 and C70 and oxides of C60 and C70 derivatives in the range 0.0001%-5%;
dimer compounds of C60 and C70 and dimer compounds of C60 and C70 derivatives in the range 0.0001%-5%; and
fullerenes higher in molecular weight than C70 and chemical derivatives of fullerenes higher in molecular weight than C70 and oxides and dimers of fullerenes higher in molecular weight than C70 and oxides and dimers of chemical derivatives of fullerenes higher in molecular weight than C70 are in the cumulative range of 0.000001%-3% molar.

In certain other embodiments, the present invention relates to a composition comprising:
C60 and C70 in the range 0.01%-10%;
multi-adducts in the range 0.01%-5%;
fullerenes higher in molecular weight than C70 and derivatives of these fullerenes in the range 0.001%-0.5%;
oxides of C60 and C70 and oxides of C60 and C70 derivatives in the range 0.001%-2%; and
dimer compounds of C60 and C70 and C60 and C70 derivatives in the range 0.001%-2%.

In certain other embodiments, the present invention relates to a composition comprising:
C60 and C70 in the range 0.1%-5%;
multi-adducts in the range 0.01%-1%;
fullerenes higher in molecular weight than C70 and derivatives of these fullerenes less than 0.1%;
oxides of C60 and C70 and oxides of C60 and C70 derivatives in the range 0.01%-1%;
dimer compounds of C60 and C70 and C60 and C70 derivatives in the range 0.01%-1%;

In certain embodiments, the present invention relates to:
C60 and C70 bis-adduct chemical derivatives;
0.0001%-50% C60 and C70 (cumulative);
mono-adduct chemical derivatives of C60 and C70 in the range 0.001%-50%;
fullerenes higher in molecular weight than C70 and derivatives of these fullerenes in the range 0.000001%-3%;
oxides of C60 and C70 and oxides of C60 and C70 derivatives in the range 0.0001%-5%; and
dimer compounds of C60 and C70 and C60 and C70 derivatives in the range 0.0001%-5%.

In certain embodiments, the present invention relates to a composition where rhe ratio of C60 to C70 derivatives (to each other), whether mono or multi, can be anywhere from 0.001% of each one; i.e., 99.999% [60]PCBM, 0.001% [70]PCBM or 0.001% [60]PCBM, 99.999% [70]PCBM.

In still other embodiments, the present invention relates to a composition comprising:
A C60 mono-adduct chemical derivative;
0.0001%-50% C60;
multi-adducts of the C60 chemical derivative in the range 0.001%-30%;
fullerenes higher in molecular weight than C70 and derivatives of these fullerenes less 0.000001%-1%; and
oxides of C60 and C70 and the C60 and C70 derivatives 0.0001%-1%.

EXAMPLES

Example 1

Synthesis Information

Synthesis of Mixtures PCBM Derivatives ([$C_n$]PCBM)

Synthesis of PCBM derivatives was performed according to methods described in Hummelen et al. *J. Org. Chem.* 1995, 60, 532. Analysis by HPLC indicated about 74% [60]PCBM, 22% [70]PCBM, and 4% [>70]PCBM. Reduction of [>70] adducts may be performed by analytical or prep scale HPLC, using a Cosmocil Buckyprep column, or activated carbon filtration.

In a typical methanofullerene synthesis, using arc-produced fullerenes, compositions of the product before any purification are approximately 40% to 50% unreacted fullerenes, 40% to 50% [60] and [70] mono-adducts (~9% bis, ~1% tris), ≤1% other impurities (oxides of $C_{60}$ and the derivatives; dimers of $C_{60}$ and derivatives), 4% higher fullerene (>$C_{70}$) derivatives and unreacted fullerenes >$C_{70}$. Unreacted fullerenes may be removed with a silica gel column. Higher fullerene derivatives may be removed by analytical or prep scale HPLC, using a Cosmocil Buckyprep column, or activated carbon filtration. The typical composition of the final product is 5% to 95%:95% to 5% [60]PCBM: [70]PCBM, <2% unreacted $C_{60}$ and $C_{70}$, <0.1% higher fullerene derivatives, <0.5% bis and other multi-adducts, <1% oxide and dimers of unreacted fullerenes and fullerene derivatives.

Synthesis of Mixtures of ThCBM Derivatives [$C_n$]ThCBM

A mixture of 4.55 g of methyl 5-oxo-5-(thien-2-yl)-pentanoic acid p-tosyl hydrazone, 650 mg of sodium methoxide, and 10.1 g of commercial fullerene mix (71% C60, 23% C70, 6% C>70 by HPLC) in 1.0 L of o-dichlorobenzene (ODCB) was heated to 90° C. under N2 for 17 h. The crude [Cn] ThCBM, as a mixture of [5,6] and [6,6] isomers, was isolated by chromatography, as were the unreacted fullerenes (3.49 g).

Irradiation of the crude [Cn]ThCBM in solution under N2 using a sodium lamp gave full conversion to the [6,6] isomers. Chromatography (silica gel, toluene/cyclohexane 2:1 (v/v)) gave the ThCBMs. Precipitation using methanol from an ODCB solution and repeated washing using methanol and pentane gave, after drying at 50° C. in vacuo, 5.21 g of ThCBMs as a black powder. Analysis by HPLC indicated about 74% [60]ThCBM, 23% [70]ThCBM, and 3% [>70] ThCBM. $^1$H NMR (300 MHz, CDCl$_3$): δ 7.55-6.80 (multiple signals, total 3H); 3.76-3.53 (multiple signals, total 3H); 3.0-2.0 (multiple signals, total 6H) ppm. IR (KBr, cm-1): 2940; 2863; 2328; 1735; 1430; 526. Reduction of [>70] adducts may be performed by analytical or prep scale HPLC, using a Cosmocil Buckyprep column, or activated carbon filtration.

Synthesis of Mixtures of Prato-Adducts of [C$_n$]Prato

Prato derivatives were prepared according to the general method of M. Prato and M. Maggini, Acc. Chem. Res. 1998, 31, 519-526.

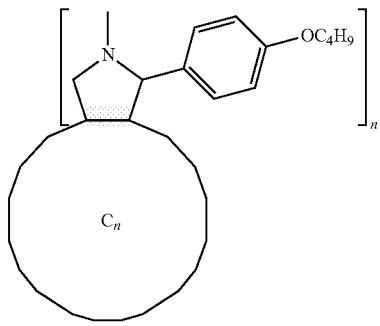

Mixtures of a specific Prato compound as above ([60]Prato and [70]Prato in this document) were prepared by using a mixture of 10.0 g of commercial fullerene mix (71% C$_{60}$, 23% C$_{70}$, 6% C$_{>70}$ by HPLC), 1.50 g sarcosine, and 3.0 mL of 4-butoxybenzaldehyde in 1.0 L of ODCB was heated to 90-95° C. under N$_2$ for 21 h. The solvent was removed in vacuo and the reaction mixture was redissolved in a small amount of ODCB. Column chromatography (silica gel; p-xylene/heptane 2:1 (v/v)) gave the unreacted fullerenes (5.79 g) and the crude product (mixture of mono-adducts). The crude product was redissolved in ODCB and further purified by column chromatography (silica gel, o-xylene). The purified [Cn]Prato mixture was redissolved in ODCB and precipitated using methanol. Repeated washing using methanol and pentane gave, after drying at 50° C. in vacuo, 3.85 g of product. Analysis by HPLC indicated about 74% [60]-adduct, 22% [70]-adducts, and 4% [>70]-adducts. $^1$H NMR (300 MHz, CS$_2$+CDCl$_3$ 1:1 (v/v)): δ 7.80-6.60 (multiple signals, total 4H); 5.05-4.60 (multiple signals, total 2H); 4.30-3.40 (multiple signals, total 3H); 3.10-2.20 (multiple signals, total 3H); 1.90-0.80 (multiple signals, total 7H) ppm. Reduction of [>70] adducts may be performed as well known in the art by analytical or prep scale HPLC, using a Cosmocil Buckyprep column, or activated carbon filtration. n is 1 for the mono-adduct and n is 2 for the bis-adduct.

Methanofullerene Bis-Adducts

Methanofullerene bis-adducts, such as the ThCBM bis-adducts may be isolated from the reaction mixture as obtained from the synthesis of ThCBMs above (also see: L. M. Popescu et al, Appl. Phys. Lett. 2007, 89, 213507), by further eluting the column used for the isolation of the crude ThCBMs mono-adducts.

Additional References for Polymers

Fused or non-fused thiophene-ring containing polymers: An example of such a polymer is poly(3-hexylthiophene-2,5-diyl), commonly known as P3HT. For use of this polymer in solar cells, see for example: L. M. Popescu et al., Appl. Phys. Lett. 2006, 89, 213507.

Fused or non-fused benzene-ring containing polymers: An example of such a polymer is poly(p-(2-(3,7-dimethyloctyloxy)-5-methoxy)-phenylenevinylene). For use of this polymer in solar cells, see for example: Shaheen et al., Appl. Phys. Lett. 2001, 78, 841.

Fused or non-fused pyrrole-ring containing polymers: An example of such a polymer is polypyrrole (or polypyrrole) itself. For a method of preparation of this polymer, and subsequent characterization, see for example T. F. Otero et al., Electrochimica Acta 1994, 39, 245.

Fused or non-fused thiadiazoline-ring containing polymers: An example of such a polymer is poly(1,3,4-thiadiazole-co-thiophene), which has been used in a field-effect transistor by Yamamoto and co-workers. See: T. Yamamoto et al., Macromol. Rapid. Commun. 2005, 26, 1214.

Fused or non-fused thiazoline-ring containing polymers: An example of such a polymer is poly(4-nonylthiazole-co-thiophene-2,5-diyl). For the preparation of this polymer, and the use in a field-effect transistor, see T. Yamamoto et al., Chem. Mater. 2004, 16, 4616.

Fused or non-fused pyrazine-ring containing polymers: An example of such a polymer is poly(pyrazine-2,5-diyl), which has been described in T. Yamamoto et al., Polymer 2003, 44, 4487.

Example 2

Processing of Derivatized Fullerene Mixtures

Method 1:

Crude PCBM mixture, resulting from the synthesis using mixed fullerenes, was dissolved in p-xylene (10 g/L). The crude PCBM mixture typically consists of 3-6% higher PCBM adducts ([>70]PCBM), 20-27% [70]PCBM and 68-77% [60]PCBM, plus small amounts of unreacted fullerenes and trace amounts of fullerene oxides, fullerene derivative oxides, and dimers of unreacted fullerenes and fullerene derivatives. Compositions may vary depending on fullerene production method, combustion produced fullerenes typically have higher percentages of C70 and higher fullerenes.

The mixed PCBMs are purified over a bed containing 2.5 grams activated charcoal (Merck charcoal activated GR for analysis, product number: 102186) per gram PCBM, mixed with a supporting medium of Silica gel (Aldrich, Merck grade 9385, product number: 227196) in a 1:3.5 ratio (w/w), to allow for a better flow through the bed. The bed is prepared by mixing the activated charcoal and silica as dry powders, subsequently the mixed powder is suspended in p-xylene and poured into a glass column equipped with a cotton plug and sand layer at the bottom. The bed material is allowed to settle and is eluted until dry. Finally the cake is covered with a small layer of sand.

The 10 g/l mixed PCBM solution in p-Xylene is filtered over the bed. The complete filtrate can be collected as a [60] and [70]PCBM mixture without [>70]PCBM adducts. Alternatively the filtrate could be fractionated into a first small pure [60]PCBM fraction to increase the [70]PCBM content of the overall product, followed by fractions increasing in [70]PCBM content. A fraction is obtained yielding approximately 76:23 [60]:[70]. Impurities ≤1% consists of C$_{60}$, C$_{70}$,

[60]PCBM oxide and [70]PCBM oxide as determined by HPLC analysis (detection at 360 nm using Cosmocil Buckyprep column). Higher fullerenes and higher fullerene adducts are less than 0.1% cumulative.

Method 2:

Example 1 yields besides the pure product fractions as a side product several rinse fractions, obtained by further addition of p-xylene to the bed, which when combined have a general composition of 50-60% [60]PCBM, 40-50% [70] PCBM and approximately 1% [>70]PCBM adducts. These combined fractions can be re-dissolved in p-xylene (10 g/L) and purified again, as described is method one by using 3 g/g activated charcoal (Merck charcoal activated GR for analysis, product number: 102186) per gram PCBM, mixed with Silica gel (Aldrich, Merck grade 9385, product number: 227196) in a 1:3.5 ratio (w/w). The total volume of the solution plus 3-5 times the initial volume as rinse fraction (p-xylene) is collected as product fraction (without [>70]PCBM adducts)

The combined product fractions afforded a mixture of >99% [60] and [70]PCBM in a ratio close to 750:50 [60]:[70] as determined by HPLC analysis at 360 nm. The <1% consists of $C_{60}$, $C_{70}$, [60]PCBM oxide and [70]PCBM oxide.

Method 3

The crude PCBM mixture as described in method 1 is dissolved in 10 g/L p-xylene or toluene. 0.25 g/g Activated charcoal (Merck charcoal activated Ph Eur, product number: 102555), is added to the stirred solution. The solution is stirred for another 2-16 hours, filtered over a Buchner filter equipped with a paper filter plate. The filtrate contained 1.5-3.0% [>70]PCBM adducts. 0.25 g/g Activated charcoal was added to the filtrate and the procedure was repeated. After filtering the [>70]PCBM content was 1.0-1.5%. This second filtrate was further purified by a final filter step over an activated charcoal (1 g/g) (Merck charcoal activated Ph Eur)/ silica gel cake (A.C.:SiO2 ratio 1:3.5 (w/w)) as described in method 1, yielding less than 0.1% of derivatives of fullerenes higher than C70.

Method 4

The crude PCBM mixture as described in method 1 is dissolved in 10 g/L p-xylene or toluene. 0.5 g/g Activated charcoal (Merck charcoal activated, product number: 102555), is added to the stirred solution. The solution is stirred for another 2-16 hours, filtered over a Buchner filter equipped with a paper filter plate. The filtrate contained 0.5% [>70]PCBM adducts. 0.5 g/g Activated charcoal was added to the filtrate and the procedure was repeated. After filtering the [>70]PCBM content was 0.2%.

Method 5

8 g/g activated charcoal (Merck) mixed with silica gel in a 1:3.5 (w/w) ratio is used as described in Example 1. Crude PCBM mixture as described in Example 1 is dissolved in toluene (10 g/L). Elute all toluene to obtain substantially pure [60]PCBM as a first product until the first [70]PCBM is collected. Change eluent to p-Xylene to elute [70]PCBM. Process yields 95% molar [70]PCBM relative to fullerene derivative fraction.

Example 3

Organic Photovoltaic Cell Preparation and Characterization

Solutions.

To study the device performance, blend solutions of P3HT: Fullerene (50:50 wt. %) were prepared in ortho-dichlorobenzene (ODCB) with a concentration of 13 mg/ml. The solutions were prepared in a $N_2$ atmosphere and rigorously stirred for more than 12 h on a hot plate maintained at 50° C.

Device Preparation.

The devices were prepared on indium tin oxide (ITO) covered glass substrates, which were cleaned using normal cleaning procedures and finalized by exposing in a vacuum plasma cleaner for 20 minutes. Subsequently, a 60 nm thick layer of poly(3,4-ethylenedioxythiophene:poly(styrenesulfonate) (PEDOT:PSS) was spin-coated from an aqueous dispersion under ambient conditions. Afterwards, the layer was dried in a lab oven at 200° C. for 5 minutes. The slow growth P3HT: Fullerene films were spun from ODCB solution on top of the PEDOT:PSS layer. Subsequently, the wet films were dried overnight at room temperature, in a closed Petri dish inside an $N_2$ glove box. The average active layer thicknesses are about 230 nm. To complete the devices, a Sm (5 nm)/Al (100 nm) top electrode was deposited by thermal evaporation.

Device Measurements.

The devices were illuminated by a white light halogen lamp with an output power of 100 mW/cm$^2$, determined by a calibrated silicon diode from Energy Research Centre of the Netherlands (ECN). The values were corrected for the spectral mismatch.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A semiconductor, comprising a composition of formula (i), (ii), (iii), or (iv):
   (i) a composition comprising:
      a $C_{60}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;
      a $C_{70}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;
      wherein the $C_{60}$ chemical derivative and the $C_{70}$ chemical derivative are both members of the same class of chemical derivatives;
      $C_{60}$ and $C_{70}$ in the cumulative range of about 0% to about 50%;
      one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative in the cumulative range of about 0% to about 50%;
      one or more fullerene greater than $C_{70}$ and one or more chemical derivative of fullerenes greater than $C_{70}$ in the cumulative range of about 0% to about 3%;
      one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;

(ii) a composition comprising:
a $C_{60}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;
a $C_{70}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;
wherein the $C_{60}$ chemical derivative and the $C_{70}$ chemical derivative are both members of the same class of chemical derivatives;
$C_{60}$ and $C_{70}$ in the cumulative the range of of about 0% to about 50%;
one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative in the cumulative range of about 0% to about 50%;
one or more fullerene greater than $C_{70}$ and one or more chemical derivative of fullerenes greater than $C_{70}$ in the cumulative range of about 0% to about 3%;
one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;

(iii) a composition comprising:
a compound represented by formula I;

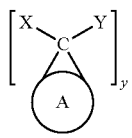

a compound represented by formula II;

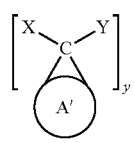

wherein
y is 1;
A is a $C_{60}$ fullerene bonded to —C(X)(Y)— via a methano-bridge;
A' is a $C_{70}$ fullerene bonded to —C(X)(Y)— via a methano-bridge;

X is optionally substituted aryl or aralkyl;
Y is an optionally substituted alkyl, optionally substituted cycloalkyl, optionally substituted heteroalkyl, optionally substituted heterocycloalkyl, optionally substituted alkenyl, or optionally substituted aralkyl;
$C_{60}$ and $C_{70}$ in the cumulative range of about 0% to about 50%;
one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative are in the cumulative range of about 0% to about 50%;
one or more fullerene greater than $C_{70}$ and one or more chemical derivative of fullerenes greater than $C_{70}$ in the cumulative range of about 0% to about 3%;
one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%; and (iv) a composition, comprising:
a compound represented by formula I;

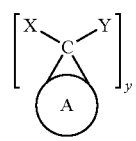

a compound represented by formula II;

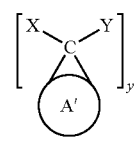

wherein
y is 2;
A is a $C_{60}$ fullerene bonded to —C(X)(Y)— via a methano-bridge;
A' is a $C_{70}$ fullerene bonded to —C(X)(Y)— via a methano-bridge;
X is optionally substituted aryl or aralkyl;
Y is an optionally substituted alkyl, optionally substituted cycloalkyl, optionally substituted heteroalkyl, optionally substituted heterocycloalkyl, optionally substituted alkenyl, or optionally substituted aralkyl;
$C_{60}$ and $C_{70}$ in the cumulative range of about 0% to about 50%;
one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative are in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%.

2. The semiconductor of claim 1, further comprising a P-type semiconductor.

3. The semiconductor of claim 2, wherein there are alternating layers of the N-type semiconductor and the P-type semiconductor.

4. The semiconductor of claim 2, wherein the N-type semiconductor and the P-type semiconductor are mixed to form a bulk heterojunction.

5. The semiconductor of claim 2, wherein the P-type semiconductor further comprises conjugated polymers, conjugated oligomers, conjugated molecules that are free of repeating units, or semi-conductive nano-particles.

6. The semiconductor of claim 2, wherein the P-type semiconductor comprises fused or non-fused thiophene-ring containing oligomers and polymers.

7. The semiconductor of claim 2, wherein the P-type semiconductor comprises fused or non-fused benzene-ring containing polymers.

8. The semiconductor of claim 2, wherein the P-type semiconductor comprises fused or non-fused pyrrole-ring containing polymers.

9. The semiconductor of claim 2, wherein the P-type semiconductor comprises fused or non-fused thiazoline-ring containing polymers.

10. The semiconductor of claim 2, wherein the P-type semiconductor comprises fused or non-fused thiadiazoline-ring containing polymers.

11. The semiconductor of claim 2, wherein the P-type semiconductor comprises fused or non-fused pyrazine-ring containing polymers.

12. The semiconductor of claim 2, wherein the N-type semiconductor further comprises one or more additional N-type semiconductor other than those described in claim 1.

13. A photodiode, comprising a photo-active layer, comprising at least one P-type semiconductor and an N-type semiconductor, wherein the N-type semiconductor comprises a semiconductor of claim 1.

14. The photodiode of claim 13, wherein the P-type semiconductor is selected from the group consisting of conjugated polymers, conjugated oligomers, conjugated molecules that are free of repeating units, semi-conductive nano-particles.

15. The photodiode of claim 14, wherein the P-type semiconductor is selected from the group comprising fused or non-fused thiophene-ring containing oligomers and polymers.

16. The photodiode of claim 14, wherein the P-type semiconductor is selected from the group comprising fused or non-fused benzene-ring containing polymers.

17. The photodiode of claim 14, wherein the P-type semiconductor is selected from the group comprising fused or non-fused pyrrole-ring containing polymers.

18. The photodiode of claim 14, wherein the P-type semiconductor is selected from the group comprising fused or non-fused thiazoline-ring containing polymers.

19. The photodiode of claim 14, wherein the P-type semiconductor is selected from the group comprising fused or non-fused thiadiazoline-ring containing polymers.

20. The photodiode of claim 14, wherein the P-type semiconductor is selected from the group comprising fused or non-fused pyrazine-ring containing polymers.

21. The photodiode of claim 13, wherein the P-type semiconductor and the N-type semiconductor are present in the photo-active layer in the form of a mixture or as separate sub-layers of one or more N-type semiconductor sub-layers comprising the N-type semiconductor, and one or more P-type semiconductor sub-layers, comprising the P-type semiconductor.

22. The photodiode of claim 21, wherein the ratio of the weight of P-type semiconductor to the ratio of the weight of N-type semiconductor is in the range of 10:1 to 1:10.

23. The photodiode of claim 21, wherein the photodiode is used as a photovoltaic device.

24. A photodetector or light intensity meter, comprising a photodiode according to claim 21.

25. An n-channel field effect transistor, comprising an N-type semiconductor, wherein the N-type semiconductor comprises a semiconductor of claim 1.

26. A p-channel field effect transistor, comprising a P-type semiconductor, wherein the P-type semiconductor comprises a semiconductor of claim 1.

27. A photovoltaic cell, photodetector, or organic field effect transistor comprising a composition of formula (i), (ii), (iii), or (iv)

(i) a composition comprising:
a $C_{60}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;

a $C_{70}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;

wherein the $C_{60}$ chemical derivative and the $C_{70}$ chemical derivative are both members of the same class of chemical derivatives;

$C_{60}$ and $C_{70}$ in the cumulative range of about 0% to about 50%;

one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;

(ii) a composition comprising:
a $C_{60}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;

a $C_{70}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;

wherein the $C_{60}$ chemical derivative and the $C_{70}$ chemical derivative are both members of the same class of chemical derivatives;

$C_{60}$ and $C_{70}$ in the cumulative the range of of about 0% to about 50%;

one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;

(iii) a composition comprising:
a compound represented by formula I;

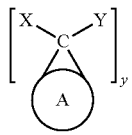

a compound represented by formula II;

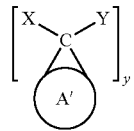

wherein
y is 1;
A is a $C_{60}$ fullerene bonded to —C(X)(Y)— via a methano-bridge;
A' is a $C_{70}$ fullerene bonded to —C(X)(Y)— via a methano-bridge;
X is optionally substituted aryl or aralkyl;
Y is an optionally substituted alkyl, optionally substituted cycloalkyl, optionally substituted heteroalkyl, optionally substituted heterocycloalkyl, optionally substituted alkenyl, or optionally substituted aralkyl;
$C_{60}$ and $C_{70}$ in the cumulative range of about 0% to about 50%;

one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative are in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%; and (iv) a composition, comprising:
a compound represented by formula I;

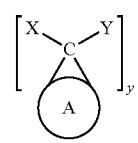

a compound represented by formula II;

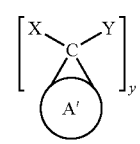

wherein
y is 2;
A is a $C_{60}$ fullerene bonded to —C(X)(Y)— via a methano-bridge;
A' is a $C_{70}$ fullerene bonded to —C(X)(Y)— via a methano-bridge;
X is optionally substituted aryl or aralkyl;
Y is an optionally substituted alkyl, optionally substituted cycloalkyl, optionally substituted heteroalkyl, optionally substituted heterocycloalkyl, optionally substituted alkenyl, or optionally substituted aralkyl;
$C_{60}$ and $C_{70}$ in the cumulative range of about 0% to about 50%;

one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative are in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%.

28. A film for time-gated holographic imaging, comprising a composition of formula (i), (ii), (iii), or (iv)
(i) a composition comprising:
a $C_{60}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;
a $C_{70}$ chemical derivative selected from the group consisting of methanofullerene derivatives, PCBM derivatives, ThCBM derivatives, Prato derivatives, Bingel derivatives, diazoline derivatives, azafulleroid derivatives, ketolactam derivatives, and Diels-Alder derivatives;
wherein the $C_{60}$ chemical derivative and the $C_{70}$ chemical derivative are both members of the same class of chemical derivatives;
$C_{60}$ and $C_{70}$ in the cumulative range of about 0% to about 50%;
one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative in the cumulative range of about 0% to about 50%;
one or more fullerene greater than $C_{70}$ and one or more chemical derivative of fullerenes greater than $C_{70}$ in the cumulative range of about 0% to about 3%;
one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;
(ii) a composition comprising:
a $C_{60}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;
a $C_{70}$ chemical derivative selected from the group consisting of bis-methanofullerene derivatives, bis-PCBM derivatives, bis-ThCBM derivatives, bis-Prato derivatives, bis-Bingel derivatives, bis-diazoline derivatives, bis-azafulleroid derivatives, bis-ketolactam derivatives, and bis-Diels Alder derivatives;
wherein the $C_{60}$ chemical derivative and the $C_{70}$ chemical derivative are both members of the same class of chemical derivatives;
$C_{60}$ and $C_{70}$ in the cumulative the range of of about 0% to about 50%;
one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative in the cumulative range of about 0% to about 50%;
one or more fullerene greater than $C_{70}$ and one or more chemical derivative of fullerenes greater than $C_{70}$ in the cumulative range of about 0% to about 3%;
one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%;
(iii) a composition comprising:
a compound represented by formula I;

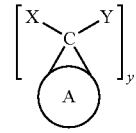

a compound represented by formula II

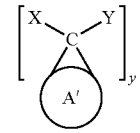

wherein
y is 1;
A is a $C_{60}$ fullerene bonded to —C(X)(Y)— via a methano-bridge;
A' is a $C_{70}$ fullerene bonded to —C(X)(Y)— via a methano-bridge;
X is optionally substituted aryl or aralkyl;
Y is an optionally substituted alkyl, optionally substituted cycloalkyl, optionally substituted heteroalkyl, optionally substituted heterocycloalkyl, optionally substituted alkenyl, or optionally substituted aralkyl;
$C_{60}$ and $C_{70}$ in the cumulative range of about 0% to about 50%;
one or more $C_{60}$ bis-adduct chemical derivative, one or more $C_{60}$ tris-adduct chemical derivative, one or more $C_{70}$ bis-adduct chemical derivative, and one or more $C_{70}$ tris-adduct chemical derivative are in the cumulative range of about 0% to about 50%;
one or more fullerene greater than $C_{70}$ and one or more chemical derivative of fullerenes greater than $C_{70}$ in the cumulative range of about 0% to about 3%;
one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and
one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%; and
(iv) a composition, comprising:
a compound represented by formula I;

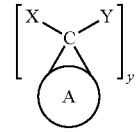

a compound represented by formula II;

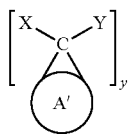

wherein y is 2;

A is a $C_{60}$ fullerene bonded to —C(X)(Y)— via a methano-bridge;

A' is a $C_{70}$ fullerene bonded to —C(X)(Y)— via a methano-bridge;

X is optionally substituted aryl or aralkyl;

Y is an optionally substituted alkyl, optionally substituted cycloalkyl, optionally substituted heteroalkyl, optionally substituted heterocycloalkyl, optionally substituted alkenyl, or optionally substituted aralkyl;

$C_{60}$ and $C_{70}$ in the cumulative range of about 0% to about 50%;

one or more $C_{60}$ mono-adduct chemical derivative, one or more $C_{60}$ tris-adduct chemical derivative, one or more $C_{70}$ mono-adduct chemical derivative, and one or more $C_{70}$ tris-adduct chemical derivative are in the cumulative range of about 0% to about 50%;

one or more fullerene greater than $C_{70}$ and one or more chemical derivative of fullerenes greater than $C_{70}$ in the cumulative range of about 0% to about 3%;

one or more oxide of $C_{60}$, one or more oxide of $C_{70}$, one or more oxide of $C_{60}$ chemical derivatives, and one or more oxide of $C_{70}$ chemical derivatives in the cumulative range of about 0.001% to about 5%; and one or more dimer of $C_{60}$, one or more dimer of $C_{70}$, one or more dimer of $C_{60}$ chemical derivatives, and one or more dimer of $C_{70}$ chemical derivatives in the cumulative range of about 0% to about 5%.

* * * * *